(12) United States Patent
Yamazaki et al.

(10) Patent No.: US 8,022,460 B2
(45) Date of Patent: Sep. 20, 2011

(54) NONVOLATILE SEMICONDUCTOR MEMORY DEVICE

(75) Inventors: Shunpei Yamazaki, Setagaya (JP); Yoshinobu Asami, Atsugi (JP); Tamae Takano, Atsugi (JP); Makoto Furuno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 290 days.

(21) Appl. No.: 11/725,487

(22) Filed: Mar. 20, 2007

(65) Prior Publication Data

US 2007/0228453 A1 Oct. 4, 2007

(30) Foreign Application Priority Data

Mar. 31, 2006 (JP) .................................. 2006-100789

(51) Int. Cl.
*H01L 29/76* (2006.01)
(52) U.S. Cl. .................. 257/314; 257/315; 257/E21.209
(58) Field of Classification Search .................. 257/314, 257/315, E21.209, E21.422, E29.304
See application file for complete search history.

(56) References Cited

U.S. PATENT DOCUMENTS

| | | | |
|---|---|---|---|
| 3,878,549 A | | 4/1975 | Yamazaki et al. |
| 3,996,657 A | * | 12/1976 | Simko et al. ................. 438/257 |
| 4,630,086 A | | 12/1986 | Sato et al. |
| 4,809,056 A | | 2/1989 | Shirato et al. |
| 5,448,513 A | | 9/1995 | Hu et al. |
| 5,471,422 A | * | 11/1995 | Chang et al. ............. 365/185.26 |
| 5,517,300 A | | 5/1996 | Parker et al. |
| 5,808,336 A | | 9/1998 | Miyawaki |
| 6,090,666 A | | 7/2000 | Ueda et al. |
| 6,287,988 B1 | | 9/2001 | Nagamine et al. |
| 6,324,101 B1 | | 11/2001 | Miyawaki |
| 6,384,448 B1 | | 5/2002 | Forbes |

(Continued)

FOREIGN PATENT DOCUMENTS

CN     1555096     12/2004

(Continued)

OTHER PUBLICATIONS

European Search Report (Application No. 07005513.2) dated Jul. 10, 2007.

(Continued)

*Primary Examiner* — Zandra Smith
*Assistant Examiner* — Paul E Patton
(74) *Attorney, Agent, or Firm* — Eric J. Robinson; Robinson Intellectual Property Law Office, P.C.

(57) ABSTRACT

An object is to provide a nonvolatile semiconductor memory device which is superior in writing property and charge holding property. A semiconductor substrate in which a channel formation region is formed between a pair of impurity regions is provided, and a first insulating layer, a floating gate electrode, a second insulating layer, and a control gate electrode are provided over the semiconductor substrate. The floating gate electrode includes at least two layers. It is preferable that a band gap of a first floating gate electrode, which is in contact with the first insulating layer, be smaller than that of the semiconductor substrate. It is also preferable that a second floating gate electrode be formed of a metal material, an alloy material, or a metal compound material. This is because, by lowering the bottom energy level of a conduction band of the floating gate electrode than that of the channel formation region in the semiconductor substrate, a carrier injecting property and a charge holding property can be improved.

32 Claims, 41 Drawing Sheets

U.S. PATENT DOCUMENTS

| | | | |
|---|---|---|---|
| 6,388,291 B1 | 5/2002 | Zhang et al. | |
| 6,417,538 B1 | 7/2002 | Choi | |
| 6,498,369 B1 | 12/2002 | Yamazaki et al. | |
| 6,518,594 B1 | 2/2003 | Nakajima et al. | |
| 6,551,948 B2 | 4/2003 | Ohmi et al. | |
| 6,586,797 B2 | 7/2003 | Forbes et al. | |
| 6,597,034 B2 | 7/2003 | Yamazaki et al. | |
| 6,613,630 B2 * | 9/2003 | Lee | 438/257 |
| 6,646,288 B2 | 11/2003 | Yamazaki et al. | |
| 6,699,754 B2 | 3/2004 | Huang | |
| 6,713,834 B2 | 3/2004 | Mori et al. | |
| 6,756,640 B2 | 6/2004 | Yamazaki et al. | |
| 6,774,430 B2 | 8/2004 | Horiguchi et al. | |
| 6,812,086 B2 * | 11/2004 | Murthy et al. | 438/231 |
| 6,828,623 B1 | 12/2004 | Guo et al. | |
| 6,861,689 B2 | 3/2005 | Burnett | |
| 6,914,302 B2 | 7/2005 | Ohtani et al. | |
| 6,943,403 B2 | 9/2005 | Park | |
| 6,955,968 B2 | 10/2005 | Forbes et al. | |
| 7,071,512 B2 | 7/2006 | Nakagawa et al. | |
| 7,098,147 B2 | 8/2006 | Nansei et al. | |
| 7,098,504 B2 | 8/2006 | Kawashima et al. | |
| 7,189,624 B2 | 3/2007 | Ito | |
| 7,245,010 B2 | 7/2007 | Powell et al. | |
| 7,391,075 B2 | 6/2008 | Jeon et al. | |
| 7,465,677 B2 | 12/2008 | Isobe et al. | |
| 7,482,651 B2 | 1/2009 | Bhattacharyya | |
| 7,485,526 B2 | 2/2009 | Mouli et al. | |
| 7,541,236 B2 | 6/2009 | Takahashi et al. | |
| 7,554,854 B2 | 6/2009 | Osame et al. | |
| 7,560,767 B2 | 7/2009 | Yasuda et al. | |
| 7,760,552 B2 | 7/2010 | Miyake et al. | |
| 2002/0079533 A1 | 6/2002 | Horiguchi et al. | |
| 2002/0093045 A1 | 7/2002 | Forbes | |
| 2002/0093073 A1 * | 7/2002 | Mori et al. | 257/510 |
| 2002/0094640 A1 | 7/2002 | Forbes | |
| 2002/0113262 A1 | 8/2002 | Forbes | |
| 2002/0153569 A1 | 10/2002 | Katayama | |
| 2002/0175376 A1 | 11/2002 | Ohtani et al. | |
| 2002/0179964 A1 | 12/2002 | Kato et al. | |
| 2002/0185674 A1 | 12/2002 | Kawashima et al. | |
| 2003/0049900 A1 | 3/2003 | Forbes et al. | |
| 2003/0107077 A1 | 6/2003 | Yamazaki et al. | |
| 2004/0043638 A1 * | 3/2004 | Nansei et al. | 438/792 |
| 2004/0104426 A1 | 6/2004 | Forbes et al. | |
| 2004/0119110 A1 | 6/2004 | Park | |
| 2005/0023577 A1 | 2/2005 | Ito | |
| 2005/0095786 A1 * | 5/2005 | Chang et al. | 438/260 |
| 2005/0112820 A1 | 5/2005 | Chen et al. | |
| 2005/0194645 A1 | 9/2005 | Yamaguchi et al. | |
| 2005/0230743 A1 | 10/2005 | Nakagawa et al. | |
| 2005/0263767 A1 | 12/2005 | Yamazaki et al. | |
| 2006/0003531 A1 | 1/2006 | Chang et al. | |
| 2006/0008995 A1 | 1/2006 | Takahashi et al. | |
| 2006/0043463 A1 | 3/2006 | Liu et al. | |
| 2006/0118858 A1 | 6/2006 | Jeon et al. | |
| 2006/0186458 A1 | 8/2006 | Forbes et al. | |
| 2006/0246738 A1 | 11/2006 | Isobe et al. | |
| 2006/0252205 A1 | 11/2006 | Kawashima et al. | |
| 2007/0132004 A1 * | 6/2007 | Yasuda et al. | 257/315 |
| 2007/0132010 A1 | 6/2007 | Bhattacharyya | |
| 2007/0200167 A1 | 8/2007 | Yamazaki | |
| 2007/0221971 A1 | 9/2007 | Yamazaki et al. | |
| 2007/0221985 A1 | 9/2007 | Yamazaki et al. | |
| 2007/0228448 A1 | 10/2007 | Yamazaki et al. | |
| 2007/0228449 A1 | 10/2007 | Takano et al. | |
| 2007/0228452 A1 * | 10/2007 | Asami | 257/315 |
| 2007/0230254 A1 * | 10/2007 | Osame et al. | 365/185.29 |
| 2007/0235793 A1 | 10/2007 | Yamazaki et al. | |
| 2007/0235794 A1 | 10/2007 | Yamazaki et al. | |
| 2008/0220573 A1 | 9/2008 | Takahashi et al. | |
| 2009/0194803 A1 | 8/2009 | Yamazaki et al. | |
| 2009/0257283 A1 | 10/2009 | Osame et al. | |
| 2010/0159661 A1 | 6/2010 | Yamazaki | |

FOREIGN PATENT DOCUMENTS

| | | |
|---|---|---|
| CN | 1224104 | 10/2005 |
| CN | 1744330 | 3/2006 |
| EP | 0 682 370 | 9/2000 |
| EP | 1045447 A | 10/2000 |
| JP | 51-007036 | 3/1976 |
| JP | 52-023532 | 6/1977 |
| JP | 55-015869 | 4/1980 |
| JP | 03-119765 | 5/1991 |
| JP | 06-097454 | 4/1994 |
| JP | 06-244432 | 9/1994 |
| JP | 08-097307 | 4/1996 |
| JP | 2656986 | 9/1997 |
| JP | 10-135357 | 5/1998 |
| JP | 11-040682 | 2/1999 |
| JP | 2000-058685 | 2/2000 |
| JP | 2004-221448 | 8/2004 |
| JP | 2005-347328 | 12/2005 |
| JP | 2006-114905 | 4/2006 |

OTHER PUBLICATIONS

Office Action (Application No. 200710092146.3) dated Sep. 18, 2009.

Office Action (Application No. 200710092146.3) dated Feb. 12, 2010 with English translation.

* cited by examiner

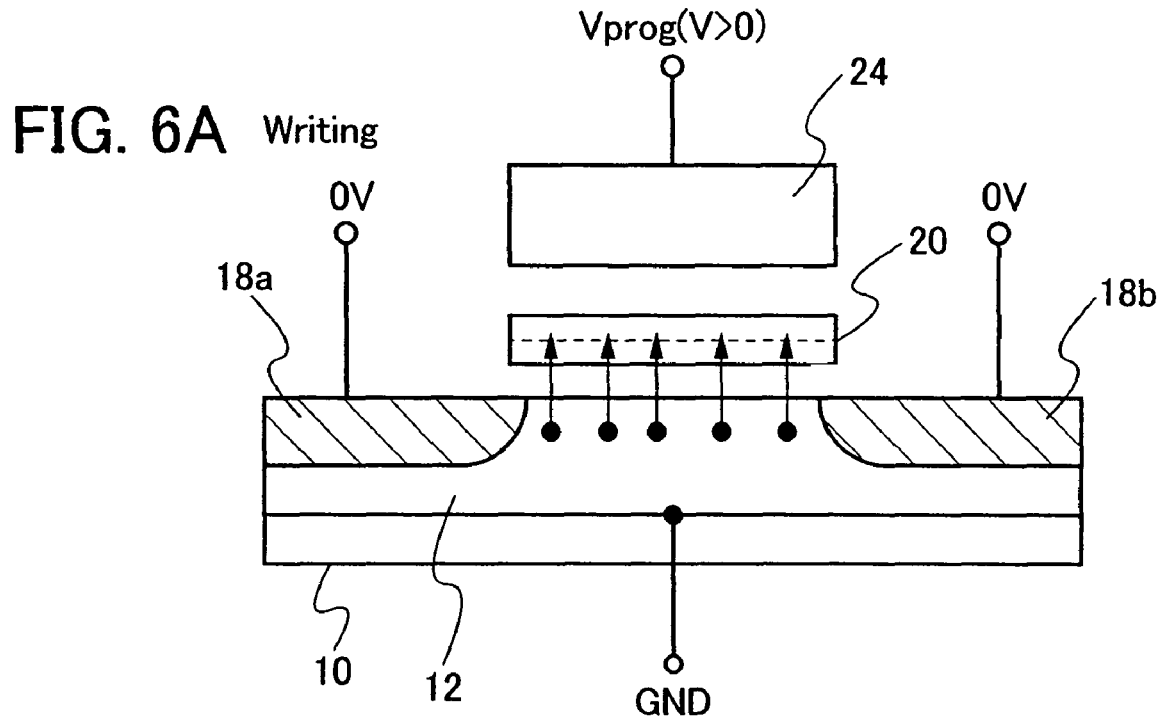
FIG. 6A Writing
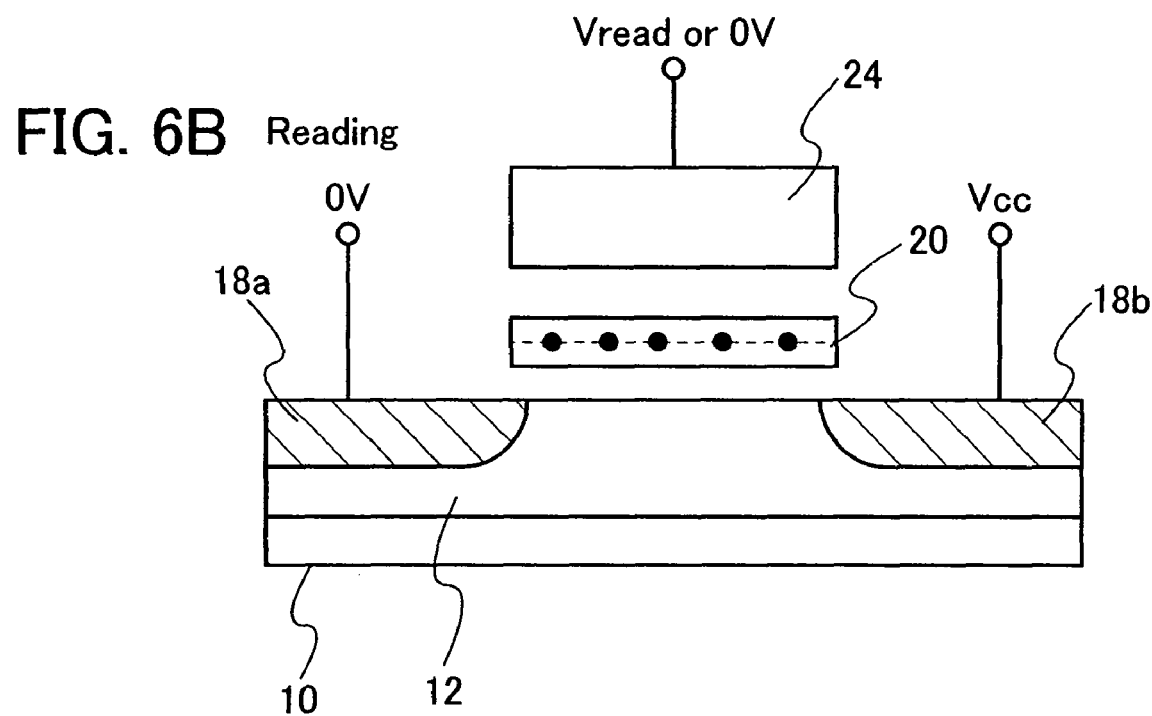
FIG. 6B Reading

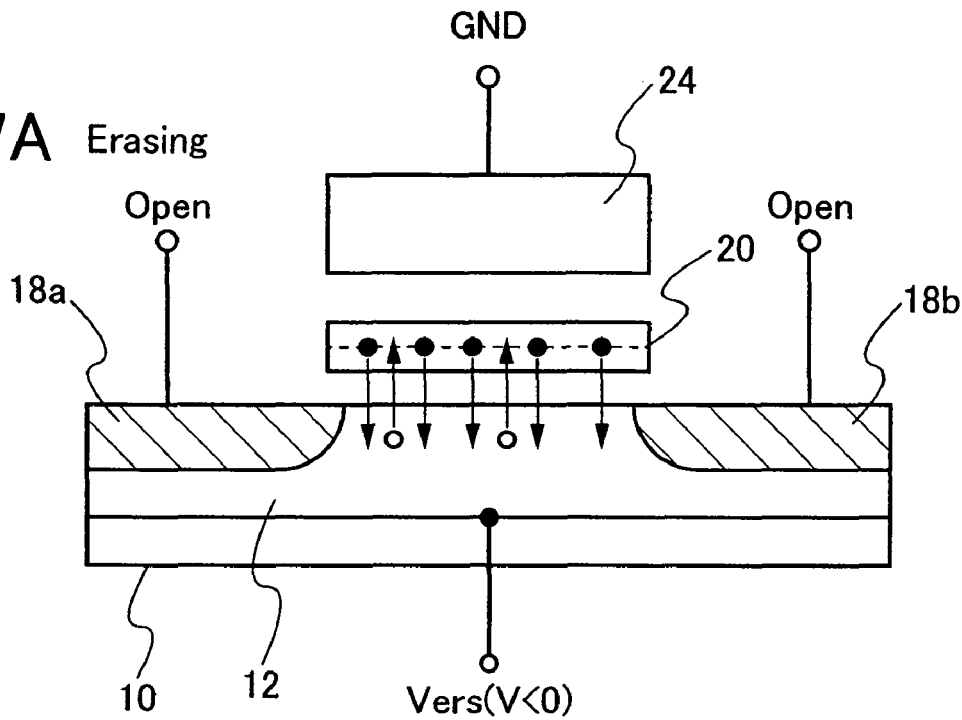
FIG. 7A Erasing
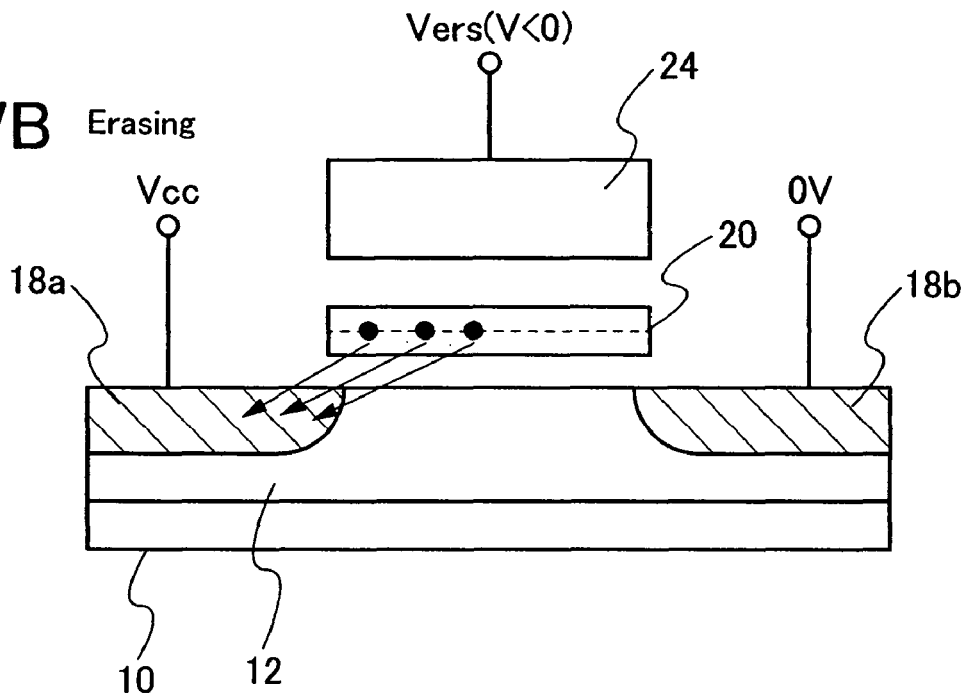
FIG. 7B Erasing

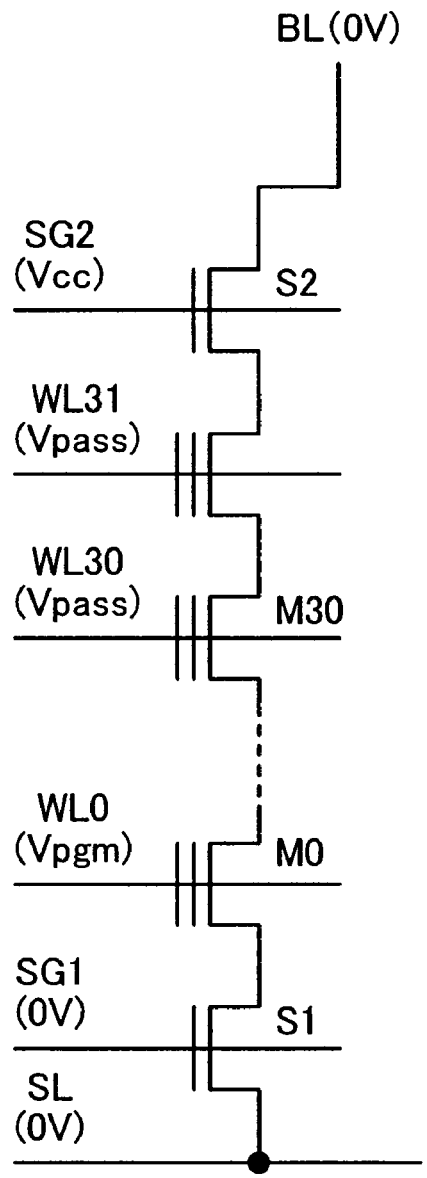
FIG. 11A "0" Writing
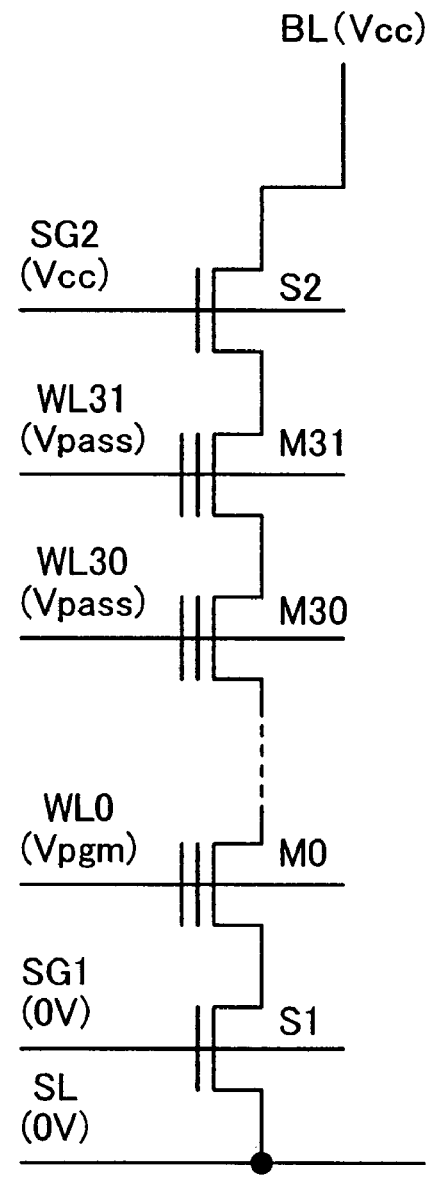
FIG. 11B "1" Writing

FIG. 12A  Erasing
FIG. 12B  Reading
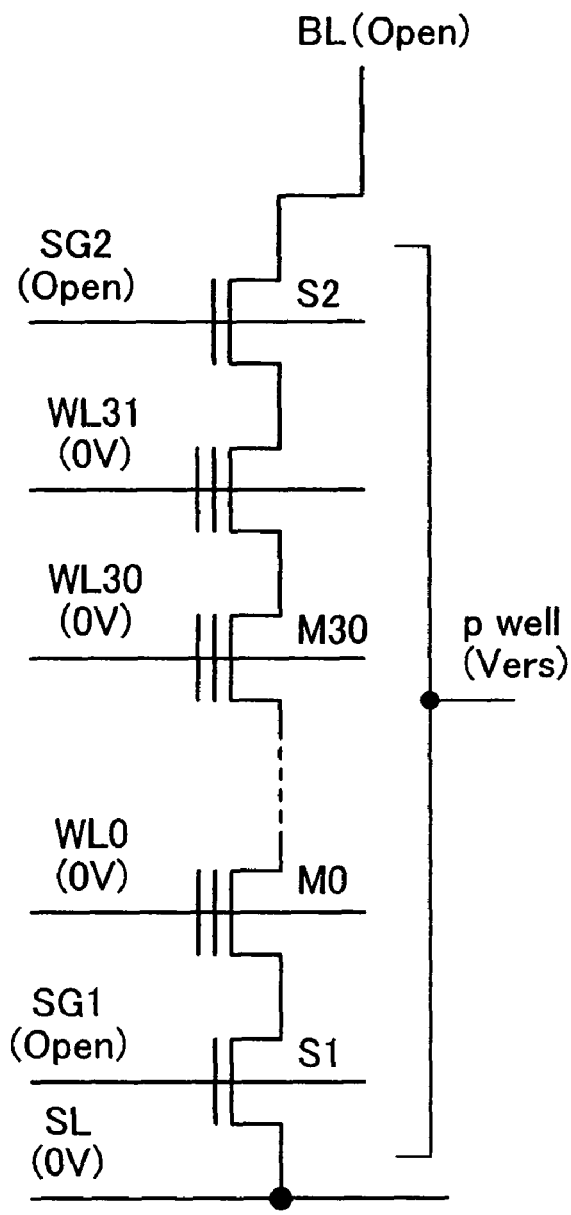
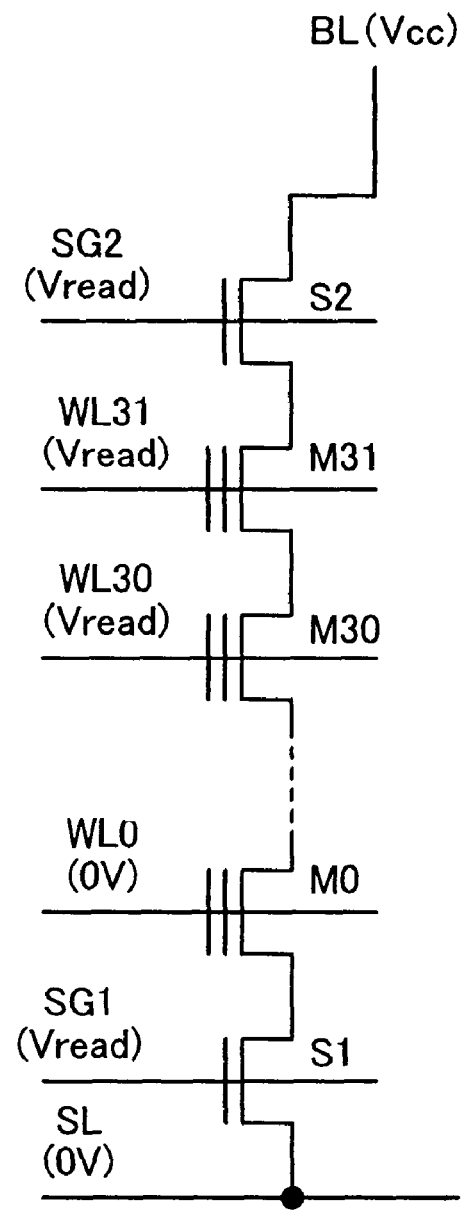

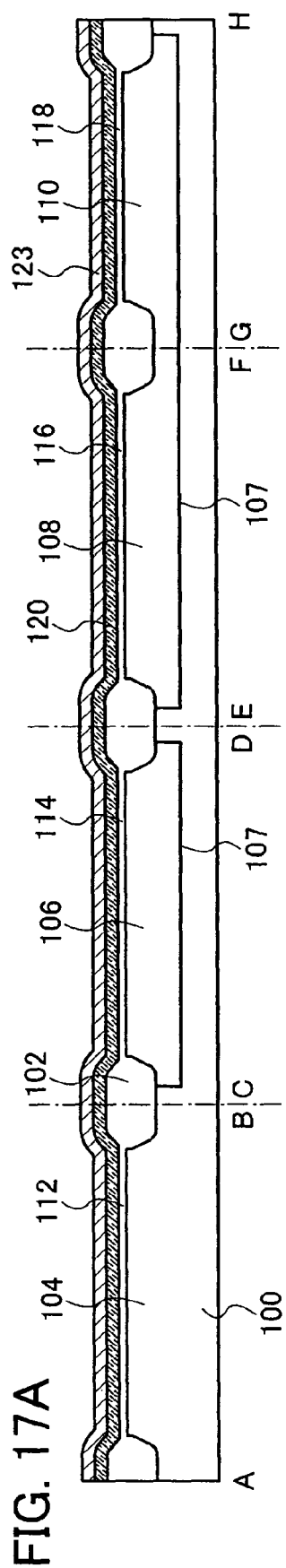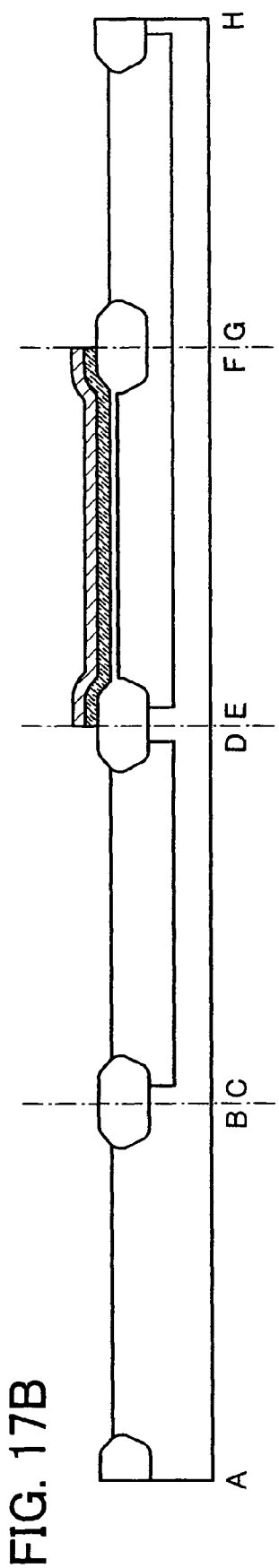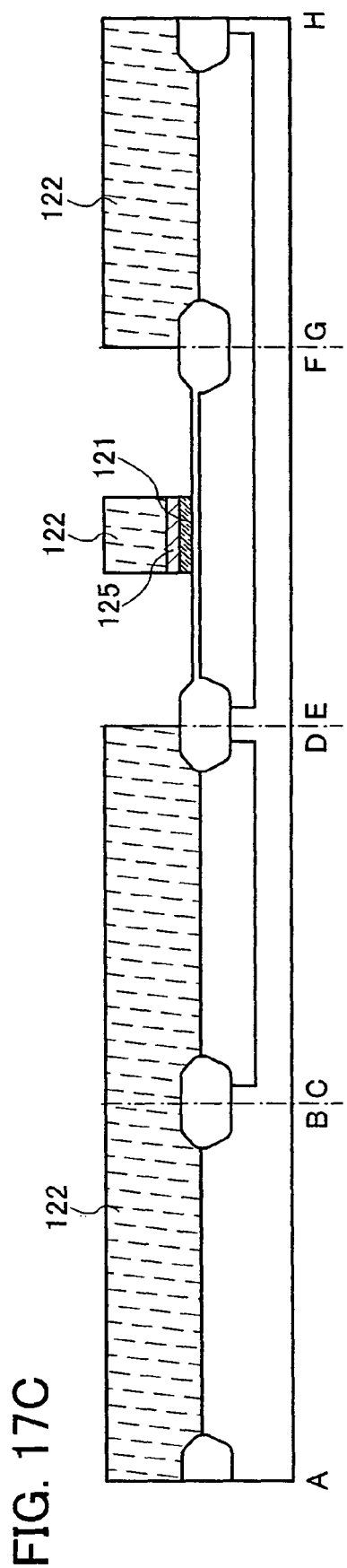

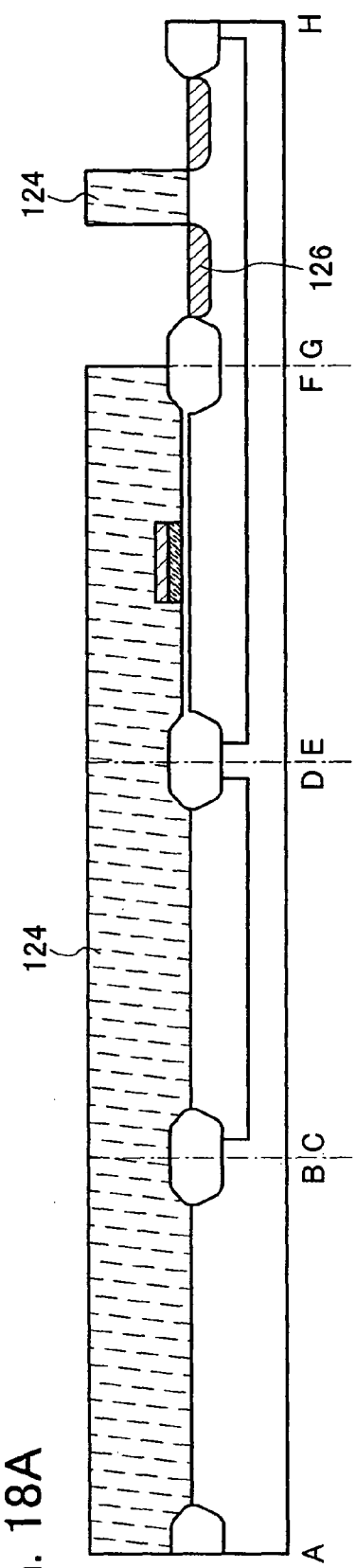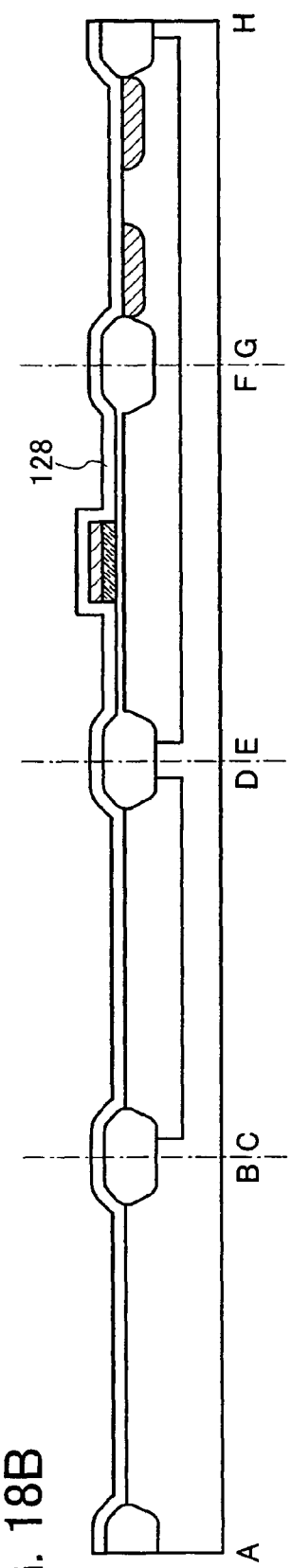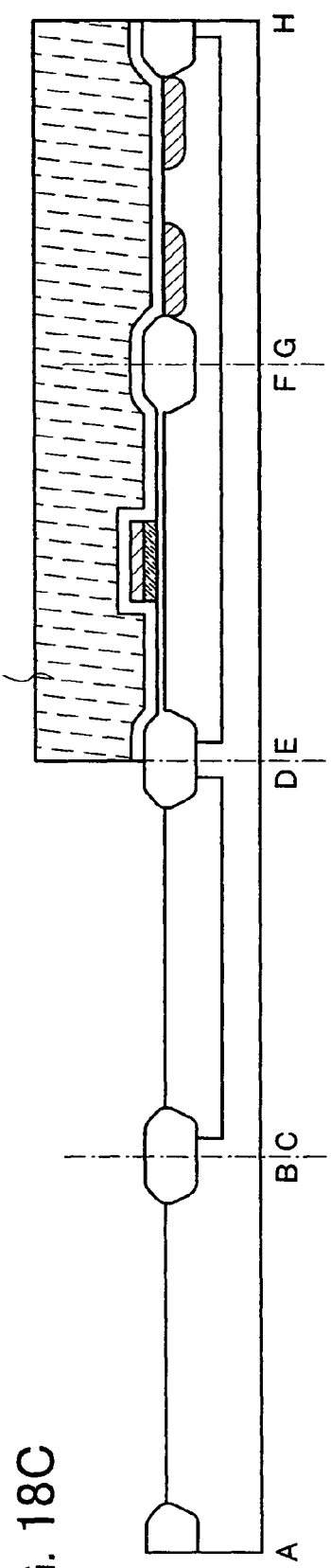

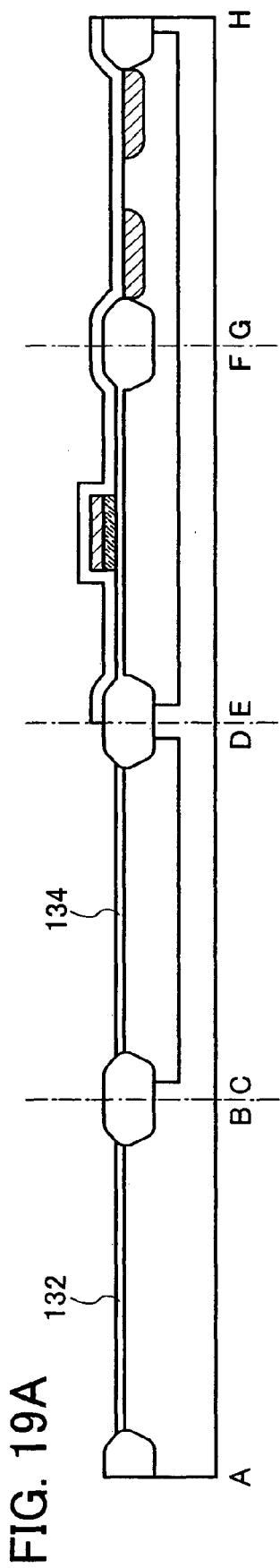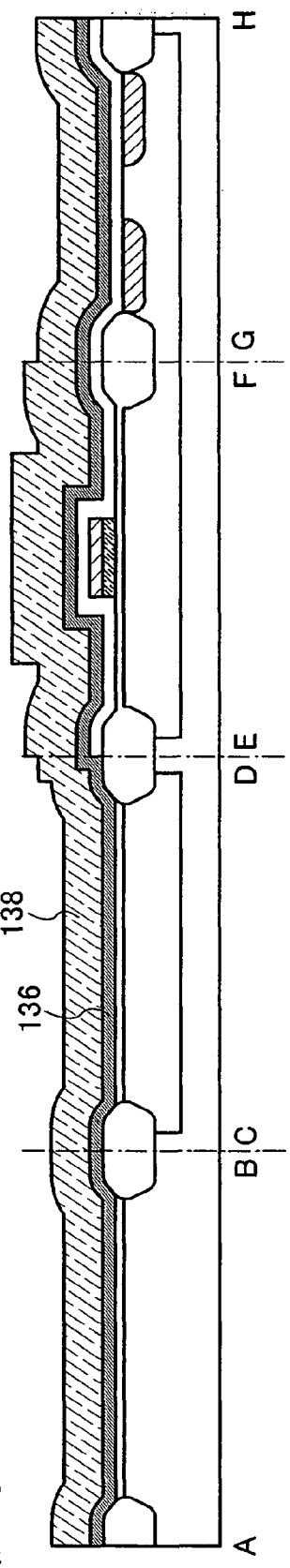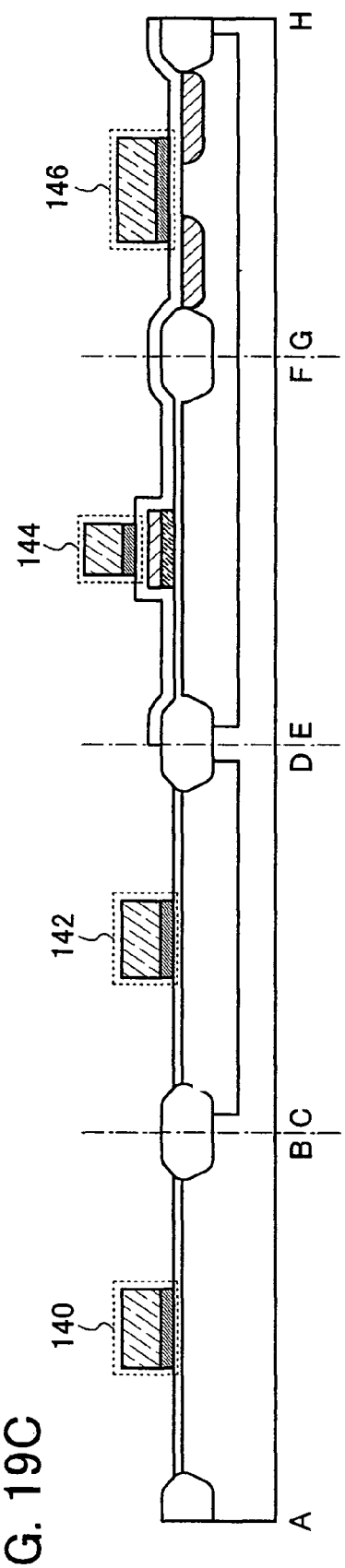

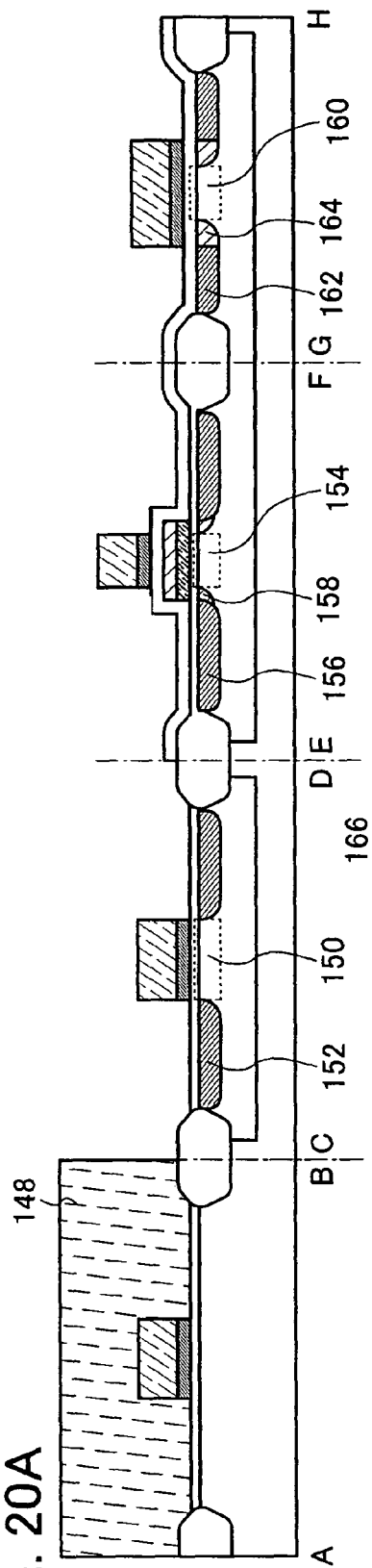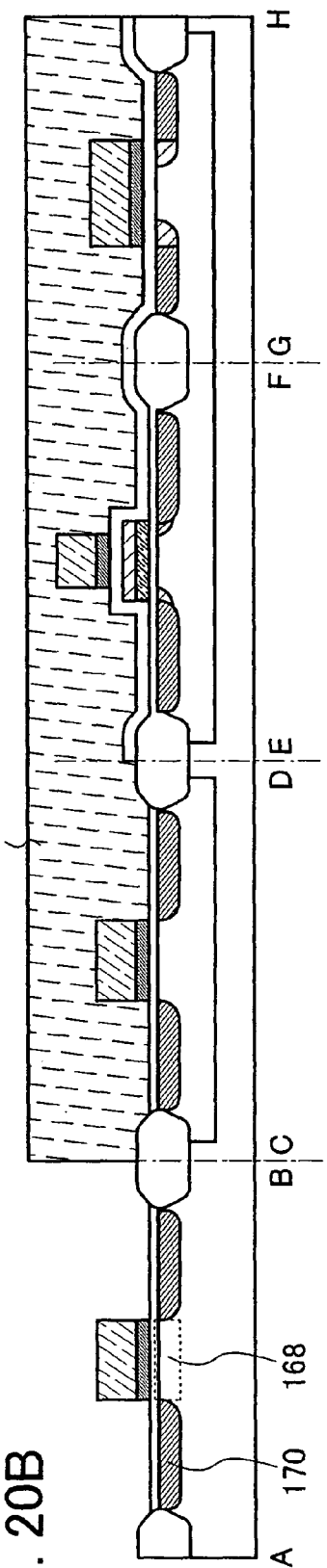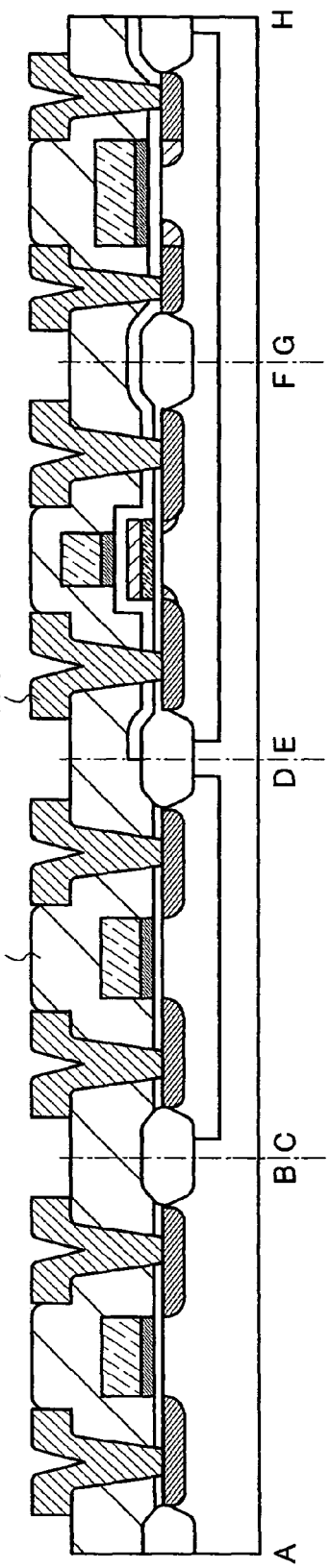

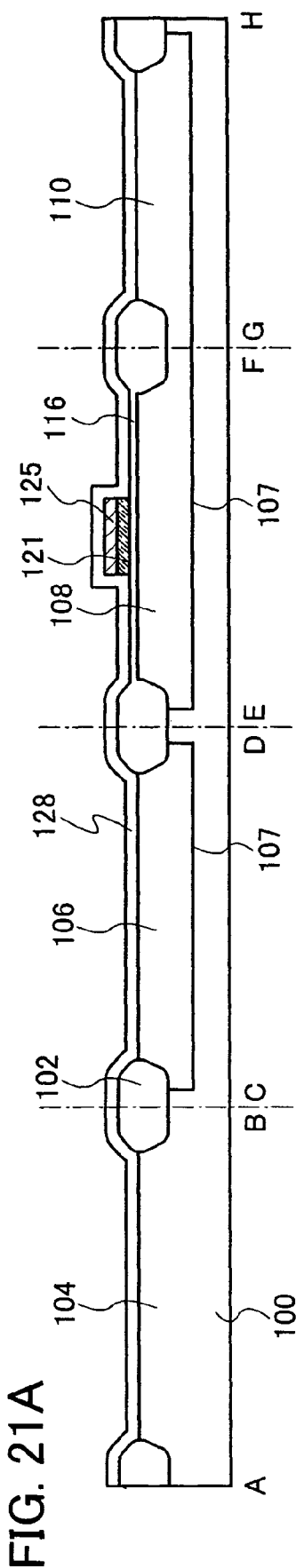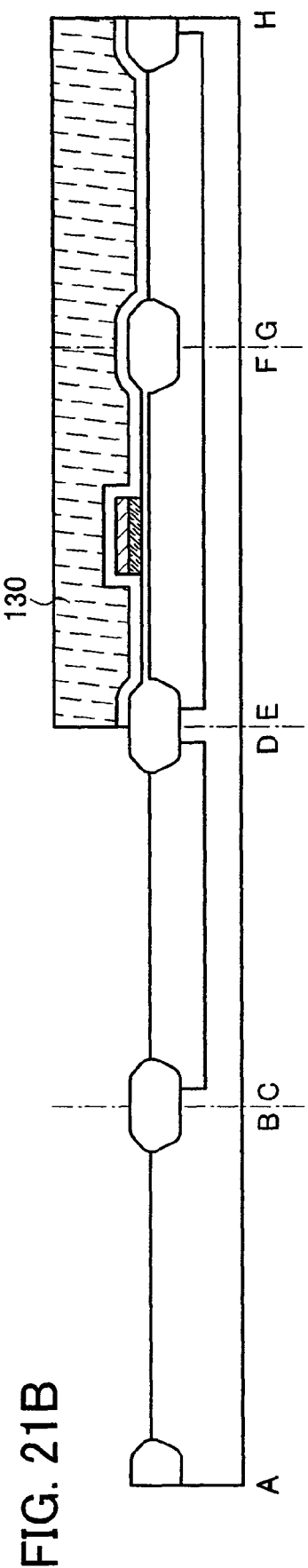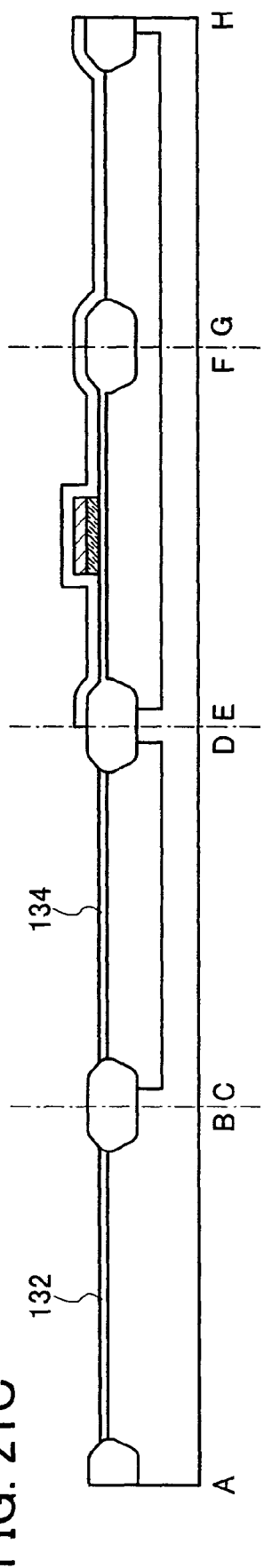

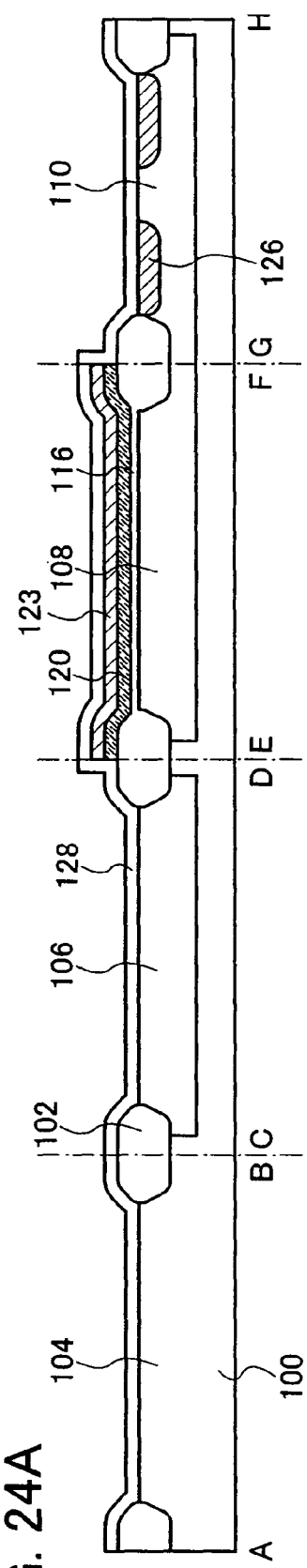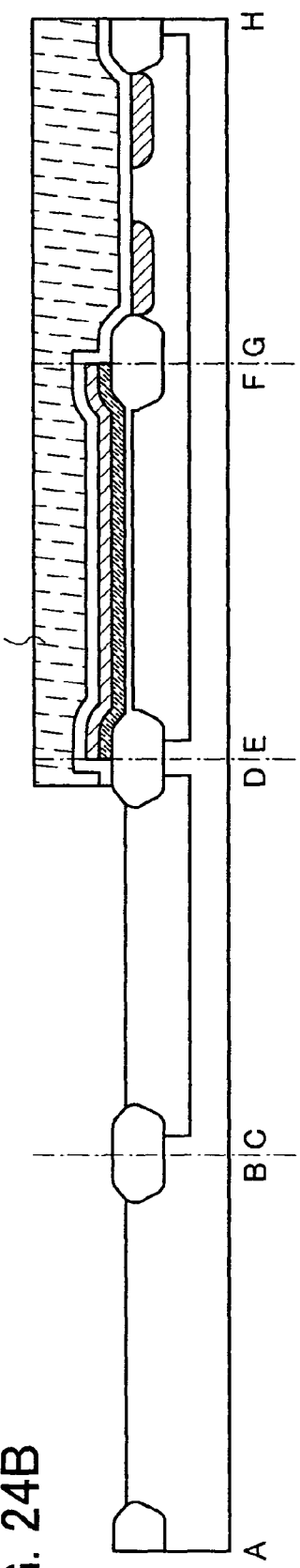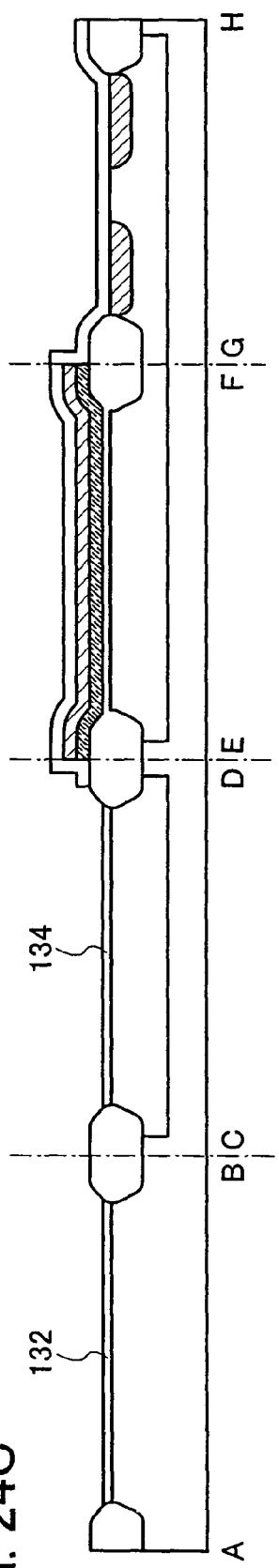

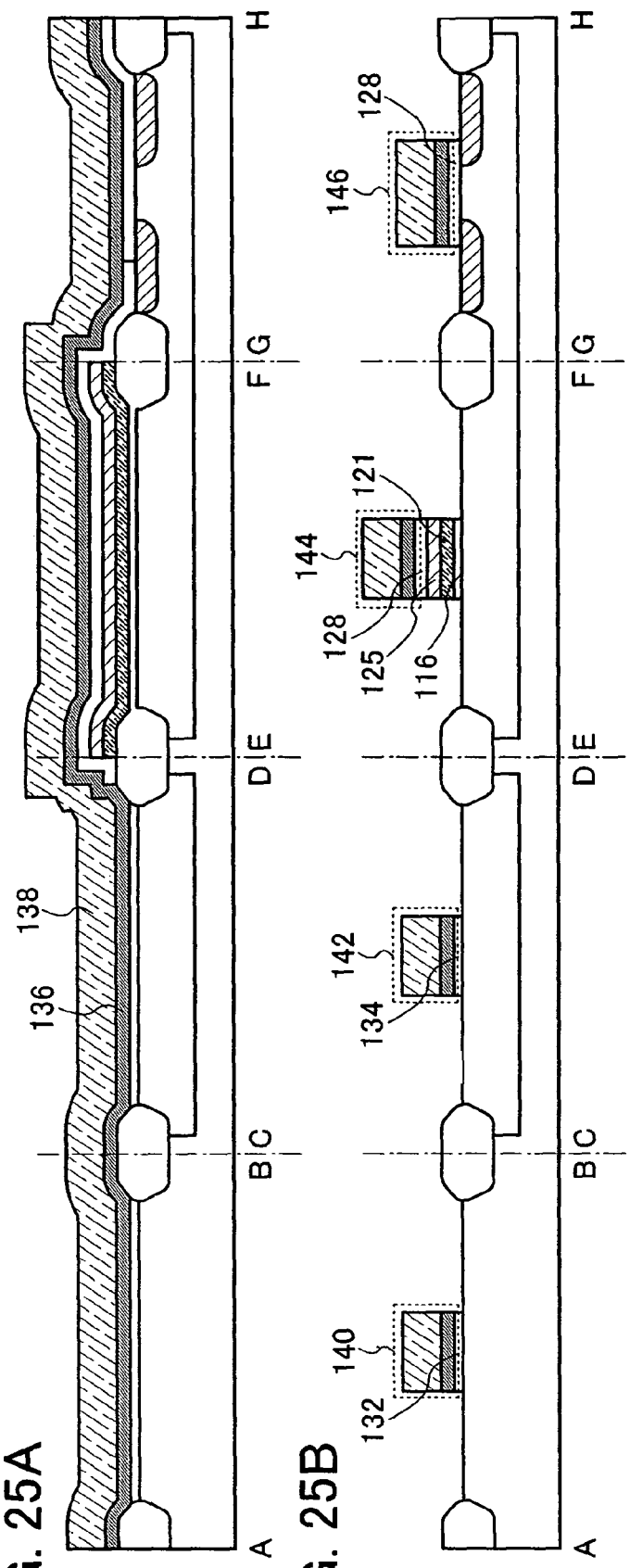
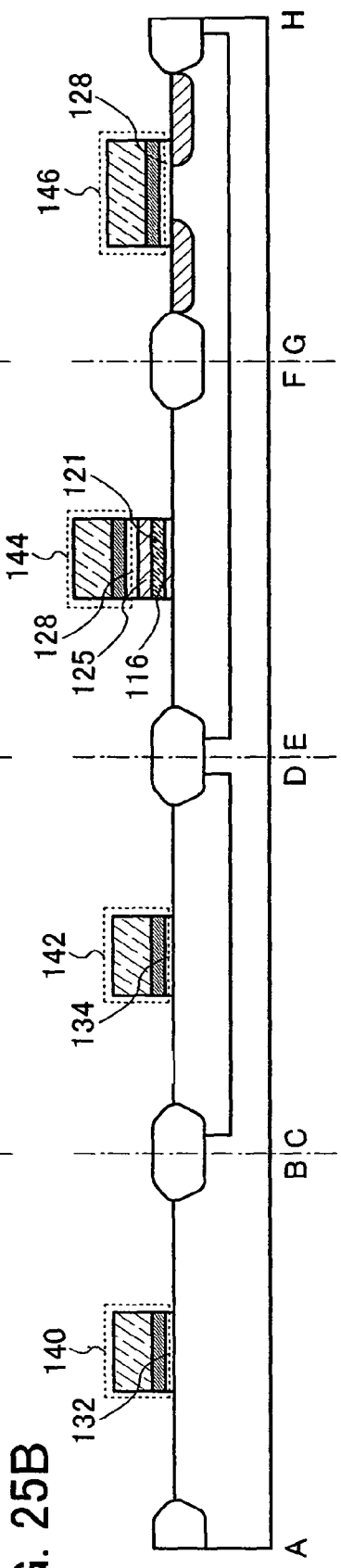
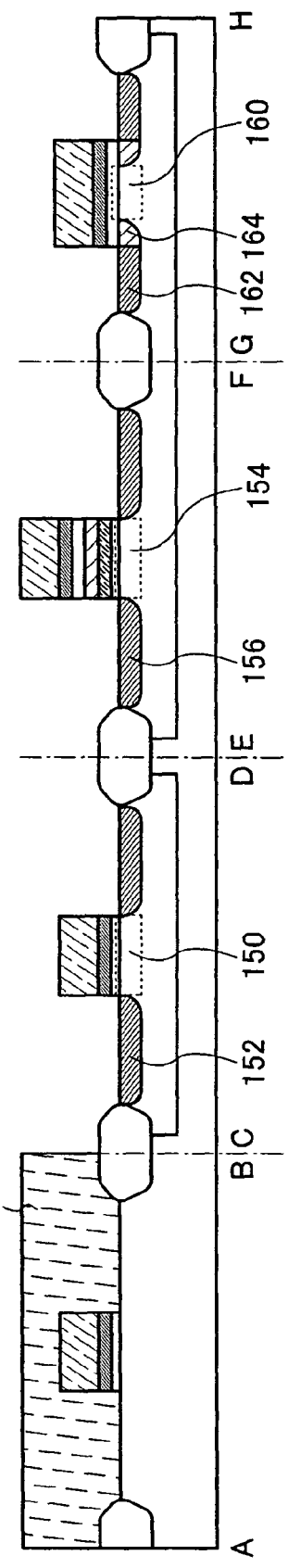
FIG. 25A
FIG. 25B
FIG. 25C

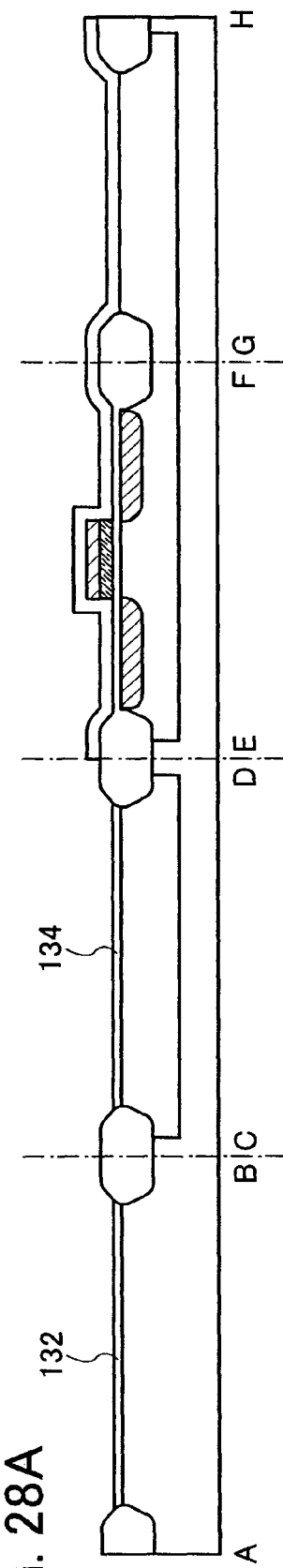
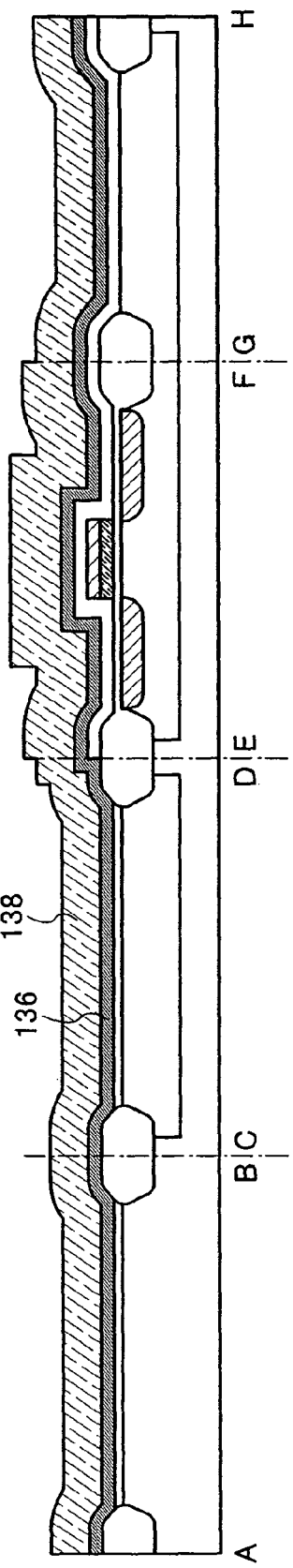
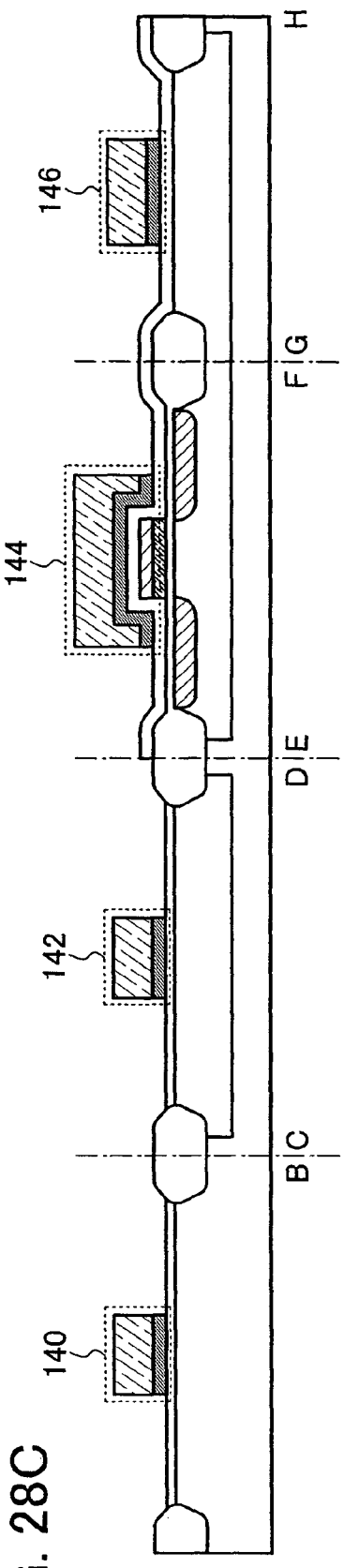
FIG. 28A
FIG. 28B
FIG. 28C

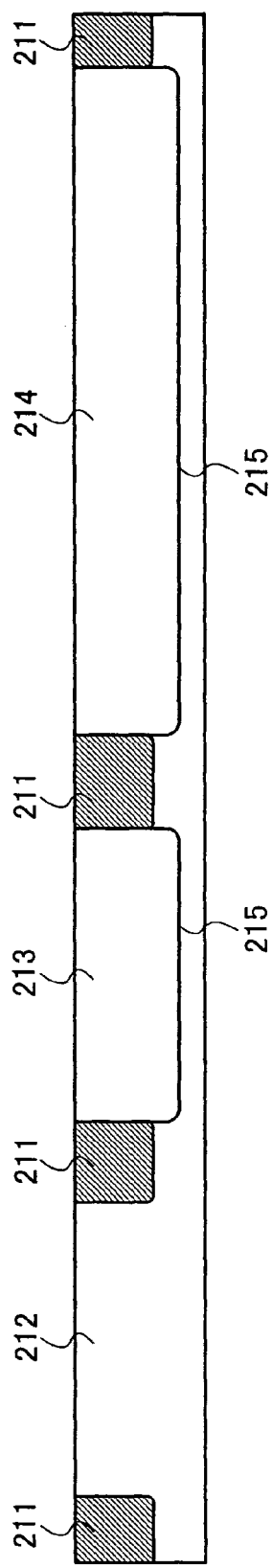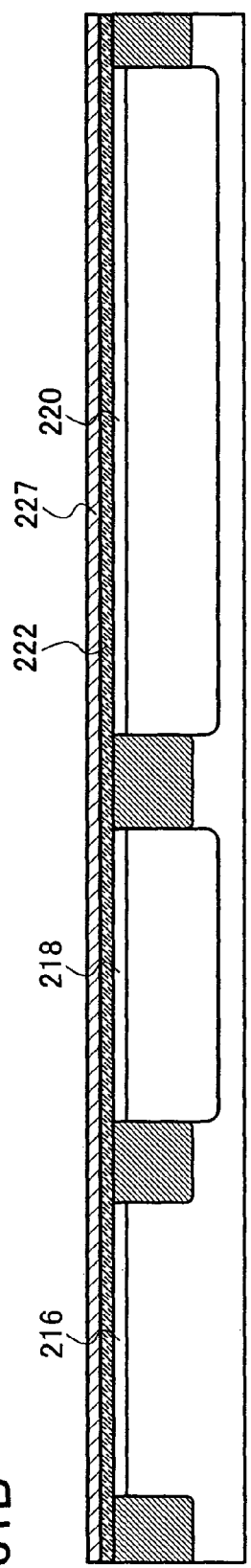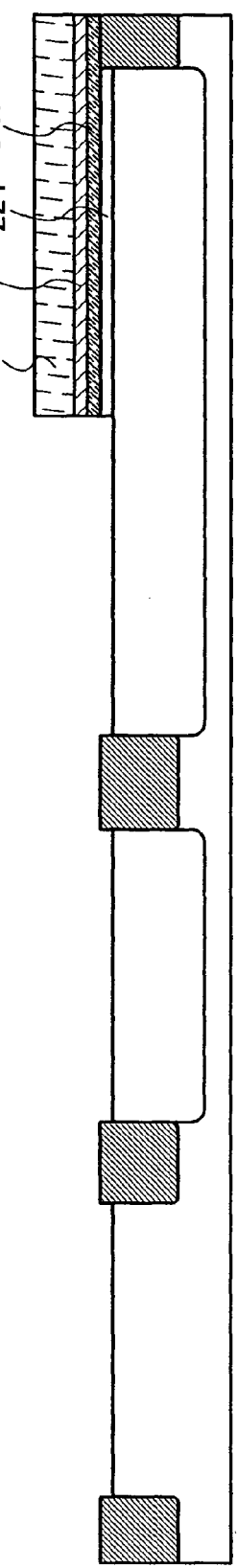

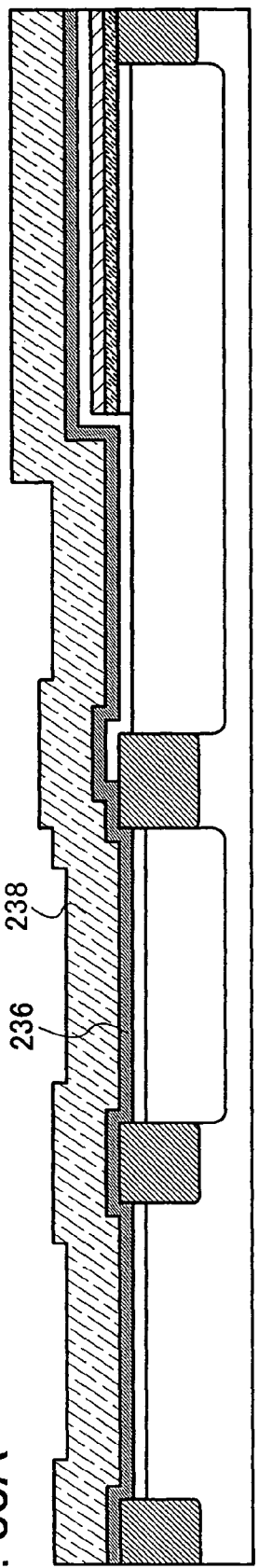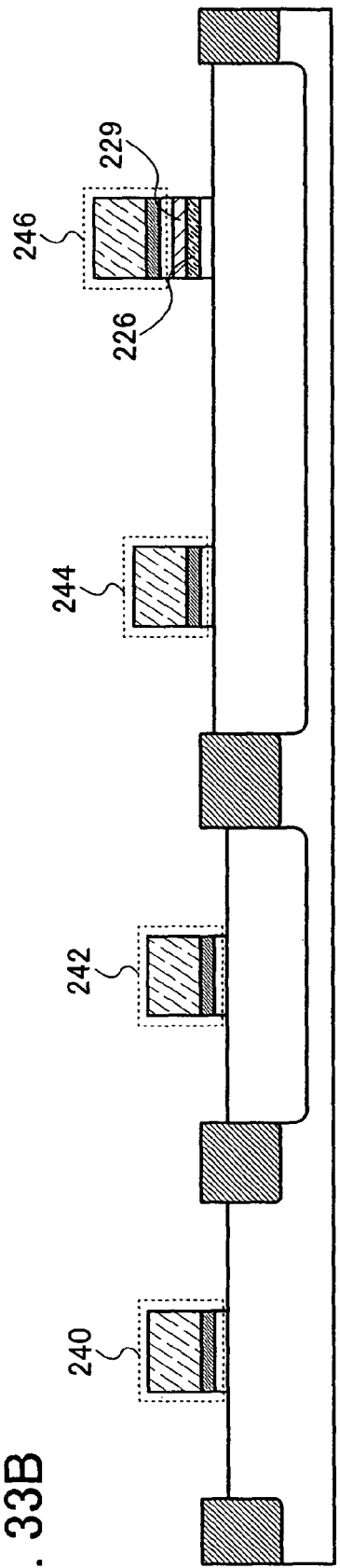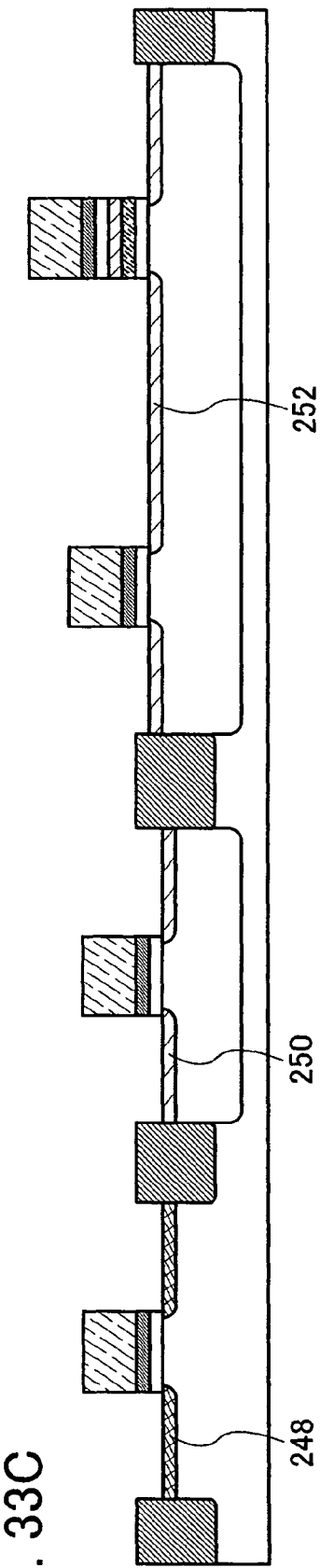

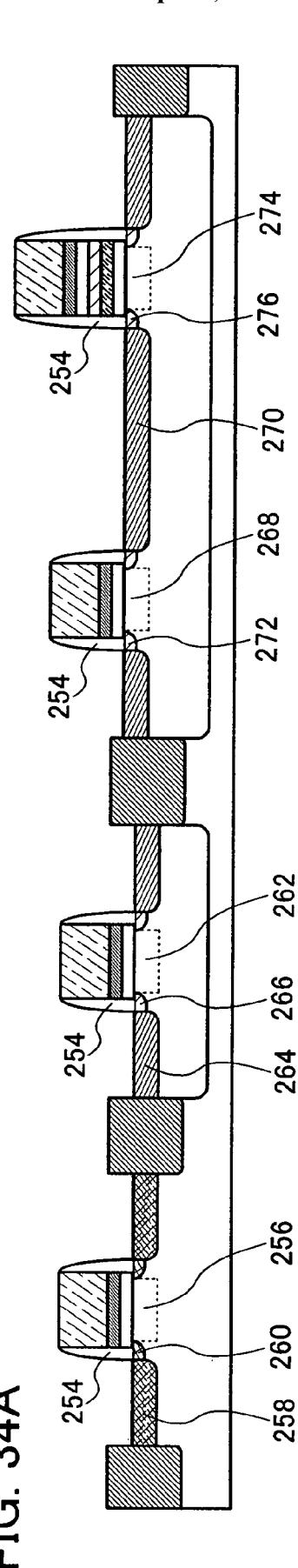
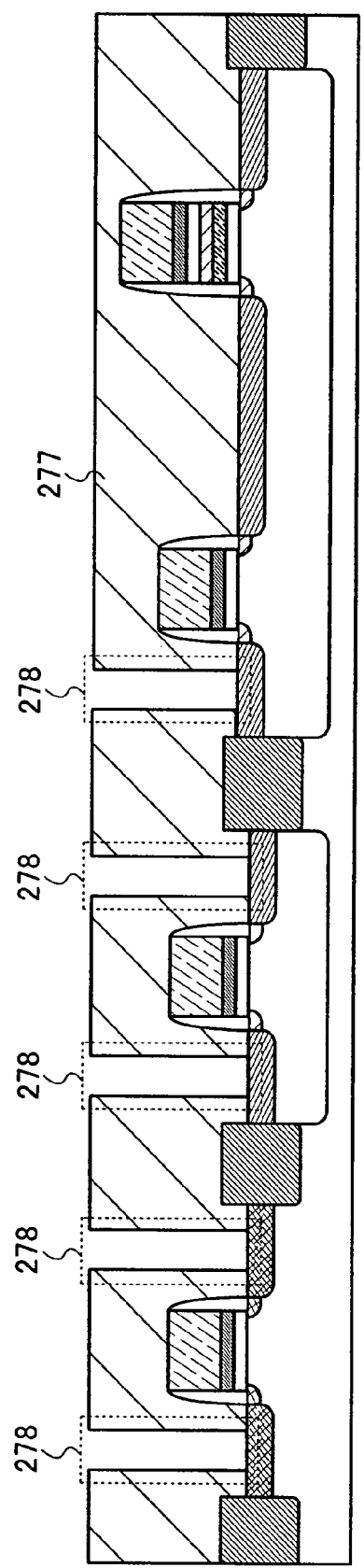
FIG. 34A
FIG. 34B

NONVOLATILE SEMICONDUCTOR MEMORY DEVICE

BACKGROUND OF THE INVENTION

1. Field of the Invention

The present invention relates to a nonvolatile semiconductor memory device capable of electrical writing, reading, and erasing, and a manufacturing method thereof. In particular, the present invention relates to a structure of a floating gate in the nonvolatile semiconductor memory device.

2. Description of the Related Art

The market has been expanding for nonvolatile memories in which data can be electrically rewritten and data can be kept stored even after the power is turned off. Features of a nonvolatile memory are that its structure is similar to that of a MOSFET (Metal Oxide Semiconductor Field Effect Transistor) and a region capable of accumulating charges for a long period of time is provided over a channel formation region. This charge accumulation region which is formed over an insulating layer and is isolated and separated from the surround is also called a floating gate. Since the floating gate is surrounded by an insulator to be electrically isolated from the surround, the floating gate has a characteristic of holding charges after the charges are injected into the floating gate. Over the floating gate, a gate electrode called a control gate is further provided with an insulating layer interposed therebetween. The control gate is distinguished from the floating gate in that a predetermined voltage is applied thereto when data is read or written.

A so-called floating-gate-type nonvolatile memory having such a structure has a mechanism in which data is stored by electrically controlling charge injection into and charge ejection from the floating gate. Specifically, the charge injection into and charge ejection from the floating gate are performed by applying a high voltage between a semiconductor layer in which the channel formation region is to be formed and the control gate. It is said that, at this time, a Fowler-Nordheim type (FN type) tunnel current (in the case of an NAND type) or a hot electron (in the case of a NOR type) flows into the insulating layer over the channel formation region. For this reason, this insulating layer is also called a tunnel insulating layer.

The floating-gate-type nonvolatile memory is required to have a characteristic of holding charges accumulated in the floating gate for ten years or more in order to assure the reliability. Therefore, it is required for the tunnel insulating layer to be formed with a thickness which allows the tunnel current to flow, and to have a high insulating property so as not to leak charges.

In addition, the floating gate formed over the tunnel insulating layer has been formed of silicon which is the same semiconductor material as that of the semiconductor for forming the channel formation region. Specifically, a method for forming the floating gate using polycrystalline silicon has been widely used, and for example, a polysilicon film deposited with a thickness of 400 nm is known (see page 7 and FIG. 7 in Japanese Published Patent Application No. 2000-58685)

SUMMARY OF THE INVENTION

The floating gate of the nonvolatile memory which is formed of polycrystalline silicon has the same bottom energy level of a conduction band as that of the channel formation region of the semiconductor substrate. When the thickness of the polycrystalline silicon of the floating gate is decreased, the bottom energy level of the conduction band of the floating gate gets higher than that of the semiconductor for forming the channel formation region. If such a state is formed, it becomes difficult to inject electrons from the semiconductor substrate into the floating gate, so that a writing voltage is required to be increased. In order to reduce the writing voltage as much as possible, in the nonvolatile memory in which the floating gate is formed of polycrystalline silicon, the Fermi level is required to be shifted to the conduction band side by adding an n-type impurity such as phosphorus or arsenic into the floating gate.

As for the tunnel insulating layer provided between the floating gate and the semiconductor substrate, the thickness thereof is required to be small in order to inject charges into the floating gate with low voltage. On the other hand, in order to hold charges stably for a long period of time, the thickness thereof is required to be large so that charge (carrier) leakage or impurity penetration is prevented.

After all, the conventional nonvolatile memory requires a high writing voltage. In addition, measures such as error detection and error correction are taken, through the provision of a redundant memory cell or the device of a controller, against degradation in charge holding property by repeatedly rewrite, whereby the reliability is ensured.

In view of the foregoing, it is an object of the present invention to provide a nonvolatile semiconductor memory device which is superior in writing property and charge holding property.

One aspect of the present invention relates to a nonvolatile semiconductor memory device including a semiconductor substrate in which a channel formation region is formed between a pair of impurity regions formed with an interval, and a first insulating layer, a floating gate electrode, a second insulating layer, and a control gate electrode which are provided over the semiconductor substrate in a position roughly overlapped with the channel formation region. In the present invention, the floating gate electrode includes at least a first layer formed of a semiconductor material and a second layer formed of a metal material, or an alloy material or a metal compound material thereof. In other words, the floating gate electrode of the nonvolatile semiconductor memory device according to the present invention includes a semiconductor layer, and a metal layer, an alloy layer, or a metal compound layer with a barrier property which is provided on a second insulating layer side of the semiconductor layer for preventing corrosion of the semiconductor layer. The semiconductor material for forming the floating gate electrode can be selected from plural kinds of materials depending on a semiconductor material for forming the channel formation region.

As the semiconductor material for forming the floating gate electrode, a material which satisfies one or a plurality of the following conditions can be selected. It is preferable that a band gap of the semiconductor material for forming the floating gate electrode be smaller than a band gap of the channel formation region in the semiconductor substrate. For example, it is preferable that there be a difference of 0.1 eV or more between the band gap of the semiconductor material for forming the floating gate electrode and the band gap of the channel formation region in the semiconductor substrate, and the former be smaller than the latter.

In addition, it is preferable that the semiconductor material for forming the floating gate electrode have lower resistivity than a material for forming the semiconductor substrate. The resistivity is preferably 40 Ω·cm to 100 Ω·cm.

It is preferable that the semiconductor material for forming the floating gate electrode be typically germanium or a germanium compound.

The floating gate electrode is applied to a nonvolatile semiconductor memory device according to the present invention for charge (carrier) accumulation. Without limitation to germanium or a germanium compound, a layer of an oxide or a nitride of germanium or a germanium compound, or an oxide layer or a nitride layer containing germanium or a germanium compound can be used as long as it has a similar function, that is, it functions as a layer for accumulating charges (carriers).

Furthermore, it is preferable that a layer formed of a metal, or an alloy or a metal compound thereof be used as the second layer that is in contact with the first layer of the floating gate electrode formed of germanium or a germanium compound. The metal is preferably a refractory metal such as tungsten (W), tantalum (Ta), titanium (Ti), molybdenum (Mo), chromium (Cr), or nickel (Ni). An alloy using plural kinds of the refractory metals may be used. The alloy may be formed using the refractory metal and niobium (Nb), zirconium (Zr), cerium (Ce), thorium (Th), or hafnium (Hf). Alternatively, an oxide or a nitride of the refractory metal may be used. A metal nitride such a tantalum nitride, a tungsten nitride, a molybdenum nitride, or a titanium nitride may be used. A metal oxide such as a tantalum oxide, a titanium oxide, or a molybdenum oxide may be used.

When a floating gate electrode is formed over a semiconductor substrate with a first insulating layer which functions as a tunnel insulating layer interposed therebetween, the floating gate electrode formed using a semiconductor material at least containing germanium can facilitate charge (carrier) injection from the channel formation region in the semiconductor substrate into the floating gate electrode, and improve a charge holding property of the floating gate electrode. When a layer is further formed of a metal, or an alloy or a metal compound thereof in contact with the semiconductor material for forming the floating gate electrode, this layer can serve as a barrier layer for improving water resistance of the floating gate electrode and preventing corrosion thereof. Accordingly, degradation of the floating gate electrode can be suppressed.

BRIEF DESCRIPTION OF DRAWINGS

FIGS. 6A and 6B are diagrams, for describing writing and reading operations of a nonvolatile memory.

FIGS. 7A and 7B are diagrams describing an erasing operation of a nonvolatile memory.

FIGS. 11A and 11B are diagrams for describing writing operations of a NAND-type nonvolatile memory.

FIGS. 12A and 12B are diagrams for describing erasing and reading operations of a NAND-type nonvolatile memory.

FIGS. 17A to 17C are diagrams showing one example of a manufacturing method of a nonvolatile semiconductor memory device of the present invention.

FIGS. 18A to 18C are diagrams showing one example of a manufacturing method of a nonvolatile semiconductor memory device of the present invention.

FIGS. 19A to 19C are diagrams showing one example of a manufacturing method of a nonvolatile semiconductor memory device of the present invention.

FIGS. 20A to 20C are diagrams showing one example of a manufacturing method of a nonvolatile semiconductor memory device of the present invention.

FIGS. 21A to 21C are diagrams showing one example of a manufacturing method of a nonvolatile semiconductor memory device of the present invention.

FIGS. 24A to 24C are diagrams showing one example of a manufacturing method of a nonvolatile semiconductor memory device of the present invention.

FIGS. 25A to 25C are diagrams showing one example of a manufacturing method of a nonvolatile semiconductor memory device of the present invention.

FIGS. 28A to 28C are diagrams showing one example of a manufacturing method of a nonvolatile semiconductor memory device of the present invention.

FIGS. 31A to 31C are diagrams showing one example of a manufacturing method of a nonvolatile semiconductor memory device of the present invention.

FIGS. 33A to 33C are diagrams showing one example of a manufacturing method of a nonvolatile semiconductor memory device of the present invention.

FIGS. 34A and 34B are diagrams showing one example of a manufacturing method of a nonvolatile semiconductor memory device of the present invention.

DETAILED DESCRIPTION OF THE INVENTION

Figure 1:
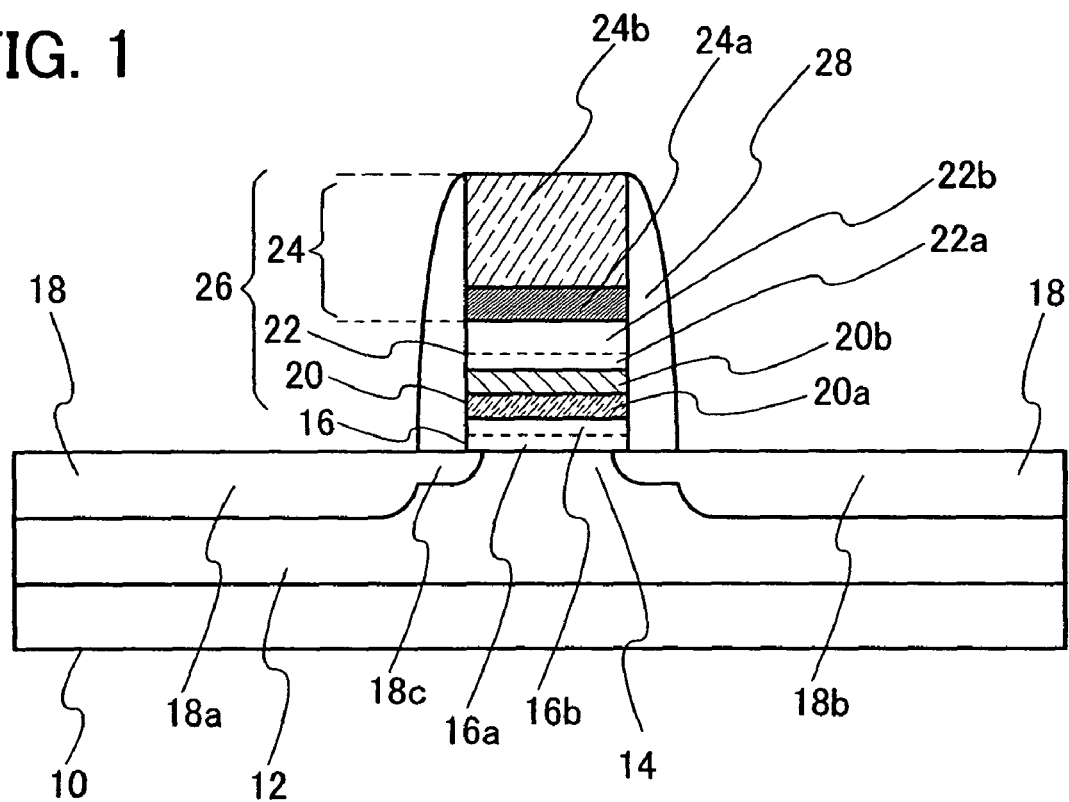
FIG. 1 is a cross-sectional diagram for describing a main structure of a nonvolatile semiconductor memory device of the present invention.

Although the present invention will be fully described by way of an embodiment mode and embodiments with reference to the accompanying drawings, the present invention is not limited to the description and it is to be understood that various changes and modifications will be apparent to those skilled in the art. Therefore, unless such changes and modifications depart from the scope of the present invention, they should be construed as being included therein. Note that the same parts in different drawings may be denoted by the same reference numerals in structures of the present invention described below.

Embodiment Mode 1

FIG. 1 is a cross-sectional diagram for describing a main structure of a nonvolatile semiconductor memory device of the present invention. FIG. 1 particularly illustrates a substantial part of the nonvolatile memory element. This nonvolatile memory element is manufactured using a semiconductor substrate 10. As the semiconductor substrate 10, a single crystalline silicon substrate (silicon wafer) is preferably used. Alternatively, an SOI (Si-On-Insulator) substrate can be used. As the SOI substrate, a so-called SIMOX (Separation by Implanted Oxygen) substrate may be used which is manufactured by implanting oxygen ions into a mirror-polished wafer and then performing high-temperature annealing so that an oxide film layer is formed in a position with a certain depth from a top surface as well as a defect occurred in a top surface layer is discharged.

In the case where the substrate 10 is of an n-type, a p-well 12 into which a p-type impurity is injected is formed. As the p-type impurity, boron, for example, is used and added at a concentration of approximately $5 \times 10^{15}$ atoms/cm$^3$ to $1 \times 10^{16}$ atoms/cm$^3$. By forming the p-well 12, an n-channel transistor can be formed in this region. Further, the p-type impurity which is added to the p-well 12 also has an effect of controlling the threshold voltage of a transistor. A channel formation region 14 which is formed in the semiconductor substrate 10 is formed in a region roughly corresponding to a gate 26 to be described later, and is located between a pair of impurity regions 18 formed in the semiconductor substrate 10.

The pair of impurity regions 18 is a pair of regions functioning as a source and a drain in the nonvolatile memory element. The pair of impurity regions 18 is formed by adding phosphorus or arsenic which is an n-type impurity at a concentration of approximately $1 \times 10^{19}$ atoms/cm$^3$ to $1 \times 10^{21}$ atoms/cm$^3$.

A spacer 28 is formed on a side wall of the gate 26, and it has an effect of preventing a leakage current (e.g., a current which flows between a floating gate electrode 20 and a control gate electrode 24) at an end portion of the gate 26. Further, by utilizing this spacer 28, a low-concentration impurity region 18c can be formed at each end of the gate 26 in the channel-length direction. The low-concentration impurity region 18c functions as a low-concentration drain (Lightly-Doped-Drain: LDD). Although the low-concentration impurity region 18c is not necessarily provided, an electric field at a drain edge can be lowered and degradation caused by repeated writing and erasing can be suppressed.

Over the semiconductor substrate 10, a first insulating layer 16, the floating gate electrode 20, a second insulating layer 22, and a control gate electrode 24 are formed. In this specification, a stacked structure including from the floating gate electrode 20 to the control gate electrode 24 may be called the gate 26.

The first insulating layer 16 is formed of a silicon oxide, or a stacked structure of a silicon oxide and a silicon nitride. The first insulating layer 16 may be formed by oxidizing the surface of the semiconductor substrate 10 by thermal oxidation; however, the first insulating layer 16 is preferably formed by solid-phase oxidation or solid-phase nitridation using plasma treatment. This is because an insulating layer which is formed by oxidizing or nitriding the surface of the semiconductor substrate 10 using plasma treatment is dense, high in withstand voltage, and superior in reliability. Since the first insulating layer 16 is used as a tunnel insulating layer for injecting charges (carriers) into the floating gate electrode 20, such a durable insulating layer is preferable. This first insulating layer 16 is preferably formed with a thickness of 1 nm to 20 nm inclusive, more preferably 3 nm to 6 nm inclusive. For example, when the gate length is 600 nm, the first insulating layer 16 can be formed with a thickness of 3 nm to 6 nm inclusive.

In the solid-phase oxidation treatment or the solid-phase nitridation treatment using plasma treatment, it is preferable to use plasma which is excited by microwave (typically, 2.45 GHz), of which the electron density is $1 \times 10^{11}$ cm$^{-3}$ to $1 \times 10^{13}$ cm$^{-3}$ inclusive, and of which the electron temperature is 0.5 eV to 1.5 eV inclusive. This is because a practical reaction rate can be obtained and a dense insulating layer can be formed at a temperature of 500° C. or less in the solid-phase oxidation treatment or the solid-phase nitridation treatment.

The oxidation of the surface of the semiconductor substrate 10 by this plasma treatment is performed in an oxygen atmosphere (e.g., in an atmosphere containing oxygen ($O_2$) or dinitrogen monoxide ($N_2O$) and a rare gas (containing at least one of He, Ne, Ar, Kr, or Xe), or in an atmosphere containing oxygen or dinitrogen monoxide and hydrogen ($H_2$) and a rare gas). The nitridation of the surface of the semiconductor substrate 10 by the plasma treatment is performed in a nitrogen atmosphere (e.g., in an atmosphere containing nitrogen ($N_2$) and a rare gas (containing at least one of He, Ne, Ar, Kr, or Xe), in an atmosphere containing nitrogen, hydrogen, and a rare gas, or in an atmosphere containing $NH_3$ and a rare gas). As the rare gas, Ar can be used, for example. Further, a gas in which Ar and Kr are mixed may also be used.

Figure 15:
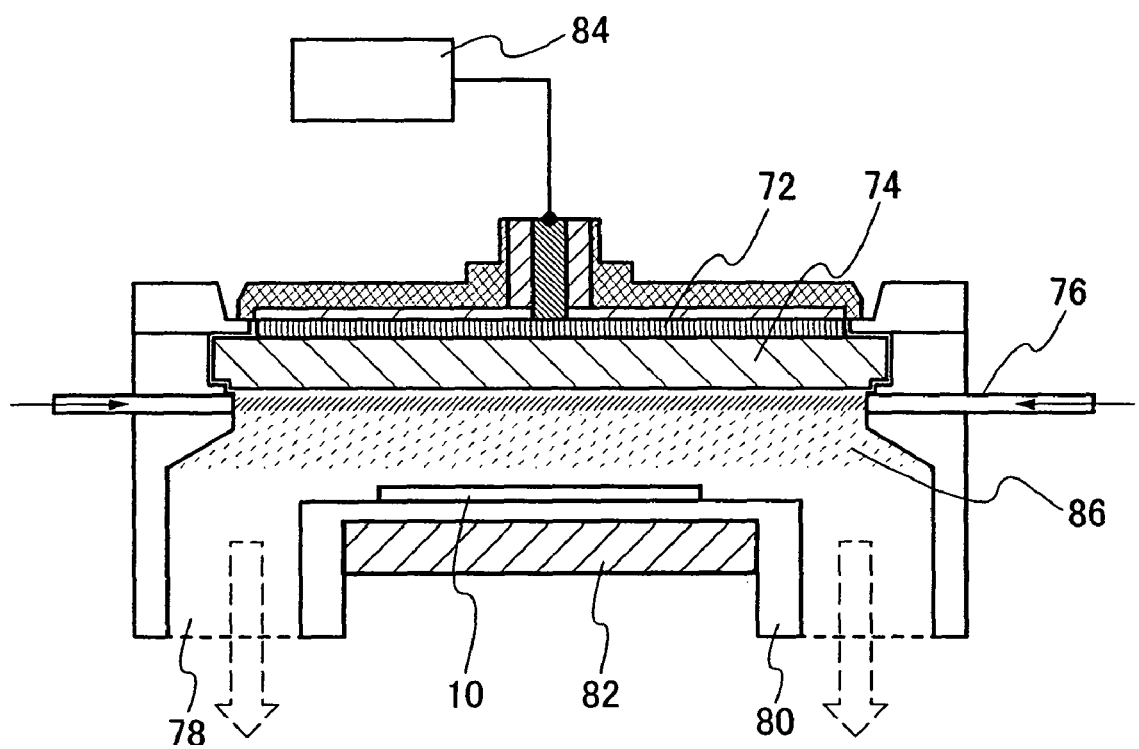
FIG. 15 is a diagram for describing a structure of a plasma treatment apparatus.

FIG. 15 shows a structural example of an apparatus for performing plasma treatment. This plasma treatment apparatus includes a supporting base 80 for disposing the semiconductor substrate 10, a gas supplying portion 76 for introducing a gas, an exhaust outlet 78 connected to a vacuum pump for exhausting a gas, an antenna 72, a dielectric plate 74, and a microwave supplying portion 84 for supplying a microwave for generating plasma. In addition, by providing the supporting base 80 with a temperature controlling portion 82, the temperature of the semiconductor substrate 10 can be controlled.

The plasma treatment will be described below. Note that the plasma treatment includes oxidation treatment, nitridation treatment, oxynitridation treatment, hydrogenation treatment, and surface modification treatment on a semiconductor substrate, an insulating layer, and a conductive layer. In each treatment, a gas supplied from the gas supplying portion 76 can be selected in accordance with its purpose.

Oxidation treatment or nitridation treatment may be performed as follows. First, a treatment chamber is evacuated, and a plasma treatment gas containing oxygen or nitrogen is introduced from the gas supplying portion 76. The semiconductor substrate 10 is at a room temperature or heated to a temperature of 100° C. to 550° C. by the temperature controlling portion 82. Note that the distance between the semiconductor substrate 10 and the dielectric plate 74 is approximately 20 mm to 80 mm (preferably, 20 mm to 60 mm). Next, microwaves are supplied to the antenna 72 from the microwave supplying portion 84. Then, the microwaves are introduced into the treatment chamber from the antenna 72 though the dielectric plate 74, whereby plasma 86 is generated. By exciting plasma with microwave introduction, plasma with a low electron temperature (3 eV or less, preferably 1.5 eV or less) and a high electron density ($1\times10^{11}$ cm$^{-3}$ or more) can be generated. With oxygen radicals (which may include OH radicals) and/or nitrogen radicals (which may include NH radicals) generated by this high-density plasma, the surface of the semiconductor substrate can be oxidized and/or nitrided. By mixing a rare gas such as argon into the plasma treatment gas, oxygen radicals or nitrogen radicals can be effectively generated by excited species of the rare gas. This method can perform solid-phase oxidation, solid-phase nitridation, or solid-phase oxynitridation, or nitridation of an oxidized layer at a low temperature of 500 ° C. or less by efficiently utilizing the active radicals excited by the plasma.

In FIG. 1, as one preferable mode of the first insulating layer 16 formed by plasma treatment, a silicon oxide layer 16a is formed with a thickness of 3 nm to 6 nm inclusive over the surface of the semiconductor substrate 10 by plasma treatment in an oxygen atmosphere and the surface of the silicon oxide layer 16a is treated with nitridation plasma in a nitrogen atmosphere to form a nitrogen plasma treatment layer 16b. Specifically, the silicon oxide layer 16a is first formed over the semiconductor substrate 10 by plasma treatment in oxygen atmosphere with a thickness of 3 nm to 6 nm inclusive. Then, the nitrogen plasma treatment layer 16b with high nitrogen concentration is successively provided on or adjacent to the surface of the silicon oxide layer through plasma treatment in a nitrogen atmosphere. Note that the expression "adjacent to the surface" refers to a region with a depth of approximately 0.5 nm to 1.5 nm inclusive from the surface of the silicon oxide layer. For example, nitrogen is included at a rate of 20 atomic % to 50 atomic % in a region of the silicon oxide layer 16a with a depth of approximately 1 nm from the surface through plasma treatment in a nitrogen atmosphere.

The floating gate electrode 20 is formed over the first insulating layer 16. The floating gate electrode 20 includes a first floating gate electrode 20a and a second floating gate electrode 20b. Needless to say, the floating gate electrode 20 is not limited to this two-layer structure, and may be formed by stacking a plurality of layers. However, it is preferable that the first floating gate electrode 20a that is formed in contact with the first insulating layer 16 be formed of a semiconductor material, and a semiconductor material which satisfies one or a plurality of the following conditions can be selected.

It is preferable that a band gap of the semiconductor material for forming the first floating gate electrode 20a be smaller than a band gap of the semiconductor substrate 10 (in this embodiment mode, the channel formation region 14). For example, it is preferable that there be a difference of 0.1 eV or more between the band gap of the semiconductor material for forming the first floating gate electrode 20a and the band gap of the channel formation region 14 in the semiconductor substrate 10, and the former be smaller than the latter. This is because, when the bottom energy level of a conduction band of the floating gate electrode 20 is lower than the bottom energy level of a condition band of the channel formation region 14 in the semiconductor substrate 10, a carrier (electron) injecting property is improved and a charge holding property is improved.

It is preferable that the semiconductor material for forming the first floating gate electrode 20a have lower resistivity than the material for forming the semiconductor substrate 10 (in this embodiment mode, the channel formation region 14). When the first floating gate electrode 20a is formed of a semiconductor material with low resistivity, voltage applied between the control gate electrode and the semiconductor substrate 10 (in this embodiment mode, the channel formation region 14) can be prevented from being divided by the floating gate electrode, and an electric field can be made to effectively act on the semiconductor substrate 10 (in this embodiment mode, the channel formation region 14). For example, germanium is preferable because it has a specific resistance of 40 Ω·cm to 70 Ω·cm inclusive. An n-type impurity may be added to the first floating gate electrode 20a in order to lower resistivity. Writing characteristics can be improved when the first floating gate electrode 20a is thus formed using a material having a smaller band gap and a lower resistivity than those of the semiconductor substrate 10 (in this embodiment mode, the channel formation region 14).

As for the semiconductor material for forming the first floating gate electrode 20a, it is preferable that barrier energy with respect to electrons in the first floating gate electrode 20a, formed by the first insulating layer 16, be higher than barrier energy with respect to electrons in the channel formation region 14 in the semiconductor substrate 10, formed by the first insulating layer 16. This is because carriers (electrons) can be easily injected particularly from the channel formation region 14 in the semiconductor substrate 10 into the first floating gate electrode 20a, and charges (carriers) can be prevented from being discharged from the first floating gate electrode 20a.

As the semiconductor material which satisfies the above conditions, germanium or a germanium compound can be typically selected. As a typical example of the germanium compound, silicon germanium can be given, and it is preferable that the silicon germanium contain germanium at 10 atomic % or more with respect to silicon in this case. When the concentration of the germanium is less than 10 atomic %, its effect as a constituting element is weakened and the band gap is not decreased effectively.

Needless to say, another material can also be used for forming the first floating gate electrode 20a as long as the material produces the similar effect. For example, a ternary semiconductor material containing germanium can be used. The semiconductor material may be hydrogenated. Further, as long as the function as a layer for accumulating charges (carries) of a nonvolatile memory element is provided, it can also be replaced with an oxide or a nitride of germanium or a germanium compound, or an oxide layer or a nitride layer containing germanium or a germanium compound.

The second floating gate electrode 20b provided on the second insulating layer 22 side in contact with the first floating gate electrode 20a is preferably formed of a metal, or an alloy or a metal compound thereof. The metal is preferably a refractory metal such as tungsten (W), tantalum (Ta), titanium (Ti), molybdenum (Mo), chromium (Cr), or nickel (Ni). An alloy using plural kinds of the refractory metals may be used. The alloy may be formed using the refractory metal and niobium (Nb), zirconium (Zr), cerium (Ce), thorium (Th), or hafnium (Hf). Alternatively, an oxide or a nitride of the refractory metal may be used. A metal nitride such as a tantalum nitride, a tungsten nitride, a molybdenum nitride, or a titanium nitride may be used. A metal oxide such as a tantalum oxide, a titanium oxide, or a molybdenum oxide may be used.

When the second floating gate electrode 20b is thus formed of a metal or the like, the first floating gate electrode 20a can be stabilized. In other words, when the second floating gate electrode 20b is formed on the upper side of the first floating gate electrode 20a which is formed of germanium or a germanium compound, the second floating gate electrode layer can be used as a barrier layer against water and chemicals in the manufacturing process. Therefore, the substrate can be easily treated in a photolithography process, an etching process, and a cleaning process, and the productivity can be improved. That is, processing of the floating gate electrode can be facilitated.

The second insulating layer 22 is formed of a single layer or a plurality of layers of a silicon oxide, a silicon oxynitride ($SiO_xN_y$ (x>y)), a silicon nitride ($SiN_x$), a silicon nitride oxide ($SiN_xO_y$ (x>y)), an aluminum oxide ($Al_xO_y$), or the like by a low-pressure CVD method, a plasma CVD method, or the like. The thickness of the second insulating layer 22 is 1 nm to 20 nm inclusive, preferably 5 nm to 10 nm inclusive. For example, a stack of a silicon nitride layer 22a deposited with a thickness of 3 nm and a silicon oxide layer 22b deposited with a thickness of 5 nm can be used. Alternatively, the second insulating layer 22 may be formed by depositing silicon oxynitride ($SiO_xN_y$ (x>y)) by a plasma CVD method and then subjecting it to nitridation treatment through the plasma treatment. The second insulating layer 22 may be formed by depositing a silicon nitride oxide ($SiN_xO_y$ (x>y)) by a plasma CVD method and then subjecting it to oxidation treatment through the plasma treatment. When an insulating layer formed by a plasma CVD method or the like is thus subjected to plasma treatment for nitridation or oxidation, withstand voltage can be improved. If such an insulating layer is used as the second insulating layer 22, it is possible to prevent leakage of charges accumulated in the floating gate electrode 20 to the control gate electrode 24 side.

The control gate electrode 24 is preferably formed of a metal selected from tantalum (Ta), tungsten (W), titanium (Ti), molybdenum (Mo), chromium (Cr), niobium (Nb), or the like, or an alloy material or a compound material containing the metal as a main component. Alternatively, polycrystalline silicon to which an impurity element such as phosphorus is added can be used. Further alternatively, a stacked structure of a metal nitride layer 24a including one or more layers and a metal layer 24b of the above-mentioned metal may be formed as the control gate electrode 24. As the metal nitride, a tungsten nitride, a molybdenum nitride, or a titanium nitride can be used. By providing the metal nitride layer 24a, adhesion of the metal layer 24b can be improved and layer peeling can be prevented. Further, since the metal nitride such as tantalum nitride has a high work function, the first insulating layer 16 can be formed thick due to the synergistic effect with the second insulating layer 22.

An operation mechanism of the nonvolatile memory element shown in FIG. 1 will be described with reference to energy band diagrams. In the energy band diagrams described below, the same elements as those in FIG. 1 are denoted by the same reference symbols.

Figure 2:
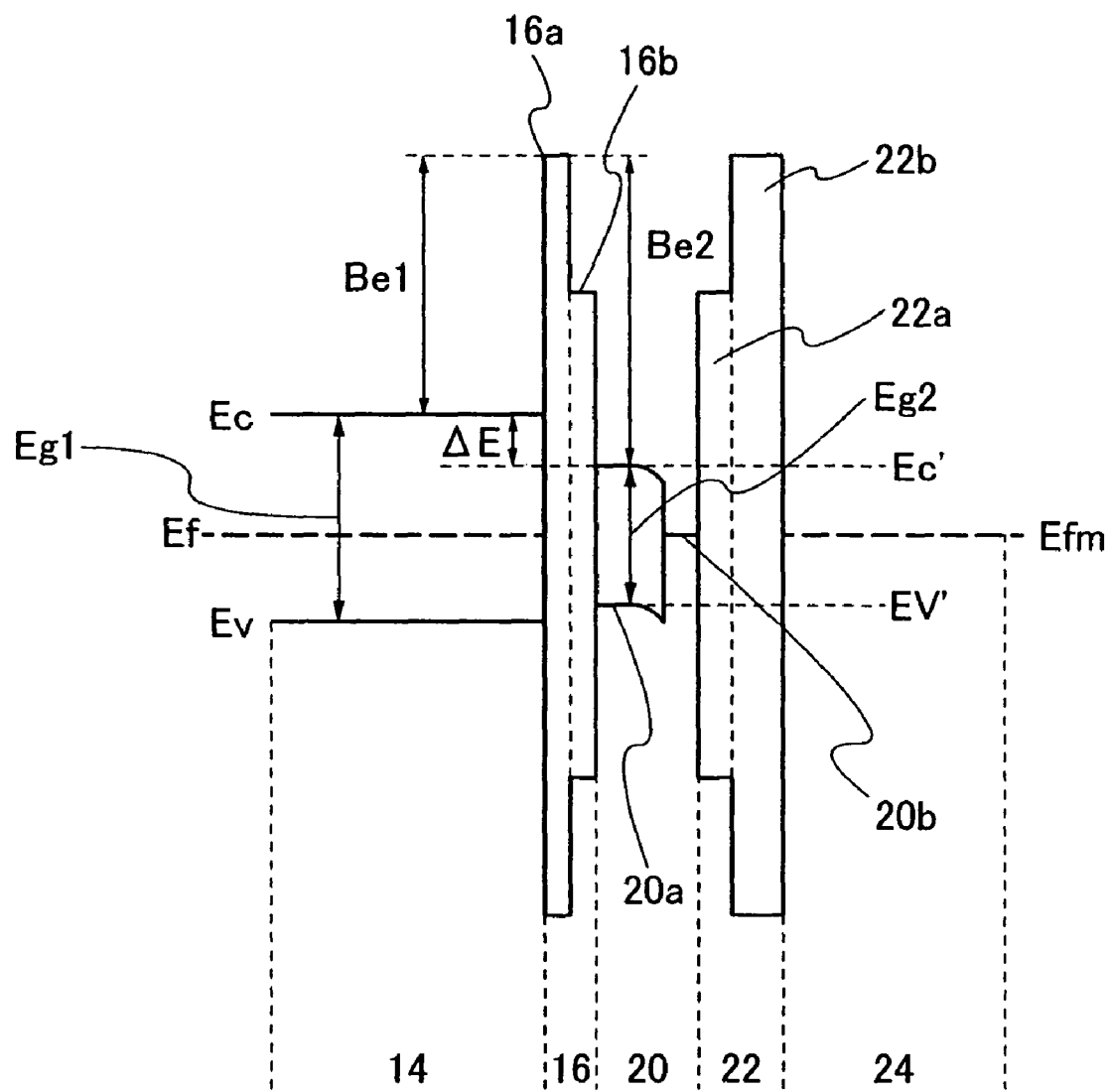
FIG. 2 is an energy band diagram of a nonvolatile memory.

FIG. 2 shows the state where the channel formation region 14 in the semiconductor substrate 10, the first insulating layer 16, the floating gate electrode 20, the second insulating layer 22, and the control gate electrode 24 are stacked. FIG. 2 shows the case where no voltage is applied to the control gate electrode 24 and a Fermi level Ef of the channel formation region 14 in the semiconductor substrate 10 and a Fermi level Efm of the control gate electrode 24 are equal to each other.

The semiconductor substrate 10 and the first floating gate electrode 20a are formed of different materials with the first insulating layer 16 interposed therebetween. They are combined such that a band gap Eg1 (an energy difference between a bottom end Ec of a conduction band and a top end Ev of a valence band) of the channel formation region 14 in the semiconductor substrate 10 is deferent from a band gap Eg2 of the first floating gate electrode 20a, and the latter band gap is smaller. For example, silicon (1.12 eV) for the channel formation region 14 in the semiconductor substrate 10, and germanium (0.72 eV) or silicon germanium (0.73 eV to 1.0 eV) for the first floating gate electrode 20a can be combined. Germanium or silicon germanium may be hydrogenated. In this case, it is acceptable as long as the hydrogen content of germanium or silicon germanium is 1 atomic % to 30 atomic %.

When a metal layer is used as the second floating gate electrode 20b, the metal layer can be formed using a metal material with a work function lower than that of the first floating gate electrode 20a. This is because a barrier is not formed against carriers (electrons) that are injected to the second floating gate electrode 20b. This facilitates carrier (electron) injection from the channel formation region 14 of the semiconductor substrate 10 to the second floating gate electrode 20b. For example, the work function of germanium which can be used for the first floating gate electrode 20a is 5.0 eV, so that tungsten (work function: 4.55 eV), tantalum (4.25 eV), titanium (4.33 eV), molybdenum (4.6 eV), or chromium (4.5 eV) can be used.

Note that the first insulating layer 16 includes the silicon oxide layer 16a (approximately 8 eV) and the nitrogen plasma treatment layer 16b (approximately 5 eV) which is obtained by nitriding the silicon oxide by plasma treatment. Further, the second insulating layer 22 includes the silicon nitride layer 22a and the silicon oxide layer 22b which are sequentially stacked over the floating gate electrode 20.

The channel formation region 14 of the semiconductor substrate 10 and the first floating gate electrode 20a, between which the first insulating layer 16 is interposed, are formed of different materials. In this case, they are combined such that a band gap of the channel formation region 14 of the semiconductor substrate 10 is different from a band gap of the first floating gate electrode 20a, and the latter band gap is smaller. For example, silicon (1.12 eV) can be used for the channel formation region 14 of the semiconductor substrate 10, and germanium (0.72 eV) or silicon germanium (0.73 eV to 1.1 eV) can be used for the first floating gate electrode 20a. In other words, the band gap Eg1 of silicon of the channel formation region 14 of the semiconductor substrate 10 and the band gap Eg2 of germanium of the first floating gate electrode 20a satisfy Eg1>Eg2. Energy barriers to electrons of the channel formation region 14 of the semiconductor substrate 10 and the first floating gate electrode 20a, which are formed by the first insulating layer 16, i.e., a first barrier Be1 and a second barrier Be2, respectively, have different values and can satisfy Be2>Be1. In such a situation, an energy difference ΔE is generated between an energy level at the conduction band bottom of the channel formation region 14 of the semiconductor substrate 10 and that of the floating gate electrode 20. As will be described afterwards, this energy difference ΔE contributes to reduction in writing voltage since ΔE acts in an electron-accelerating direction when electrons are injected from the channel formation region 14 of the semiconductor substrate 10 to the floating gate electrode 20.

Figure 16:
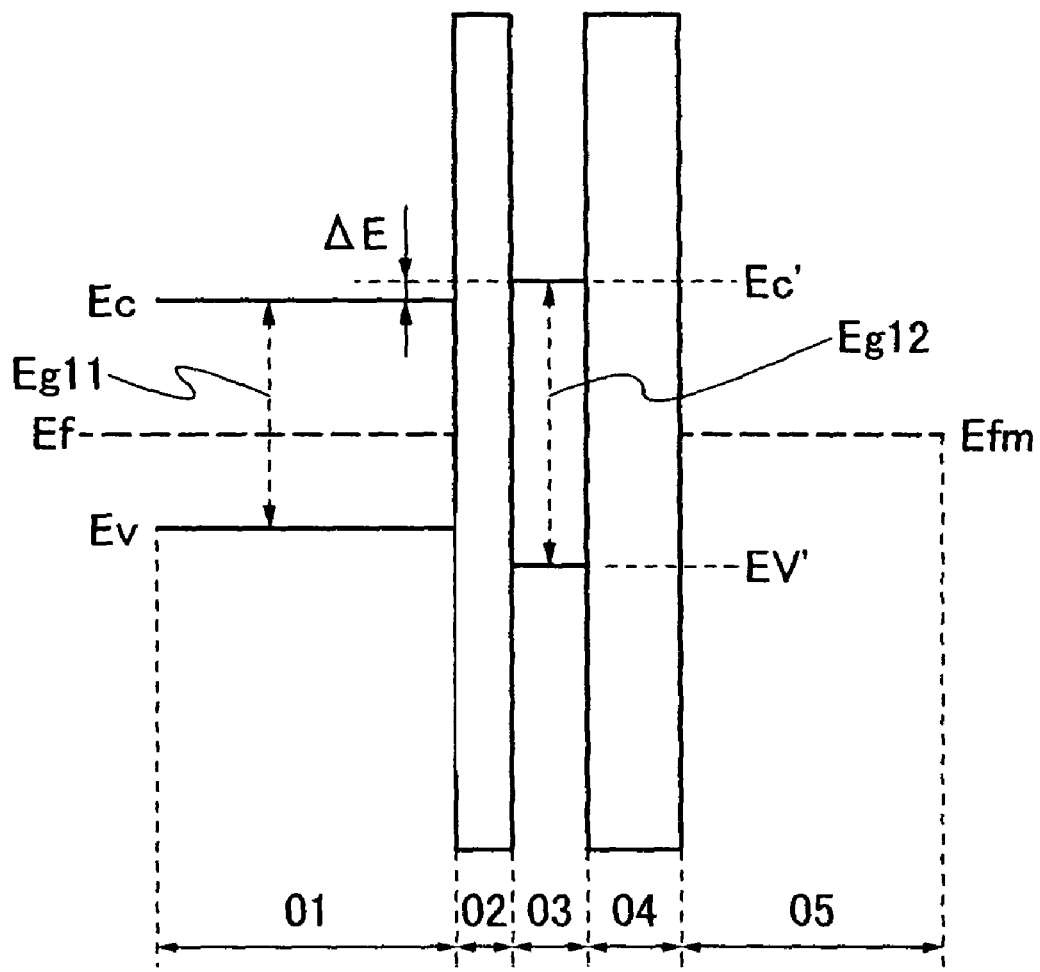
FIG. 16 is an energy band diagram of a conventional nonvolatile memory.

For comparison, an energy band diagram in the case where a channel formation region in a semiconductor substrate and a floating gate electrode are formed of the same semiconductor material is shown in FIG. 16. This energy band diagram shows the state where a channel formation region of a semiconductor substrate 01, a first insulating layer 02, a floating gate electrode 03, a second insulating layer 04, and a control gate electrode 05 are stacked sequentially.

Ordinarily, it is preferable that the thickness of the floating gate electrode 03 be made as thin as the channel length, or more preferably made thinner than the channel length, in order to form a fine pattern at the submicron level. This is because a fine pattern cannot be formed with respect to the gate length if the thickness is large. However, as the floating gate electrode 03 becomes thinner, the band gap of the floating gate electrode 03 becomes larger in the case where the floating gate electrode 03 is formed of the same silicon semiconductor as the channel formation region of the semiconductor substrate. That is, the bottom energy level of the conduction band of the floating gate electrode 03 becomes higher than the bottom energy level of the conduction band of the channel formation region of the semiconductor substrate.

FIG. 16 shows this state. The band gap of the channel formation region in the semiconductor substrate 01 is denoted by Eg11 and the band gap of the floating gate electrode 03 is denoted by Eg12. It is said that the band gap of silicon is increased to approximately 1.4 eV in the state of a thin film from 1.12 eV in the bulk state. Consequently, an energy difference ΔE which decelerates injection of electrons is generated between the channel formation region of the semiconductor substrate 01 and the floating gate electrode 03. In this state, a high voltage is required to inject electrons from the channel formation region of the semiconductor substrate 01 into the floating gate electrode 03. That is, in order to decrease the writing voltage, the floating gate electrode 03 is required to be doped with phosphorus or arsenic as an n-type impurity at a high concentration. This is a disadvantage of the conventional nonvolatile memory.

However, as shown in FIG. 2, in the case where germanium is used for the floating gate electrode 20, the band gap thereof is as small as 0.72 eV which is smaller than that of silicon. The band gap of germanium is at most approximately 1 eV even if the band gap is increased due to a reduction in thickness. Therefore, the band gap of the floating gate electrode 20 is kept smaller than the band gap of the channel formation region of the semiconductor substrate 10. Consequently, a self-bias generated from the energy difference between respective conduction band bottoms acts on electrons injected from the channel formation region so as to accelerate the injection of the electrons into the floating gate electrode 20. By adding phosphorus or arsenic which is an n-type impurity to germanium, the action can be further promoted.

As a result, when germanium or a germanium compound is used for forming the floating gate electrode 20, the thickness can be made small and a finer structure can be manufactured.

In particular, in the case where the channel length of a nonvolatile memory element is 100 nm or less, preferably 20 nm to 50 nm inclusive, the thickness of the floating gate electrode of germanium or a germanium compound to which an n-type impurity may be added can be small, which is desirable for ultra-high integration.

In addition, addition of an n-type impurity to the floating gate electrode at a high concentration tends to decrease the withstand voltage; therefore, such a high concentration is not preferable. Accordingly, it is preferable to use germanium or a germanium compound having conductivity to which an n-type or p-type impurity is intentionally not added or an n-type impurity is added at a concentration of $1\times10^{18}$ cm$^{-3}$ to $2\times10^{20}$ cm$^{-3}$. In view of this, it is preferable that the concentration of carbon (C), nitrogen (N), or oxygen (O) which is an impurity tending to insulate the layer including germanium, contained in the floating gate electrode formed of germanium or a germanium compound, be $5\times10^{19}$ cm$^{-3}$ or less, more preferably be $2\times10^{19}$ c$^{-3}$ or less.

There are the following methods for injecting electrons into the floating gate electrode 20; a method utilizing hot electrons and a method utilizing FN tunnel currents. In the case of utilizing hot electrons, a positive voltage is applied to the control gate electrode 24 and a high voltage is applied to a drain to generate hot electrons. Thus, the hot electrons can be injected into the floating gate electrode 20. In the case of utilizing FN tunnel currents, a positive voltage is applied to the control gate electrode 24 so that electrons are injected into the floating gate electrode 20 from the channel formation region 14 in the semiconductor substrate 10 by using FN tunnel currents.

Figure 3:
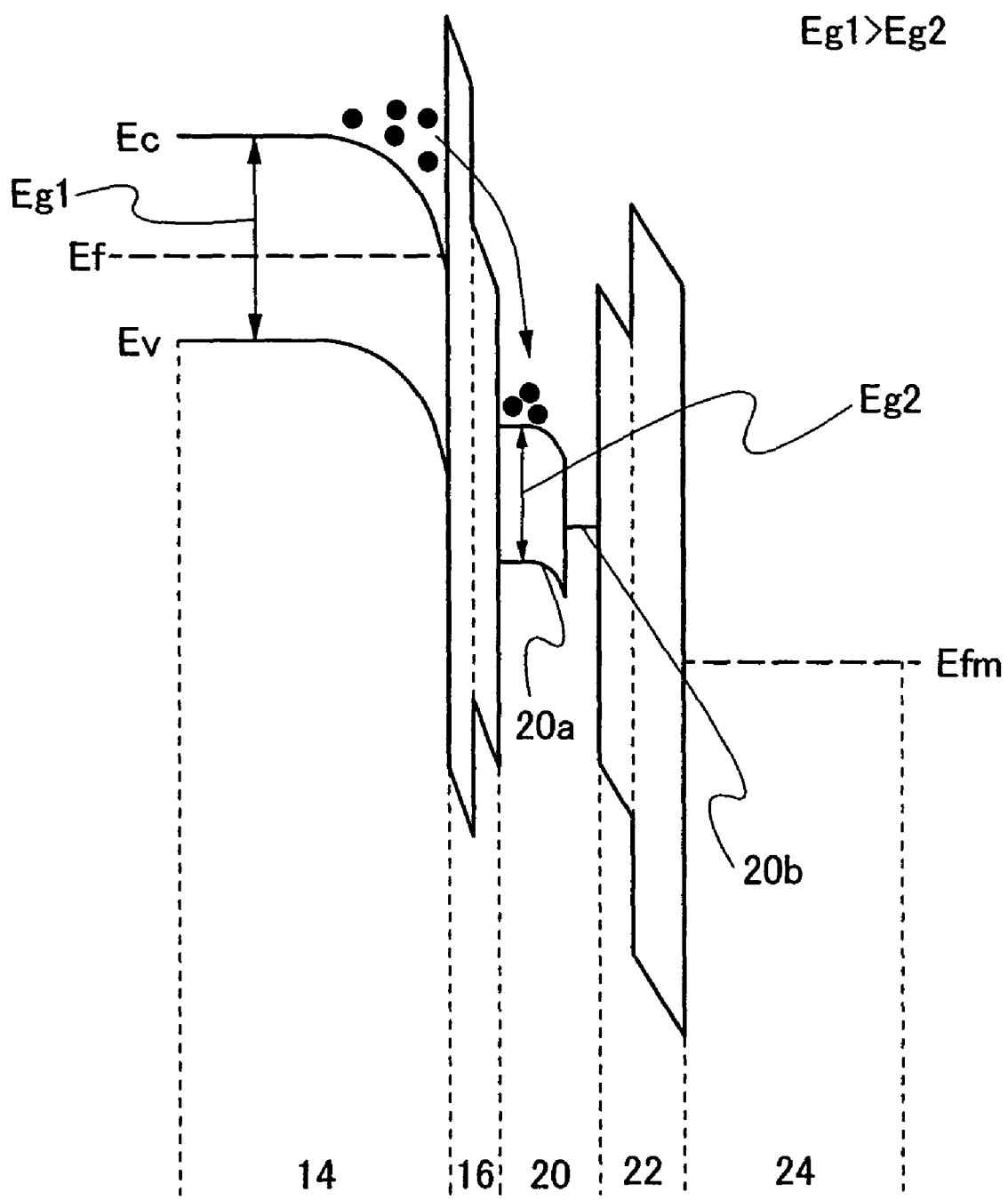
FIG. 3 is an energy band diagram of a nonvolatile memory in the sate of writing.

Applied voltages when electron injection into the floating gate electrode 20 is performed by using FN tunnel currents are shown in FIG. 6A. The p-well 12 of the semiconductor substrate 10 is grounded, a positive high voltage (10 V to 20 V) is applied to the control gate electrode 24, and potentials of a source region 18a and a drain region 18b are set to 0 V. An energy band diagram at this time is shown in FIG. 3. Electrons in the channel formation region 14 in the semiconductor substrate 10 are injected into the first insulating layer 16 by a high electrical field, and FN tunnel currents flow. As described in FIG. 2, the relationship between the band gap Eg1 of the channel formation region 14 in the semiconductor substrate 10 and the band gap Eg2 of the floating gate electrode 20 is Eg1>Eg2. This difference acts as a self-bias so as to accelerate electrons injected from the channel formation region toward the floating gate electrode. Accordingly, an electron injecting property can be improved.

The bottom energy level of the conduction band of the floating gate electrode 20 is lower than the bottom energy level of the conduction band of the channel formation region 14 in the semiconductor substrate 10 by ΔE in terms of electric energy. Therefore, an internal electrical field caused by this energy difference acts when injecting electrons into the floating gate electrode 20. This is realized by the above-described combination of the channel formation region 14 in the semiconductor substrate 10 and the floating gate electrode 20. That is, it becomes easy to inject electrons from the channel, formation region 14 in the semiconductor substrate 10 into the floating gate electrode 20, and a writing property in the nonvolatile memory element can be improved. This effect is obtained similarly in the case where electrons are injected into the floating gate electrode 20 by utilizing hot electrons.

Figure 4:
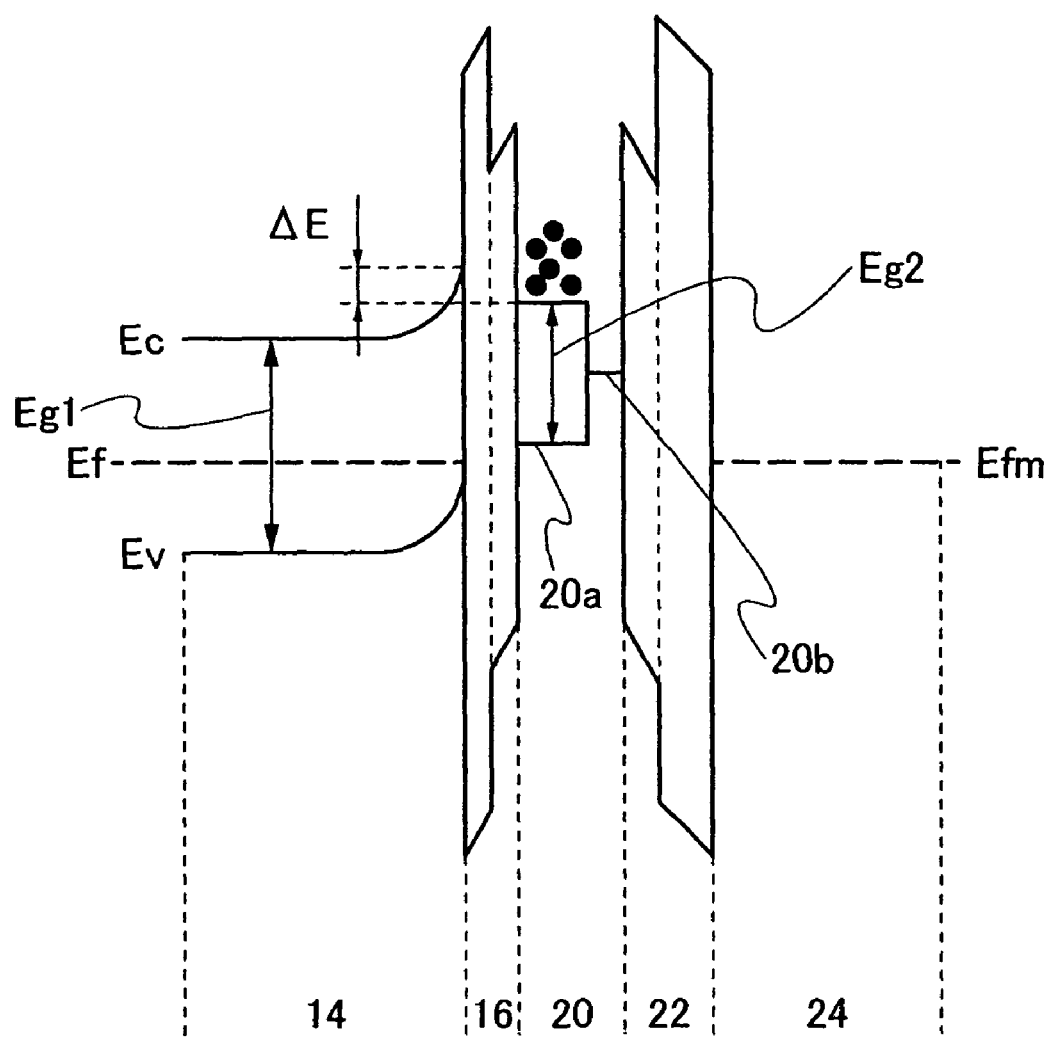
FIG. 4 is an energy band diagram of a nonvolatile memory in the sate of charge holding.

During a period in which electrons are held in the floating gate electrode 20, the threshold voltage of the nonvolatile memory element is shifted in a positive direction. This state can be considered as a state where data "0" is written. FIG. 4 is an energy band diagram in the state of charge holding. Electrons in the floating gate electrode 20 which are sandwiched between the first insulating layer 16 and the second insulating layer 22 are trapped energetically. Although the potential is increased by the carriers (electrons) accumulated in the first floating gate electrode 20a, the electrons are not discharged from the first floating gate electrode 20a unless energy which is higher than the barrier energy is applied to the electrons. In other words, the injected carriers can be prevented from remaining in the floating gate electrode and resulting in erasing failure. Since the second floating gate electrode 20b also has ability to accumulate carriers as a floating gate electrode, it can function as a floating gate electrode complementing the first floating gate electrode 20a. In other words, carriers accumulated in the floating gate electrode can be retained also in a reliability test in which the element is left at a constant temperature of 150° C.

In any event, electrons are not discharged from the floating gate electrode 20 in this case unless energy which is higher than the barrier energy is applied to the electrons. Further, since the bottom energy level of the conduction band of the floating gate electrode 20 is lower than the bottom energy level of the conduction band of the channel formation region 14 in the semiconductor substrate 10 by ΔE in terms of electric energy, an energetic barrier with respect to electrons is formed. Due to this barrier, the electrons can be prevented from being discharged into the semiconductor substrate 10 by tunnel currents.

A state where data "0" is written is detected as follows: it is detected by a circuit that a transistor is not turned on when an intermediate potential Vread is applied to the control gate electrode 24. The intermediate potential is a potential between the threshold Voltage Vth1 in data "1" and the threshold voltage Vth2 in the data "0" (in this case, Vth1<Vread<Vth2). Alternatively, the state where data "0" is written can be detected depending on whether or not the nonvolatile memory element becomes conductive by application of a bias between the source region 18a and the drain region 18b so that 0V or the intermediate potential Vread is applied to the control gate electrode 24 as shown in FIG. 6B.

FIG. 7A shows the state where charges (carriers) are discharged from the floating gate electrode 20 so that data is erased from the nonvolatile memory element. In this case, the control gate electrode 24 is grounded and a negative bias is applied to the p-well 12 of the semiconductor substrate 10, so that FN tunnel currents flow between the channel formation region 14 in the semiconductor substrate 10 and the floating gate electrode 20. Alternatively, as shown in FIG. 7B, a negative bias may be applied to the control gate electrode 24 and a positive high voltage may be applied to the source region 18a, so that FN tunnel currents are generated to extract electrons to the source region 18a side.

Figure 5:
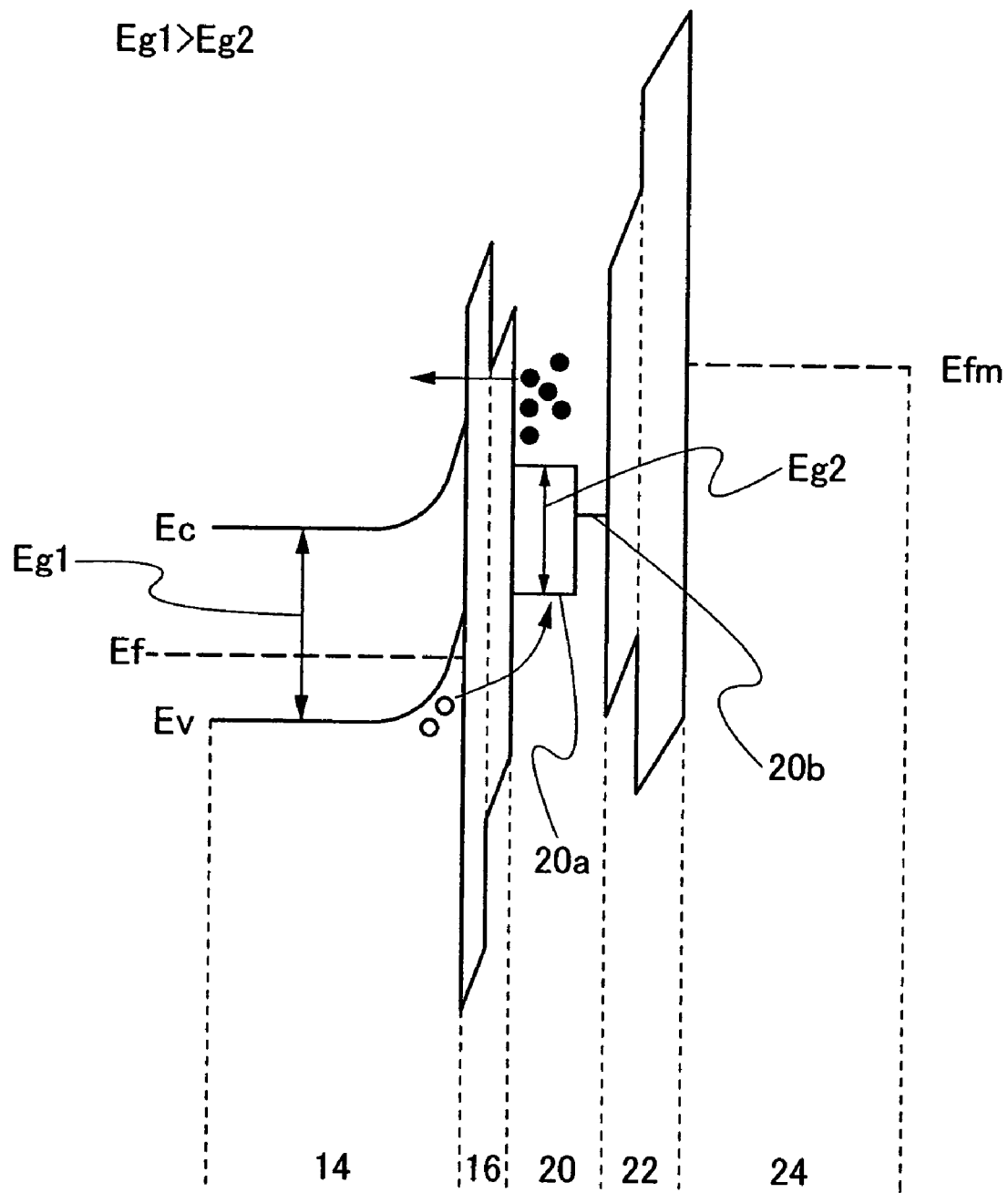
FIG. 5 is an energy band diagram of a nonvolatile memory in the sate of erasing.

FIG. 5 is an energy band diagram of this erasing state. Since the first insulating layer 16 can be formed to be thin, electrons in the floating gate electrode 20 can be discharged toward the semiconductor substrate 10 side by FN tunnel currents in an erasing operation. Furthermore, by injecting holes from the channel formation region 14 in the semiconductor substrate 10 into the floating gate electrode 20, a substantial erasing operation can be performed. Since holes are injected more easily from the channel formation region 14 in the semiconductor substrate 10, a substantial erasing operation can be performed by injecting the holes into the floating gate electrode 20.

By forming the floating gate electrode 20 using germanium or a germanium compound, the first insulating layer 16 can be made thin. Consequently, it becomes easy to inject electrons into the floating gate electrode 20 through the first insulating layer 16 by tunnel currents, and an operation can be performed at a low voltage. Further, charges (carriers) can be held at a low energy level, so that such a significant effect that charges (carriers) can be held at a stable state can be provided.

As shown in FIGS. 2 and 3, the nonvolatile memory element of the present invention is structured such that the channel formation region 14 in the semiconductor substrate 10 and the floating gate electrode 20 satisfy Eg1>Eg2 to generate a self-bias therebetween. This relationship is extremely important and acts so as to easily inject carriers from the channel formation region in the semiconductor substrate into the floating gate electrode. That is, the writing voltage can be reduced. At the same time, it is made difficult to discharge carriers from the floating gate electrode. In this way, this relationship acts so as to improve the memory holding property of the nonvolatile memory element. Further, by adding an n-type impurity to a germanium layer as the floating gate electrode, the bottom energy level of the conduction band thereof can be further reduced, whereby the self-bias can act so as to further easily inject carriers into the floating gate electrode. That is, the writing voltage can be reduced and the memory holding property of the nonvolatile memory element can be improved.

As described above, in the nonvolatile memory element of the present invention, charges (carriers) can be injected easily from the semiconductor substrate into the floating gate electrode and charges (carriers) can be prevented from being discharged from the floating gate electrode. That is, when this nonvolatile memory element operates as a memory, highly efficient writing at a low voltage can be performed and the charge holding property can be improved.

Figure 8:
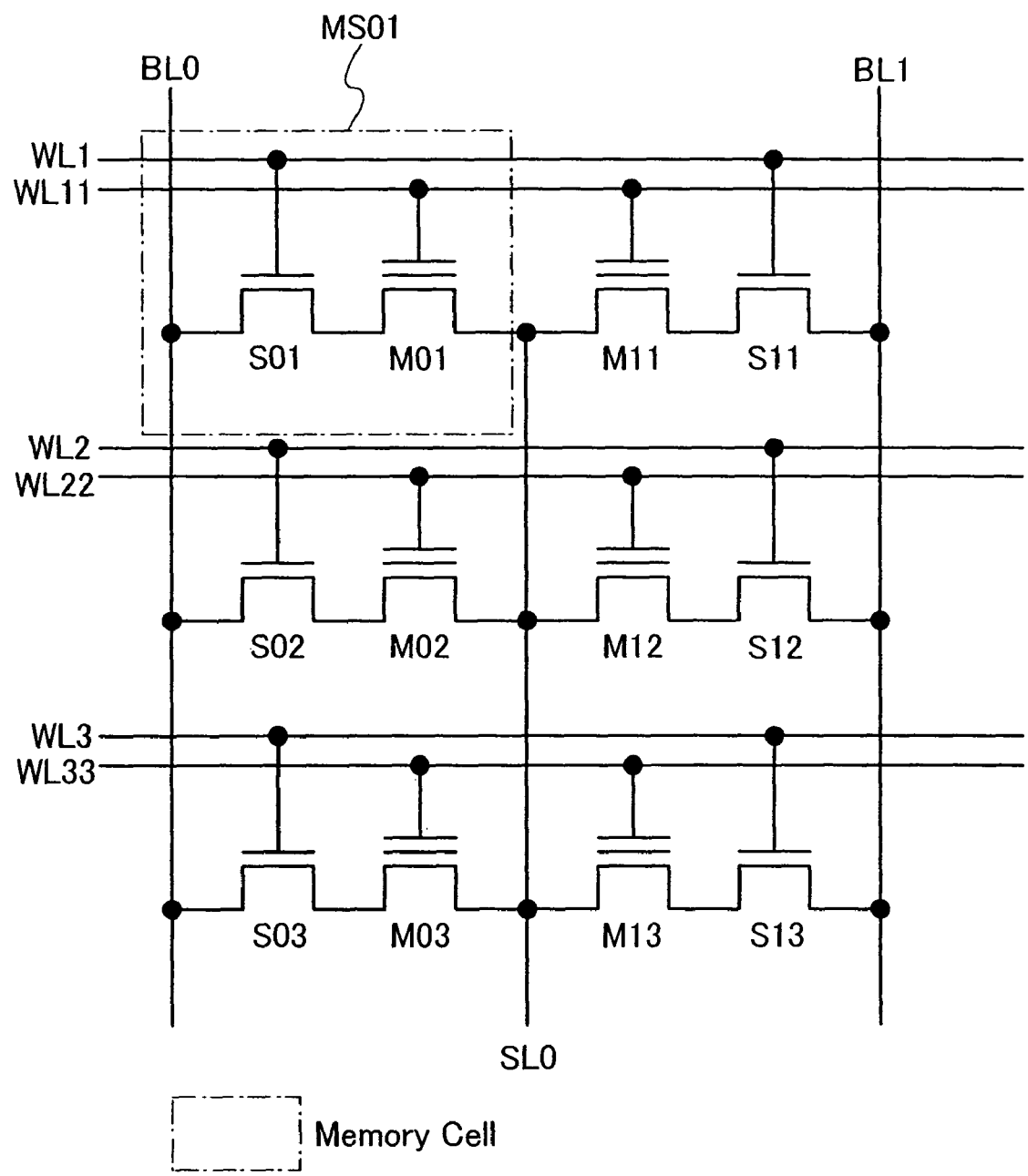
FIG. 8 is a diagram showing one example of an equivalent circuit of a nonvolatile memory cell array.

By using such a nonvolatile memory element, nonvolatile semiconductor memory devices having various modes can be obtained. FIG. 8 shows one example of an equivalent circuit of a nonvolatile memory cell array. A memory cell MS01 which stores 1-bit data includes a selecting transistor S01 and a nonvolatile memory element M01. The selecting transistor S01 is disposed in series between a bit line BL0 and the nonvolatile memory element M01, and a gate thereof is connected to a word line WL1. A gate of the nonvolatile memory element M01 is connected to a word line WL11. When data is written into the nonvolatile memory element M01, potentials of the word line WL1 and the bit line BL0 are set at H level while a potential of a bit line BL1 is set at L level, and a high voltage is applied to the word line WL11, so that charges (carriers) are accumulated in a floating gate electrode as described above. When data is to be erased, the potentials of the word line WL1 and the bit line BL0 may be set at H level while a high voltage of negative polarity may be applied to the word line WL11.

Figure 9:
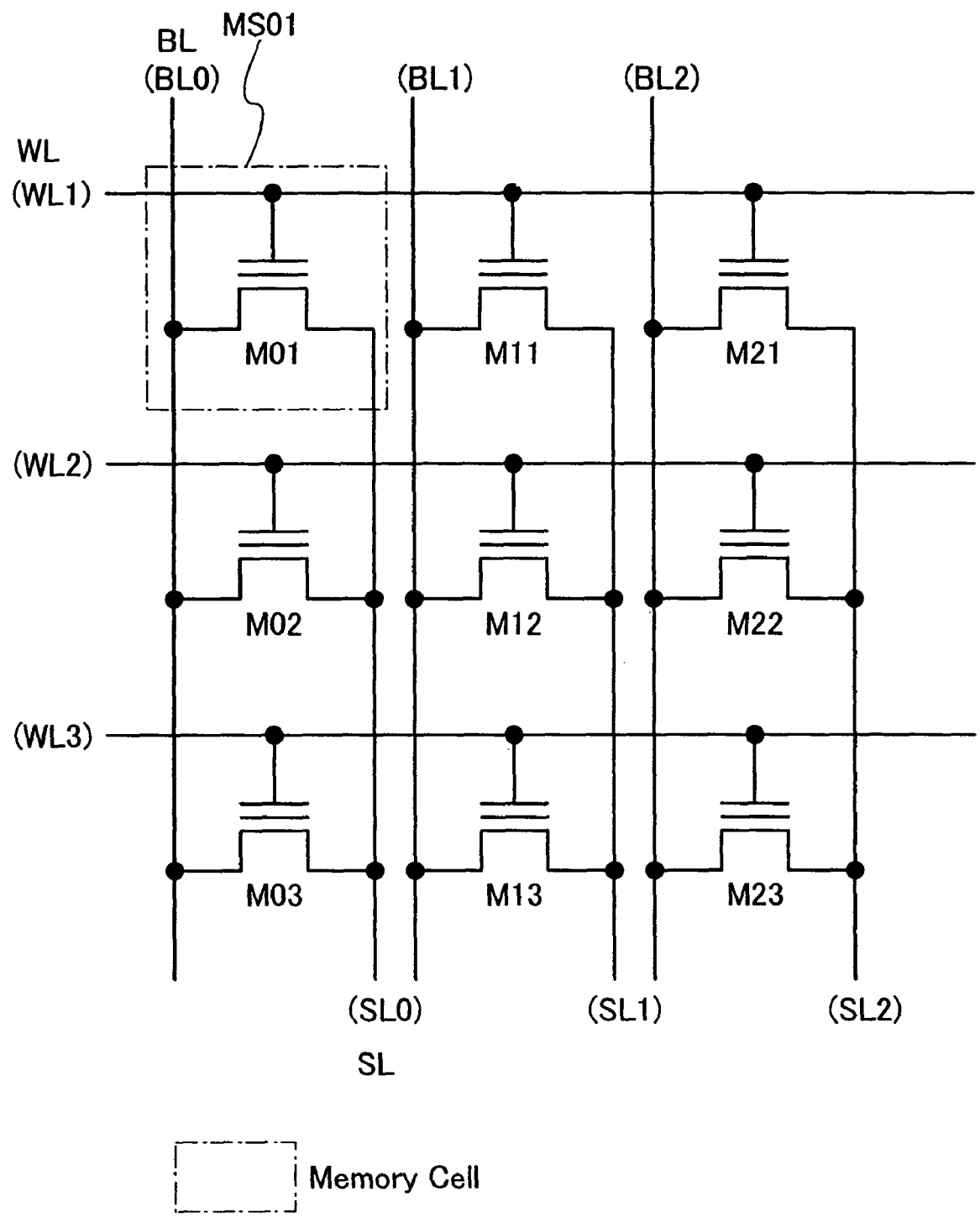
FIG. 9 is a diagram showing one example of an equivalent circuit of a NOR-type nonvolatile memory cell array.

FIG. 9 shows an equivalent circuit of a NOR type in which a nonvolatile memory element is directly connected to a bit line. In this memory cell array, word lines WL and bit lines BL are disposed so as to cross each other, and the nonvolatile memory element is disposed at each intersection. In the case of a NOR type, drains of the nonvolatile memory elements are connected to the bit lines BL. Sources of the nonvolatile memory elements are connected to the source lines SL in common.

Operations of the NOR type are, for example, as follows. When data is written, potentials of the source lines SL are set to 0 V, a high voltage is applied to a word line WL selected for data writing, and respective potentials corresponding to data "0" and data "1" are supplied to the bit lines BL For example, a H-level potential and a L-level potential corresponding to data "0" and data "1" respectively are supplied to the bit lines BL. In each nonvolatile memory element supplied with the H-level potential for writing data "0", hot electrons are generated near the drain, and are injected into the floating gate electrode. Such electron injection does not occur in the case of data "1".

In a memory cell to which data "0" is supplied, hot electrons are generated near the drain by a strong lateral direction electric field between the source and the drain, and are injected into the floating gate electrode. A state where the threshold voltage is increased by electron injection into the floating gate electrode is "0". In the case of data "1", hot electrons are not generated and the electrons are not injected into the floating gate electrode, whereby the state where the threshold voltage is low, namely an erasing state, is kept.

When data is to be erased, a positive voltage of approximately 10 V is applied to the source lines SL, and the bit lines BL are put in a floating state. Then, a high voltage of negative polarity is applied to the word lines WL (a high voltage of negative polarity is applied to each control gate), whereby electrons are extracted from each floating gate electrode. In this manner, the erasing state of data "1" can be obtained.

When data is to be read, whether or not current of the nonvolatile memory element has been drawn is judged by a sense amplifier connected to the bit lines BL, by setting a potentital of 0 V to the source lines SL and approximately 0.8 V to the bit lines BL, and supplying a reading voltage which is set at an intermediate value between threshold values of the data "0" and the data "1" to a selected word line WL.

Figure 10:
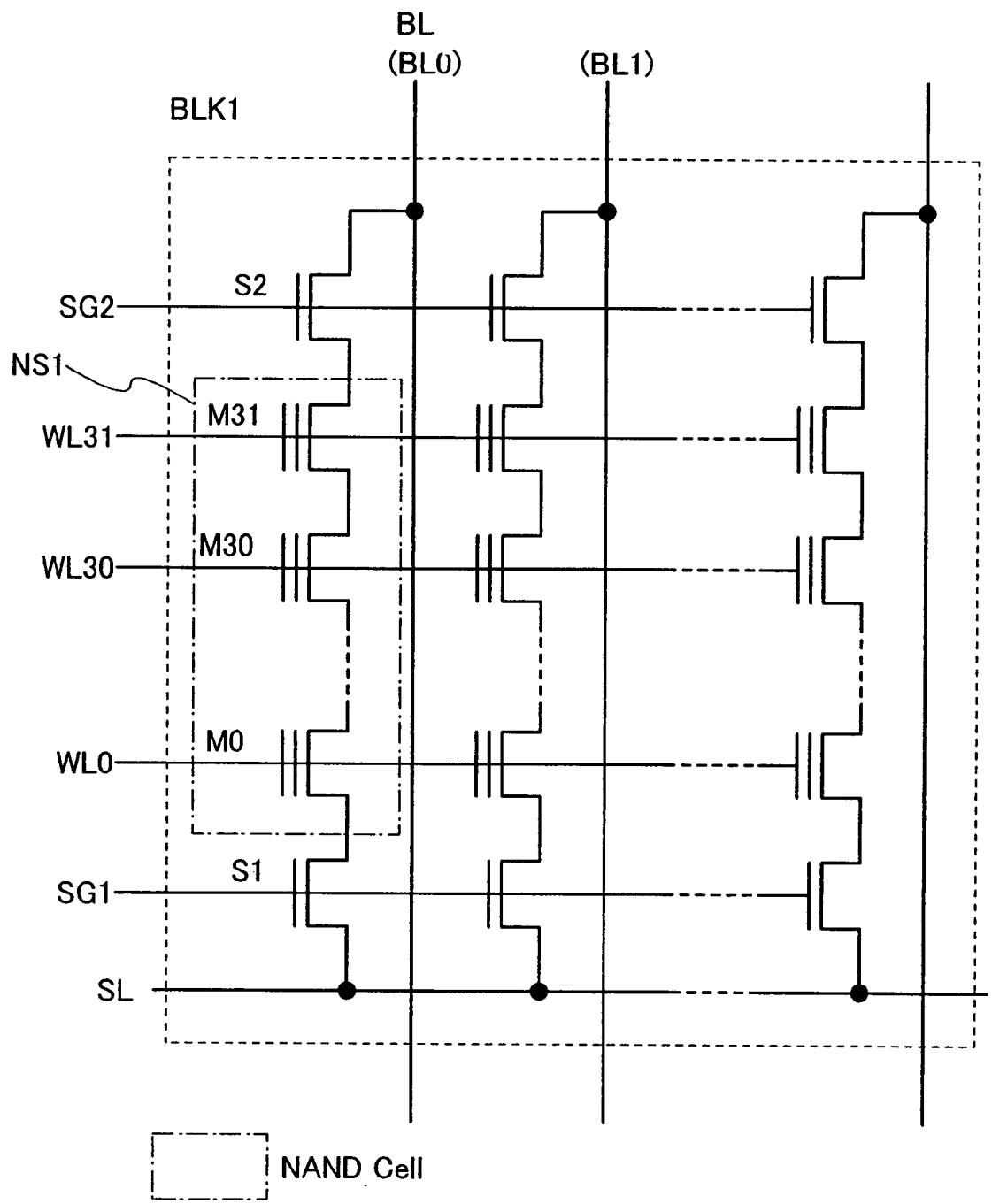
FIG. 10 is a diagram showing one example of an equivalent circuit of a NAND-type nonvolatile memory cell array.

FIG. 10 shows an equivalent circuit of a NAND type memory cell array. A NAND cell NS1 in which a plurality of nonvolatile memory elements are connected in series is connected to each bit line BL. A block BLK includes a plurality of NAND cells. The number of word lines in a block BLK1 shown in FIG. 10 is 32 (word lines WL0 to WL31). Nonvolatile memory elements disposed on the same row in the block BLK1 are connected to the word line corresponding to this row in common.

A writing operation is carried out after the NAND cell NS1 is turned to be in the erasing state, namely the threshold value of each nonvolatile memory element in the NAND cell NS1 is turned to be in a negative voltage state. Writing is performed sequentially from a nonvolatile memory element M0 on the source line SL side. The writing operation will be roughly described below, using writing into the nonvolatile memory element M0 as an example.

Writing is carried out after the NAND cell is turned to be in the erasing state, namely the threshold value of each memory cell in the NAND cell is turned to be in a negative voltage state. In the case of writing "0", as shown in FIG. 11A, Vcc (power source voltage), for example, is applied to a selection gate line SG2 to turn on a selecting transistor S2, and the potential of a bit line BL is set to 0 V (ground voltage). The potential of a selection gate line SG1 is set to 0 V to turn off a selecting transistor S1. Next, a high voltage Vpgm (approximately 20 V) is applied to the word line WL0 of a nonvolatile memory element M0 and an intermediate voltage Vpass (approximately 10 V) is applied to the other word lines. Since the voltage of the bit line BL0 is 0 V, the potential of the channel formation region of the selected nonvolatile memory element M0 is 0 V. Since the potential difference between the word line WL0 and the channel formation region is large, electrons are injected into the floating gate electrode of the nonvolatile memory element M0 by FN tunnel currents as described above. In this manner, the state in which the threshold voltage of the nonvolatile memory element M0 is positive (the state in which "0" is written) is obtained.

In the case of writing "1", as shown in FIG. 11B, the potential of the bit line BL is set to, for example, Vcc (power source voltage). Since the voltage of the selection gate line SG2 is Vcc, the selecting transistor S2 is cut off in the case of Vcc-Vth (Vth is the threshold voltage of the selecting transistor S2). Consequently, the channel formation region of the nonvolatile memory element M0 is put in a floating state. Next, a high voltage Vpgm (approximately 20 V) is applied to the word line WL0 while an intermediate voltage Vpass (approximately 10 V) is applied to the other word lines, so that the voltage of the channel formation region is increased from (Vcc-Vth) to, for example, approximately 8 V by capacitive coupling between each word line and each channel formation region. Since the voltage of the channel formation region is increased to such a high voltage, the potential difference between the word line WL0 and the channel formation region is small, unlike the case of writing "0". Therefore, electron injection by FN tunnel currents does not occur into the floating gate electrode of the nonvolatile memory element M0. In this manner, the state where the threshold voltage of the nonvolatile memory element M0 is negative (the state in which "1" is written) is kept.

In the case of performing an erasing operation, as shown in FIG. 12A, all the word lines included in the selected block are set to 0 V, and a high voltage of negative polarity (Vers) is applied to the p-well. The bit line BL and the source line SL are put in the floating state. As a result of this, electrons in the floating gate electrode are discharged into the semiconductor substrate by tunnel currents in all the memory cells in the block. Consequently, each threshold voltage of the memory cells is shifted in the negative direction.

Figure 13:
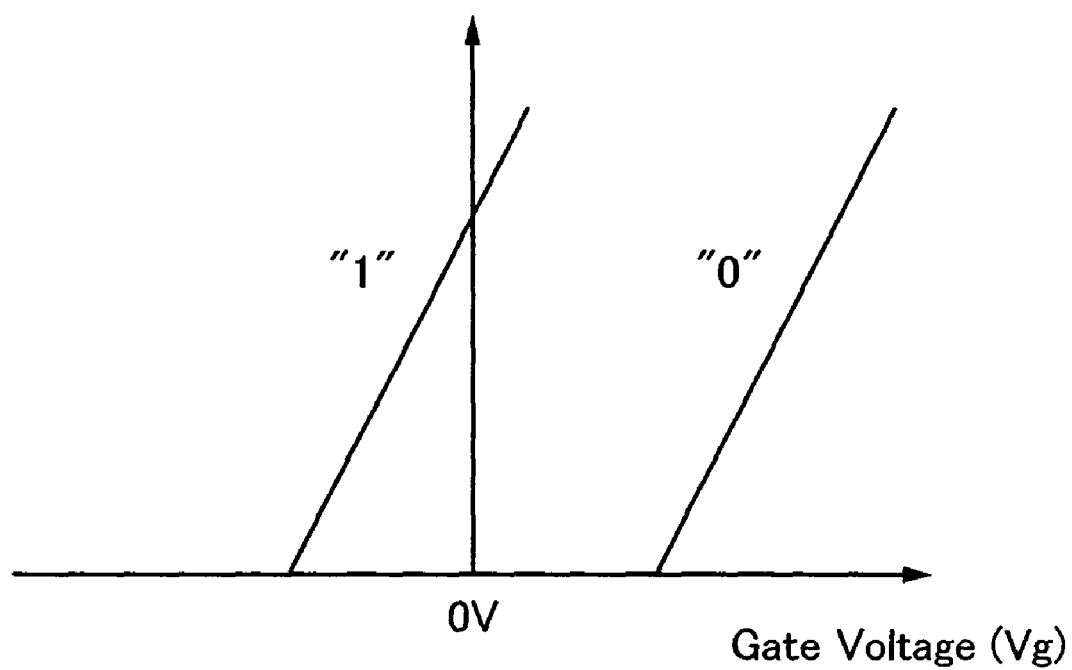
FIG. 13 is a graph showing changes of threshold voltage of a nonvolatile memory in the case of "0" where charges are accumulated and the case of "1" where charges are erased.

In a reading operation shown in FIG. 12B, the word line WL0 of the nonvolatile memory element M0 selected for reading is set to a voltage Vr (e.g., 0 V), and the word lines WL1 to WL31 of unselected memory cells and the selection gate lines SG1 and SG2 are set to a reading intermediate voltage Vread which is a little higher than the power source voltage. That is, as shown in FIG. 13, the memory elements other than the selected memory element function as transfer transistors. In this way, whether a current flows or not through the nonvolatile memory element M0 selected for reading is detected. That is, in the case where the data stored in the nonvolatile memory element M0 is "0", the bit line BL does not discharge electricity since the nonvolatile memory element M0 is off; whereas in the case where the data stored in the nonvolatile memory element M0 is "1", the bit line BL discharges electricity since the nonvolatile memory element M0 is on.

Figure 14:
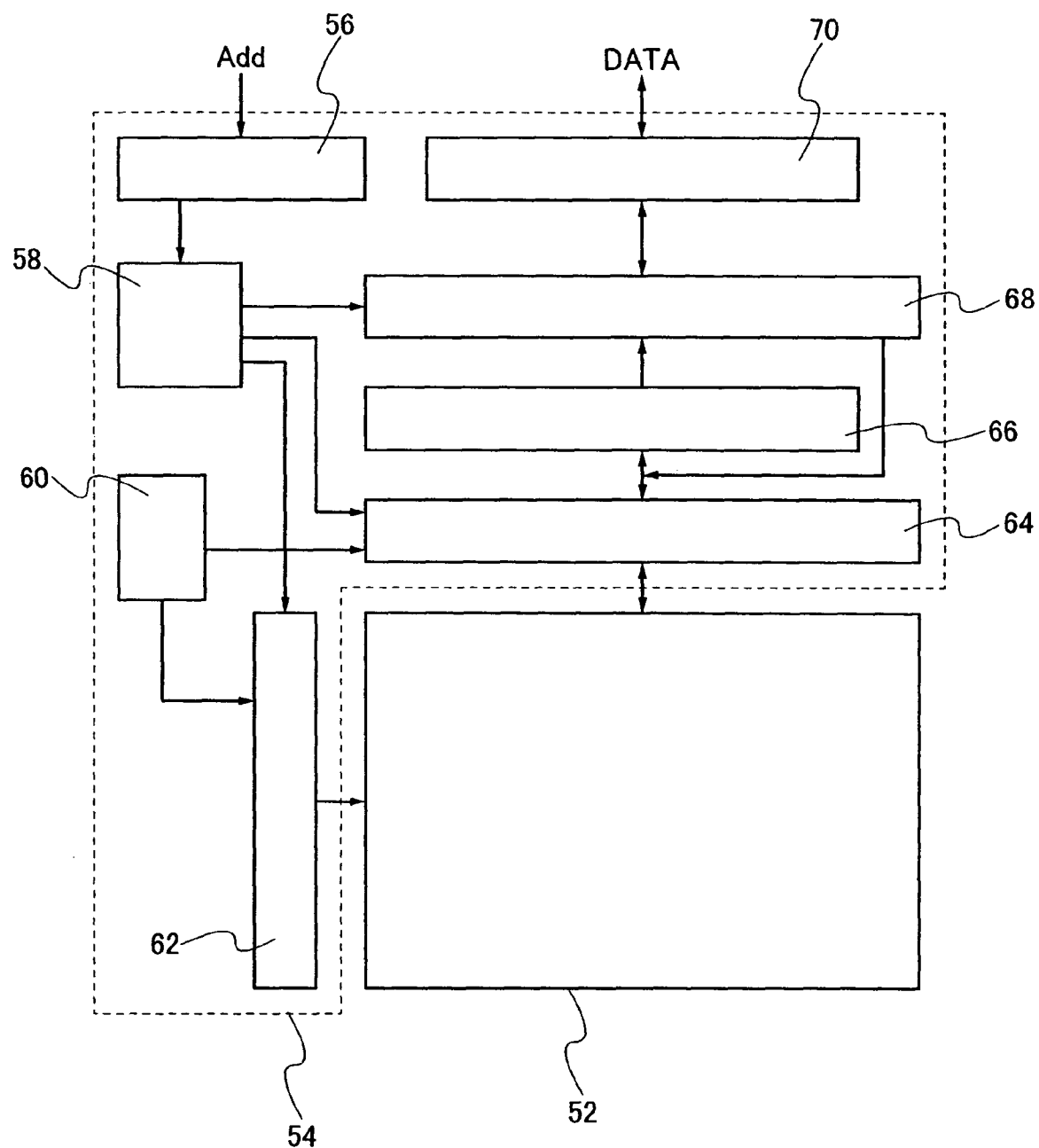
FIG. 14 is a diagram showing one example of a circuit block diagram of a nonvolatile semiconductor memory device.

FIG. 14 is one example of a circuit block diagram of a nonvolatile semiconductor memory device. In the nonvolatile semiconductor memory device, a memory cell array 52 and a peripheral circuit 54 are formed over the same substrate. The memory cell array 52 has the structure shown in FIG. 8, 9, or 10. A structure of the peripheral circuit 54 is as follows.

A row decoder 62 for selecting a word line and a column decoder 64 for selecting a bit line are provided around the memory cell array 52. An address is send to a control circuit 58 through an address buffer 56, and an internal row address signal and an internal column address signal are transferred to the row decoder 62 and the column decoder 64, respectively.

When data is written or erased, a potential obtained by boosting a power source potential is used. Therefore, a boosting circuit 60 controlled in accordance with an operating mode by the control circuit 58 is provided. Outputs of the boosting circuit 60 are supplied to the word lines WL and the bit lines BL through the row decoder 62 or the column decoder 64. Data outputted from the column decoder 64 is inputted to a sense amplifier 66. Data read from the sense amplifier 66 is stored in a data buffer 68, is accessed in random manner by control of the control circuit 58, and is output through a data input/output buffer 70. Writing data is stored in the data buffer 68 once through the data input/output buffer 70, and is transferred to the column decoder 64 by control of the control circuit 58.

Hereinafter, the above-described nonvolatile semiconductor memory device will be described in detail by way of Embodiments. In the structures of the present invention described below, the same elements are denoted by the same reference symbols in different drawings, and repeated description thereof may be omitted.

Embodiment 1

This embodiment will describe one example of a nonvolatile semiconductor memory device with reference to drawings. In the following description, in the nonvolatile semiconductor memory device, a nonvolatile memory element which constitutes a part of a memory portion and an element such as a transistor constituting a part of a logic portion, which is provided over the same substrate as the memory portion and performs control of the memory portion or the like, are formed at the same time.

First, a schematic diagram of the memory portion in the nonvolatile semiconductor memory device is shown in FIG. 8.

The memory portion described in this embodiment is provided with a plurality of memory cells each including a selecting transistor and a nonvolatile memory element. In FIG. 8, one memory cell includes a selecting transistor S01 and a nonvolatile memory element M01. Similarly, each memory cell includes a selecting transistor S02 and a nonvolatile memory element M02, a selecting transistor S03 and a nonvolatile memory element M03, a selecting transistor S11 and a nonvolatile memory element M11, a selecting transistor S12 and a nonvolatile memory element M12, or a selecting transistor S13 and a nonvolatile memory element M13.

A gate electrode of the selecting transistor S01 is connected to a word line WL1, one of a source and a drain thereof is connected to a bit line BL0, and the other of the source and the drain is connected to a source or a drain of the nonvolatile memory element M01. A gate electrode of the nonvolatile memory element M01 is connected to a word line WL11, one of the source and the drain is connected to the source or the drain of the selecting transistor S01, and the other of the source and the drain thereof is connected to a source line SL0.

Note that since a driving voltage of the selecting transistor provided in the memory portion is higher than that of a transistor provided in the logic portion, gate insulating films or the like of the transistor provided in the memory portion and the transistor provided in the logic portion are preferably formed with different thicknesses. For example, when the driving voltage is low and variations of the threshold voltage are required to be small, a transistor including a gate insulating film with a small thickness is preferably provided; whereas when the driving voltage is high and a high withstanding capability is required for the gate insulating film, a transistor including a gate insulating film with a large thickness is preferably provided.

Therefore, in this embodiment, the case where an insulating layer with a small thickness is formed for the transistor in the logic portion where the driving voltage is low and variations of the threshold voltage are required to be small whereas an insulating layer with a large thickness is formed for the transistor in the memory portion where the driving voltage is high and a high withstanding capability is required for the gate insulating layer will be described with reference to drawings. Note that in each of FIGS. 17A to 20C, portions between A and B and between C and D illustrate transistors provided in the logic portion, a portion between E and F illustrates a nonvolatile memory element provided in the memory portion, and a portion between G and H illustrates a transistor provided in the memory portion. In addition, although the case where the transistor provided in the portion between A and B is of a p-channel type, the transistors provided in the portions between C and D and between G and H are of an n-channel type, and carrier movement of the nonvolatile memory element provided in the portion between E and F is performed by electrons will be described in this embodiment, the nonvolatile semiconductor device of the present invention is not limited to this.

First, separated element regions 104, 106, 108, and 110 are formed in a substrate 100, and first insulating layers 112, 114, 116, and 118 are formed on respective surfaces of the regions 104, 106, 108, and 110. Then, a first conductive layer 120 and a second conductive layer 123 for forming a floating gate electrode in the nonvolatile memory element completed later are stacked so as to cover the first insulating layers 112, 114, 116, and 118 (see FIG. 17A). The regions 104, 106, 108, and 110 provided in the substrate 100 are separated from each other by an insulating layer 102 (also referred to as a field oxide film). In the example described in this embodiment, a single crystalline silicon substrate having n-type conductivity is used as the substrate 100, and p-wells 107 are provided in the regions 106, 108, and 110 in the substrate 100.

In addition, any semiconductor substrate can be used as the substrate 100. For example, a single crystalline silicon substrate having n-type or p-type conductivity, a compound semiconductor substrate (e.g., GaAs substrate, InP substrate, GaN substrate, SiC substrate, sapphire substrate, or ZnSe substrate), or an SOI (Silicon On Insulator) substrate manufactured by a bonding method or a SIMOX (Separation by IMplanted OXygen) method can be used.

For forming the separated element regions 104, 106, 108, and 110, a selective oxidation method (LOCOS (Local Oxidation of Silicon) method), a trench isolation method, or the like can be appropriately used.

Furthermore, the p-wells in the regions 106, 108, and 110 in the substrate 100 can be formed by selectively introducing an impurity element having p-type conductivity into the substrate 100. As the p-type impurity element, boron (B), aluminum (Al), gallium (Ga), or the like can be used.

Note that although an impurity element is not introduced into the region 104 since the semiconductor substrate having n-type conductivity is used as the substrate 100 in this embodiment, an n-well may be formed in the region 104 by introducing an impurity element having n-type conductivity. As the n-type impurity element, phosphorus (P), arsenic (As), or the like can be used. On the other hand, in the case where a semiconductor substrate having p-type conductivity is used, an n-well may be formed in the region 104 by introducing an impurity element having n-type conductivity and no impurity element may be introduced into the regions 106, 108, and 110.

The first insulating layers 112, 114, 116, and 118 can be formed of silicon oxide films by oxidizing respective surface of the regions 104, 106, 108, and 110 in the substrate 100 by performing heat treatment. Alternatively, the first insulating layers 112, 114, 116, and 118 can be formed as a stacked structure of a silicon film containing oxygen and nitrogen (silicon oxynitride film) by forming a silicon oxide film using a thermal oxidation method and then nitriding the surface of the silicon oxide film by nitridation treatment.

Further alternatively, the first insulating layers 112, 114, 116, and 118 may be formed using plasma treatment. For example, by performing oxidation treatment or nitridation treatment with high-density plasma treatment on the surfaces of the regions 104, 106, 108, and 110 in the substrate 100, silicon oxide ($SiO_x$) films or silicon nitride ($SiN_x$) films can be formed as the first insulating layers 112, 114, 116, and 118. Further, after oxidation treatment is performed on the surfaces of the regions 104, 106, 108, and 110 with high-density plasma treatment, nitridation treatment may be performed by performing high-density plasma treatment again. In this case, silicon oxide films are formed on the surfaces of the regions 104, 106, 108, and 110, and silicon oxynitride films are formed on the silicon oxide films, so that each of the first insulating layers 112, 114, 116, and 118 is a film in which the silicon oxide film and the silicon oxynitride film are stacked. Further alternatively, after silicon oxide films are formed on the surfaces of the regions 104, 106, 108, and 110 by a thermal oxidation method, oxidation treatment or nitridation treatment may be performed by high-density plasma treatment.

In this embodiment, each of the first insulating layers 112, 114, 116, and 118 is formed with a thickness of 1 nm to 10 nm inclusive, preferably 1 nm to 5 nm inclusive. For example, silicon oxide films each with a thickness of approximately 5 nm are formed on the surfaces of the regions 104, 106, 108, and 110 by performing oxidation treatment on the regions 104, 106, 108, and 110 by heat treatment. After that, nitridation treatment is performed by high-density plasma treatment, whereby nitrogen plasma treatment layers are formed on or adjacent to the surfaces of the silicon oxide films. Specifically, silicon oxide layers are first formed each with a thickness of 3 nm to 6 nm over the regions 104, 106, 108, and 110 by plasma treatment in oxygen atmosphere. Then, nitrogen plasma treatment layers with high nitrogen concentration are successively provided on or adjacent to the surfaces of the silicon oxide layers through plasma treatment in nitrogen atmosphere. In this embodiment, nitrogen at a rate of 20 atomic % to 50 atomic % is included in a region of the silicon oxide layers with a depth of approximately 1 nm from the surfaces through plasma treatment in nitrogen atmosphere. In the nitrogen plasma treatment layers, silicon containing oxygen and nitrogen (silicon oxynitride) is formed. In this case, the heat treatment and the nitridation treatment with high-density plasma treatment are preferably performed consecutively without exposure to air. By consecutively performing the heat treatment and the high-density plasma treatment, contaminant entry can be prevented and the production efficiency can be improved.

Note that when a treatment object (the substrate 100 in this embodiment) is oxidized by high-density plasma treatment, the treatment is performed in an atmosphere containing oxygen (e.g., in an atmosphere containing oxygen ($O_2$) or dinitrogen monoxide ($N_2O$) and a rare gas (containing at least one of He, Ne, Ar, Kr, and Xe), or in an atmosphere containing oxygen or dinitrogen monoxide and hydrogen ($H_2$) and a rare gas). When the treatment object is nitrided by high-density plasma treatment, the treatment is performed in an atmosphere containing nitrogen (e.g., in an atmosphere containing nitrogen ($N_2$) and a rare gas (containing at least one of He, Ne, Ar, Kr, and Xe); in an atmosphere containing nitrogen, hydrogen, and a rare gas; or in an atmosphere containing $NH_3$ and a rare gas).

As the rare gas, Ar can be used, for example. Further, a gas in which Ar and Kr are mixed may also be used. In the case where the high-density plasma treatment is performed in a rare gas atmosphere, the first insulating layers 112, 114, 116, and 118 may contain the rare gas (containing at least one of He, Ne, Ar, Kr, and Xe) used in the plasma treatment; in the case of using Ar, the first insulating layers 112, 114, 116, and 118 may contain Ar.

The high-density plasma treatment is performed in the above-described gas atmosphere with an electron density of $1\times10^{11}$ cm$^{-3}$ or more and at a plasma electron temperature of 1.5 eV or less. Specifically, the treatment is performed with an electron density of $1\times10^{11}$ cm$^{-3}$ to $1\times10^{13}$ cm$^{-3}$ inclusive and at a plasma electron temperature of 0.5 eV to 1.5 eV inclusive. Since the electron density of plasma is high and the electron temperature near the treatment object formed on the substrate 100 (the substrate 100 in this embodiment) is low, plasma damage to the treatment object can be prevented. In addition, since the electron density of plasma is as high as $1\times10^{11}$ cm$^{-3}$ or more, an oxide film or a nitride film formed by oxidizing or nitriding the treatment object using the plasma treatment is superior in uniformity of thickness or the like and is dense, compared to a film formed by a CVD method, a sputtering method, or the like. In addition, since the electron temperature of plasma is as low as 1.5 eV or less, oxidation or nitridation treatment can be performed at a lower temperature than that of conventional plasma treatment or a thermal oxidation method. As a frequency for generating plasma, a high frequency wave such as a microwave (e.g., 2.45 GHz) can be used.

In this embodiment, when oxidation treatment of the treatment object is performed by high-density plasma treatment, a mixed gas of oxygen ($O_2$), hydrogen ($H_2$), and argon (Ar) is introduced. As the mixed gas used here, oxygen, hydrogen, and argon may be introduced at rates of 0.1 sccm to 100 sccm, 0.1 sccm to 100 sccm, and 100 sccm to 5000 sccm, respectively. Note that the mixed gas is preferably introduced at the ratio of oxygen:hydrogen:argon=1:1:100. For example, it is preferable that oxygen, hydrogen, and argon may be introduced at 5 sccm, 5 sccm, and 500 sccm, respectively.

When nitridation treatment is performed by high-density plasma treatment, a mixed gas of nitrogen ($N_2$) and argon (Ar) is introduced. As the mixed gas used here, nitrogen and argon may be introduced at rates of 20 sccm to 2000 sccm and 100 sccm to 10000 sccm, respectively. For example, it is preferable that nitrogen and argon may be introduced at 200 sccm and 1000 sccm, respectively.

In this embodiment, the first insulating layer 116 which is formed over the region 108 provided in the memory portion in the substrate 100 functions as a tunnel insulating film in the nonvolatile memory element completed later. Therefore, as the thickness of the first insulating layer 116 is smaller, a larger amount of tunnel current flows and a higher-speed operation as a memory can be realized. In addition, as the thickness of the first insulating layer 116 is smaller, charge (carrier) accumulation in a floating gate electrode formed later can be performed with a lower voltage, so that power consumption of the nonvolatile semiconductor memory device can be reduced. Therefore, the first insulating layers 112, 114, 116, and 118 are preferably formed to be thin.

The first conductive layer 120 is formed of a film containing germanium (Ge) such as a film of germanium or a silicon-germanium alloy. In this embodiment, the first conductive layer 120 is formed using a film containing germanium as its main component with a thickness of 1 nm to 20 nm , preferably 1 nm to 10 nm, by a plasma CVD method in an atmosphere containing a germanium element (for example, $GeH_4$). Specifically, a germanium layer can be formed using a germane ($GeH_4$) gas diluted with hydrogen to 5% to 10%, by the application of a high-frequency power of 13.56 MHz to 60 MHz (for example, 27 MHz) with the substrate 100 heated at a temperature of 200° C. to 350° C.

The second conductive layer 123 is formed of a metal, or an alloy or a metal compound thereof. For example, a tantalum film is formed with a thickness of 1 nm to 20 nm, preferably 1 nm to 10 nm. Alternatively, the second conductive layer 123 can be formed using a refractory metal such as tungsten (W), titanium (Ti), molybdenum (Mo), chromium (Cr), or nickel (Ni). The alloy may be formed using the refractory metal and niobium (Nb), zirconium (Zr), cerium (Ce), thorium (Th), or hafnium (Hf). Alternatively, an oxide or a nitride of the refractory metal may be used. The metal nitride can be a tantalum nitride, a tungsten nitride, a molybdenum nitride, a titanium nitride, or the like. The metal oxide can be a tantalum oxide, a titanium oxide, a molybdenum oxide, or the like. The second conductive layer 123 can be formed by a sputtering method, an electron beam evaporation method, or the like. When the second conductive layer 123 is formed by a sputtering method, a target containing the subject metal may be used. In forming a metal oxide or a metal nitride, it may be formed by reactive sputtering or with the use of a target of the metal oxide or the metal nitride. When the second conductive layer 123 to be a second floating gate electrode layer 125 later is thus formed of a metal or the like, a first floating gate electrode layer 121 formed using the first conductive layer 120 can be stabilized.

In a case where a single crystalline silicon substrate is used as the substrate 100 and a film containing germanium which has a smaller energy gap than that of silicon is provided as the first conductive layer 120 for forming the floating gate electrode, over a certain region of the silicon substrate with the first insulating layer functioning as the tunnel insulating film interposed therebetween, a second barrier formed by the insulating layer with respect to charges (carriers) in the floating gate electrode is energetically higher than a first barrier formed by the insulating layer with respect to charges (carriers) in a certain region of the silicon substrate. Consequently, charges (carriers) can be injected easily from a certain region of the silicon substrate into the floating gate electrode, and charges (carriers) can be prevented from being discharged from the floating gate electrode. That is, in the case of operating as a memory, highly efficient writing with a low voltage can be performed and the charge holding property can be improved. Furthermore, in the substrate 100, the stacked structure including the first conductive layer 120 and the second conductive layer 123 formed over the region 108 provided in the memory portion functions as the floating gate electrode in the nonvolatile memory element completed later.

Next, the first insulating layers 112, 114, and 118, and the stacked structure including the first conductive layer 120 and the second conductive layer 123 formed over the regions 104, 106, and 110 in the substrate 100 are selectively removed so as to leave the first insulating layer 116 and the stacked structure including the first conductive layer 120 and the second conductive layer 123 formed over the region 108. In this embodiment, the selective removal of the first insulating layers 112, 114, and 118, and the stacked structure including the first conductive layer 120 and the second conductive layer 123 formed over the regions 104, 106, and 110 is performed by selective etching after covering, with a resist, the region 108, the first insulating layer 116, and the stacked structure including the first conductive layer 120 and the second conductive layer 123 provided in the memory portion in the substrate 100 (see FIG. 17B).

Next, a resist 122 is selectively formed so as to cover the regions 104, 106, and 110 in the substrate 100 and a part of the stacked structure including the first conductive layer 120 and the second conductive layer 123 formed over the region 108; and the other part of the stacked structure including the first conductive layer 120 and the second conductive layer 123 which is not covered with the resist 122 is etched to be selectively removed, so that the part of the stacked structure including the first conductive layer 120 and the second conductive layer 123 is left to form a stacked structure including the first floating gate electrode layer 121 and the second floating gate electrode layer 125 (see FIG. 17C).

Next, an impurity region is formed in a specific region of the region 110 in the substrate 100. In this embodiment, after the resist 122 is removed, a resist 124 is selectively formed so as to cover the regions 104, 106, and 108 and a part of the region 110, and an impurity element is introduced into the other part of the region 110 which is not covered with the resist 124; whereby impurity regions 126 are formed (see FIG. 18A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, phosphorus (P) is introduced as the impurity element into the region 110.

Next, a second insulating layer 128 is formed so as to cover the regions 104, 106, and 110 in the substrate 100 and the first insulating layer 116 and the staked structure including the first floating gate electrode layer 121 and the second floating gate electrode layer 125 which are formed over the region 108 (see FIG. 18B).

The second insulating layer 128 is formed of a single layer or a stacked layer using an insulating material such as a silicon oxide, a silicon nitride, a silicon oxynitride ($SiO_xN_y$, (x>y)), or a silicon nitride oxide ($SiN_xO_y$(x>y)) by using a CVD method, a sputtering method, or the like. For example, when forming the second insulating layer 128 of a single layer, a silicon oxynitride film or a silicon nitride oxide film is formed with a thickness of 5 nm to 50 nm inclusive by a CVD method. Alternatively, when forming the second insulating layer 128 with a three-layer structure, a silicon oxynitride film is formed as a first-layer insulating layer, a silicon nitride film is formed as a second-layer insulating layer, and a silicon oxynitride film is formed as a third-layer insulating layer. Further alternatively, an oxide or a nitride of germanium may be used for the second insulating layer 128.

Note that the second insulating layer 128 formed over the region 108 functions as a control insulating layer in the nonvolatile memory element completed later, and the second insulating layer 128 formed over the region 110 functions as a gate insulating film in the transistor completed later.

Next, a resist 130 is selectively formed so as to cover the second insulating layer 128 formed over the regions 108 and 110, and the second insulating layer 128 formed over the regions 104 and 106 is selectively removed (see FIG. 18C).

Next, third insulating layers 132 and 134 are formed so as to cover the regions 104 and 106, respectively (see FIG. 19A).

The third insulating layers 132 and 134 are formed by any method described as the method of forming the above-described first insulating layers 112, 114, 116, and 118. For example, the third insulating layers 132 and 134 can be formed of silicon oxide films by oxidizing respective surfaces of the regions 104 and 106 in the substrate 100 by performing heat treatment. Alternatively, the third insulating layers 132 and 134 can be formed with a stacked structure with a silicon film containing oxygen and nitrogen (silicon oxynitride film)

by forming the silicon oxide films by a thermal oxidation method and then nitriding the surface of the silicon oxide film by nitridation treatment.

Further alternatively, as described above, the third insulating layers 132 and 134 can be formed using plasma treatment. For example, by performing oxidation treatment or nitridation treatment with high-density plasma treatment on the surfaces of the regions 104 and 106 in the substrate 100, silicon oxide ($SiO_x$) films or silicon nitride ($SiN_x$) films can be formed as the third insulating layers 132 and 134. Alternatively, after oxidation treatment is performed on the surfaces of the regions 104 and 106 by high-density plasma treatment, nitridation treatment may be performed by performing high-density plasma treatment again. In this case, silicon oxide films are formed on the surfaces of the regions 104 and 106, and silicon oxynitride films are formed on the silicon oxide films, so that each of the third insulating layers 132 and 134 is a film in which the silicon oxide film and the silicon oxynitride film are stacked. Further alternatively, after silicon oxide films are formed on the surfaces of the regions 104 and 106 by a thermal oxidation method, oxidation treatment or nitridation treatment may be performed by high-density plasma treatment.

Note that in forming the third insulating layers 132 and 134 by a thermal oxidation method or high-density plasma treatment, an oxide film or an oxynitride film may also be formed on the surface of the second insulating layer 128 formed over the regions 108 and 110 in the substrate 100. The third insulating layers 132 and 134 formed over the regions 104 and 106 in the substrate 100 function as gate insulating films in the transistors completed later.

Next, a conductive film is formed so as to cover the third insulating layers 132 and 134 formed over the regions 104 and 106 and the second insulating layer 128 formed over the regions 108 and 110 (see FIG. 19B). In this embodiment, a conductive film 136 and a conductive film 138 are stacked sequentially as the conductive film. Needless to say, the conductive film may be formed with a single-layer structure or a staked-layer structure including three or more layers.

The conductive films 136 and 138 can be formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing the element as a main component. Alternatively, a metal nitride film obtained by nitriding the element can be used. Further alternatively, a semiconductor material typified by polycrystalline silicon doped with an impurity element such as phosphorus can be used.

In this embodiment, the conductive film is formed with a stacked structure by forming the conductive film 136 using tantalum nitride and forming the conductive film 138 using tungsten thereover. Alternatively, a single-layer or stacked-layer film of a tungsten nitride, a molybdenum nitride, or a titanium nitride can be used as the conductive film 136, and a single-layer or stacked-layer film of tantalum, molybdenum, or titanium can be used as the conductive film 138.

Next, by selectively etching and removing the conductive films 136 and 138 which are stacked, the conductive films 136 and 138 are partially left over the regions 104, 106, 108, and 110 to form conductive films 140, 142, 144, and 146 each functioning as a gate electrode (see FIG. 19C). Note that the conductive film 144 which is formed over the region 108 provided in the memory portion in the substrate 100 functions as a control gate electrode in the nonvolatile memory element completed later. In addition, the conductive films 140, 142, and 146 function as gate electrodes in the transistors completed later.

Next, a resist 148 is selectively formed so as to cover the region 104, and an impurity element is introduced into the regions 106, 108, and 110 by using the resist 148, and the conductive films 142, 144, and 146 as masks, thereby forming impurity regions (see FIG. 20A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, phosphorus (P) is used as the impurity element.

In FIG. 20A, by introducing the impurity element, high-concentration impurity regions 152 forming source and drain regions and a channel formation region 150 are formed in the region 106. In the region 108, high-concentration impurity regions 156 forming source and drain regions, low-concentration impurity regions 158 forming LDD regions, and a channel formation region 154 are formed. In the region 110, high-concentration impurity regions 162 forming source and drain regions, low-concentration impurity regions 164 forming LDD regions, and a channel formation region 160 are formed.

The low-concentration impurity regions 158 in the region 108 are formed by the introduction of the impurity element shown in FIG. 20A passed through the stacked structure including the first floating gate electrode layer 121 and the second floating gate electrode layer 125 functioning as the floating gate electrode. Therefore, in the region 108, the channel formation region 154 is formed in a region overlapped with both the conductive film 144 and the stacked structure including the first floating gate electrode layer 121 and the second floating gate electrode layer 125, each of the low-concentration impurity regions 158 is formed in a region overlapped with the stacked structure including the first floating gate electrode layer 121 and the second floating gate electrode layer 125 while not overlapped with the conductive film 144, and each of the high-concentration impurity regions 156 is formed in a region overlapped with neither the stacked structure including the first floating gate electrode layer 121 and the second floating gate electrode layer 125 nor the conductive film 144.

Next, a resist 166 is selectively formed so as to cover the regions 106, 108, and 110, and an impurity element is introduced into the region 104 by using the resist 166 and the conductive film 140 as masks, thereby forming impurity regions (see FIG. 20B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a conductivity type which is different from that of the impurity element introduced into the regions 106, 108, and 110 in FIG. 20A (e.g., boron (B)) is introduced. As a result, high-concentration impurity regions 170 forming source and drain regions, and a channel formation region 168 are formed in the region 104.

Next, an insulating layer 172 is formed so as to cover the second insulating layer 128, the third insulating layers 132 and 134, and the conductive films 140, 142, 144, and 146; and over the insulating layer 172, a conductive film 174 is formed so as to be electrically connected to the high-concentration impurity regions 170, 152, 156, and 162 formed in the regions 104, 106, 108, and 110, respectively (see FIG. 20C).

The insulating layer 172 can be formed with a single-layer or stacked-layer structure of an insulating layer containing oxygen or nitrogen such as a layer of a silicon oxide ($SiO_x$), a silicon nitride ($SiN_x$), a silicon oxynitride ($SiO_xN_y(x>y)$), or a silicon nitride oxide ($SiN_xO_y(x>y)$); a film containing carbon such as a film of DLC (Diamond-Like Carbon); an organic material such as epoxy, polyimide, polyamide, polyvinyl phenol, benzocyclobutene, or acrylic; or a siloxane material such as a siloxane resin, by a CVD method, a sputtering method, or the like. Note that the siloxane material corresponds to a material having a Si—O—Si bond. Siloxane has a skeleton structure containing a bond of silicon (Si) and oxygen (O). As a substituent, an organic group containing at least hydrogen (e.g., an alkyl group or aromatic hydrocarbon) can be used. As a substituent, a fluoro group may also be used. Alternatively, as a substituent, an organic group containing at least hydrogen and a fluoro group may be used.

The conductive film 174 is formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), and the like, or an alloy material or a compound material containing the element as a main component by a CVD method, a sputtering method, or the like. The alloy material containing aluminum as a main component corresponds to: a material containing aluminum as a main component and nickel; or a material containing aluminum as a main component, nickel and one or both of carbon and silicon, for example. The conductive film 174 may be, for example, formed with a stacked structure of a barrier film, an aluminum-silicon (Al—Si) film, and a barrier film; or a stacked structure of a barrier film, an aluminum-silicon (Al—Si) film, a titanium nitride (TiN) film, and a barrier film. Note that the barrier film corresponds to a thin film of titanium, a nitride of titanium, molybdenum, or a nitride of molybdenum. Aluminum or aluminum-silicon which is low in resistance value and cost is preferable as the material for the conductive film 174. In addition, by providing upper and lower barrier layers, hillock generation in aluminum or aluminum-silicon can be prevented. Further, by forming a barrier film of titanium which is a highly-reducible element, a thin natural oxide film which may be formed on a semiconductor substrate can be reduced so that good contact with the semiconductor substrate can be obtained.

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied in writing and erasing operations of a nonvolatile memory element. In the nonvolatile memory element, charge injection from the semiconductor substrate into the floating gate electrode can be facilitated, and charges are prevented from being discharged from the floating gate electrode. That is, in the case of operating as a memory, highly efficient writing with a low voltage can be performed and the charge holding property can be improved. This embodiment enables a nonvolatile semiconductor memory device having such excellent effects to be manufactured by consecutive steps.

This embodiment can be implemented combining with any of the embodiment mode and the other embodiments described in this specification.

Embodiment 2

This embodiment will describe a manufacturing method of a nonvolatile semiconductor memory device, which is different from Embodiment 1, with reference to drawings. The same elements as those in Embodiment 1 are denoted by the same reference symbols, and repeated description thereof will be omitted. Note that in FIGS. 21A to 23B, portions between A and B and between C and D illustrate transistors provided in a logic portion, a portion between E and F illustrates a nonvolatile memory element provided in a memory portion, and a portion between G and H illustrates a transistor provided in the memory portion. In addition, although the case where the transistor provided in the portion between A and B is of a p-channel type, the transistors provided in the portions between C and D and between G and H are of an n-channel type, and carrier movement of the nonvolatile memory element provided in the portion between E and F is performed by electrons will be described in this embodiment, the nonvolatile semiconductor device of the present invention is not limited to this.

First, after the state of FIG. 17C is obtained through similar formation steps to those described in Embodiment 1, the resist 122 is removed, and the second insulating layer 128 is formed so as to cover the regions 104, 106, and 110, and the first insulating layer 116 and the stacked structure including the first floating gate electrode layer 121 and the second floating gate electrode layer 125 functioning as a floating gate electrode which are formed over the region 108 (see FIG. 21A).

Next, the resist 130 is selectively formed so as to cover the second insulating layer 128 formed over the regions 108 and 110, and the second insulating layer 128 formed over the regions 104 and 106 is selectively removed (see FIG. 21B).

Next, the third insulating layers 132 and 134 are formed so as to cover the regions 104 and 106, respectively (see FIG. 21C).

Figures 22A, 22B, 22C:
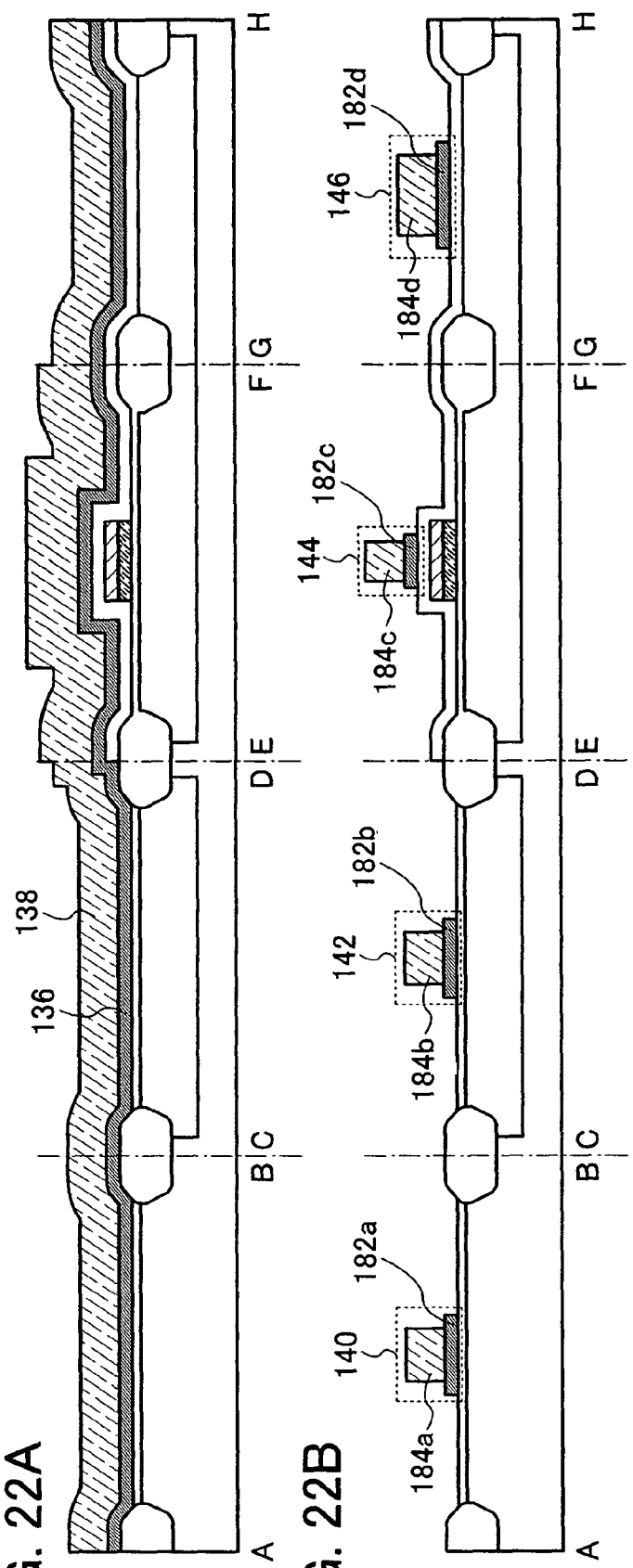
FIGS. 22A to 22C are diagrams showing one example of a manufacturing method of a nonvolatile semiconductor memory device of the present invention.

Next, a conductive film is formed so as to cover the third insulating layers 132 and 134 formed over the regions 104 and 106 and the second insulating layer 128 formed over the regions 108 and 110 (see FIG. 22A). In this embodiment, the conductive film 136 and the conductive film 138 are stacked sequentially as the conductive film. Needless to say, the conductive film may be formed with a single-layer structure or a staked-layer structure including three or more layers.

Next, by selectively etching and removing the conductive films 136 and 138 which are stacked, the conductive films 136 and 138 are partially left over the regions 104, 106, 108, and 110 to form the conductive films 140, 142, 144, and 146 each functioning as a gate electrode (see FIG. 22B). Note that the conductive film 140 includes stacked conductive films 182a and 184a which are the remaining part of the conductive films 136 and 138. Further, in this embodiment, in the conductive film 140, the width (width in a roughly parallel direction to a direction of carrier flow in the channel formation region (direction connecting the source region to the drain region)) of the conductive film 182a formed in a lower position is larger than the width of the conductive film 184a. Similarly, the conductive film 142 is formed by stacking a conductive film 182b and a conductive film 184b having a smaller width than that of the conductive film 182b sequentially, the conductive film 144 is formed by stacking a conductive film 182c and a conductive film 184c having a smaller width than that of the conductive film 182c sequentially, and the conductive film 146 is formed by stacking a conductive film 182d and a conductive film 184d having a smaller width than that of the conductive film 182d sequentially.

Next, the resist 148 is selectively formed so as to cover the region 104, and an impurity element is introduced into the regions 106, 108, and 110 by using the resist 148 and the conductive films 142, 144, and 146 as masks, thereby forming impurity regions (see FIG. 22C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, phosphorus (P) is used as the impurity element.

In FIG. 22C, by introducing the impurity element, the high-concentration impurity regions 152 forming source and drain regions, low-concentration impurity regions 151 forming LDD regions, and the channel formation region 150 are formed in the region 106. In the region 108, the high-concentration impurity regions 156 forming source and drain regions, the low-concentration impurity regions 158 forming LDD regions, and the channel formation region 154 are formed. In the region 110, the high-concentration impurity regions 162 forming source and drain regions, the low-concentration impurity regions 164 forming LDD regions, and the channel formation region 160 are formed.

The low-concentration impurity regions 151 in the region 106 are formed by the introduction of the impurity element shown in FIG. 22C passed through the conductive film 182b. Therefore, in the region 106, the channel formation region 150 is formed in a region overlapped with both the conductive film 182b and the conductive film 184b, each of the low-concentration impurity regions 151 is formed in a region overlapped with the conductive film 182b while not overlapped with the conductive film 184b, and each of the high-concentration impurity regions 152 is formed in a region overlapped with neither the conductive film 182b nor the conductive film 184b.

The low-concentration impurity regions 158 in the region 108 are formed by the introduction of the impurity element shown in FIG. 22C passed through the stacked structure including the first floating gate electrode layer 121 and the second floating gate electrode layer 125. Therefore, in the region 108, the channel formation region 154 is formed in a region overlapped with both the conductive film 182c and the stacked structure including the first floating gate electrode layer 121 and the second floating gate electrode layer 125, each of the low-concentration impurity regions 158 is formed in a region overlapped with the stacked structure including the first floating gate electrode layer 121 and the second floating gate electrode layer 125 while not overlapped with the conductive film 182c, and each of the high-concentration impurity regions 156 is formed in a region overlapped with neither the stacked structure including the first floating gate electrode layer 121 and the second floating gate electrode layer 125 nor the conductive film 182c. Note that in the case where the conductive film 182c is formed with a small thickness, in the region 108, a low-concentration impurity region with a concentration which is equal to or lower than that of the low-concentration impurity regions 158 may be formed in a region overlapped with both the conductive film 182c and the stacked structure including the first floating gate electrode layer 121 and the second floating gate electrode layer 125 while not overlapped with the conductive film 184c.

The low-concentration impurity regions 164 in the region 110 are formed by the introduction of the impurity element shown in FIG. 22C passed through the conductive film 182d. Therefore, in the region 110, the channel formation region 160 is formed in a region overlapped with both the conductive film 182d and the conductive film 184d, each of the low-concentration impurity regions 164 is formed in a region overlapped with the conductive film 182d while not overlapped with the conductive film 184d, and each of the high-concentration impurity regions 162 is formed in a region overlapped with neither the conductive film 182d nor the conductive film 184d.

Figures 23A, 23B:
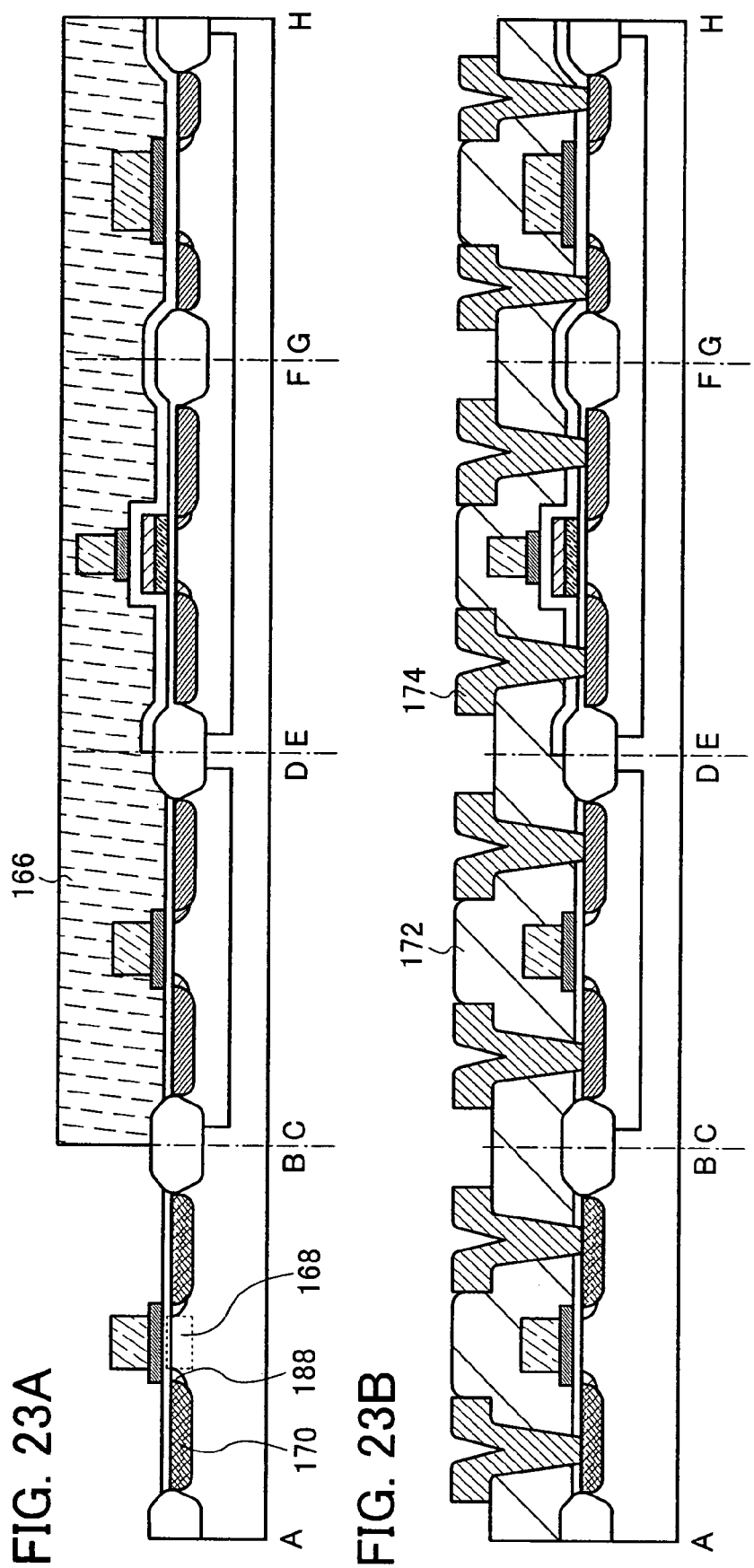
FIGS. 23A and 23B are diagrams showing one example of a manufacturing method of a nonvolatile semiconductor memory device of the present invention.

Next, the resist 166 is selectively formed so as to cover the regions 106, 108, and 110, and an impurity element is introduced into the region 104 by using the resist 166 and the conductive film 140 as masks, thereby forming impurity regions (see FIG. 23A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a conductivity type which is different from that of the impurity element introduced into the regions 106, 108, and 110 in FIG. 22C (e.g., boron (B)) is introduced. As a result, the high-concentration impurity regions 170 forming source and drain regions, low-concentration impurity regions 188 forming LDD regions, and the channel formation region 168 are formed in the region 104.

The low-concentration impurity regions 188 in the region 104 are formed by the introduction of the impurity element shown in FIG. 22C passed through the conductive film 182a. Therefore, in the region 104, the channel formation region 168 is formed in a region overlapped with both the conductive film 182a and the conductive film 184a, each of the low-concentration impurity regions 188 is formed in a region overlapped with the conductive film 182a while not overlapped with the conductive film 184a, and each of the high-concentration impurity regions 170 is formed in a region overlapped with neither the conductive film 182a nor the conductive film 184a.

Next, the insulating layer 172 is formed so as to cover the second insulating layer 128, the third insulating layers 132 and 134, and the conductive films 140, 142, 144, and 146; and over the insulating layer 172, the conductive film 174 is formed so as to be electrically connected to the high-concentration impurity regions 170, 152, 156, and 162 formed in the regions 104, 106, 108, and 110, respectively (see FIG. 23B).

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied in writing and erasing operations of a nonvolatile memory element. In the nonvolatile memory element, charge injection from the semiconductor substrate into the floating gate electrode cam be facilitated, and charges are prevented from being discharged from the floating gate electrode. That is, in the case of operating as a memory, highly efficient writing with a low voltage can be performed and the charge holding property can be improved. This embodiment enables a nonvolatile semiconductor memory device having such excellent effects to be manufactured by consecutive steps.

This embodiment can be implemented combining with any of the embodiment mode and the other embodiments described in this specification.

Embodiment 3

This embodiment will describe a manufacturing method of a nonvolatile semiconductor memory device, which is different from Embodiments 1 and 2, with reference to drawings. The same elements as those in Embodiments 1 and 2 are denoted by the same reference symbols, and repeated description thereof will be omitted. Note that in FIGS. 27A to 29C, portions between A and B and between C and D illustrate transistors provided in a logic portion, a portion between E and F illustrates a nonvolatile memory element provided in a memory portion, and a portion between G and H illustrates a transistor provided in the memory portion. In addition, although the case where the transistor provided in the portion between A and B is of a p-channel type, the transistors provided in the portions between C and D and between G and H are of an n-channel type, and carrier movement of the nonvolatile memory element provided in the portion between E and F is performed by electrons will be described in this embodiment, the nonvolatile semiconductor device of the present invention is not limited to this.

Figure 27A:
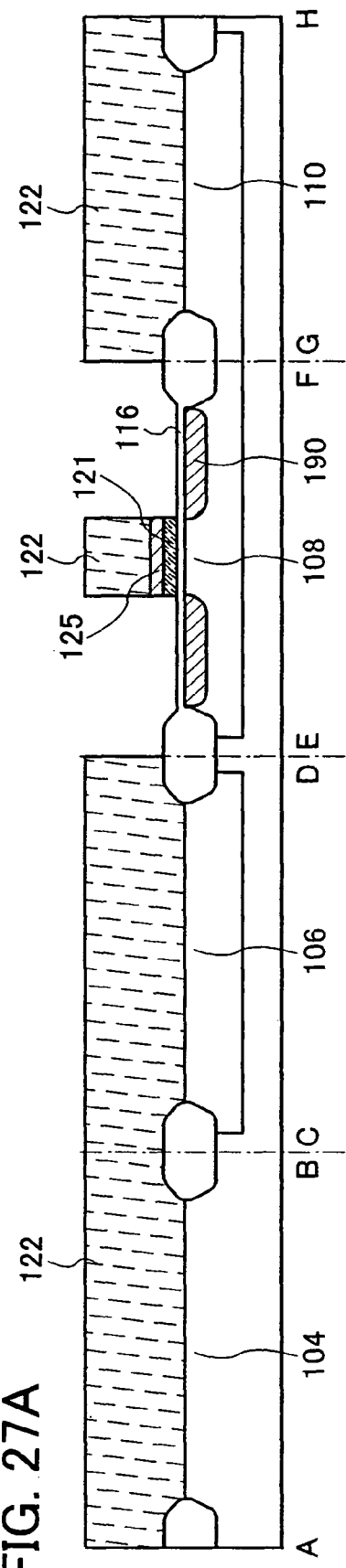
FIGS. 27A to 27C are diagrams showing one example of a manufacturing method of a nonvolatile semiconductor memory device of the present invention.

First, after the state of FIG. 17C is obtained through similar formation steps to those described in Embodiment 1, an impurity element is introduced into the region 108 by using the resist 122 as a mask, thereby forming impurity regions 190 (see FIG. 27A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is introduced into the region 108.

Figure 27B:
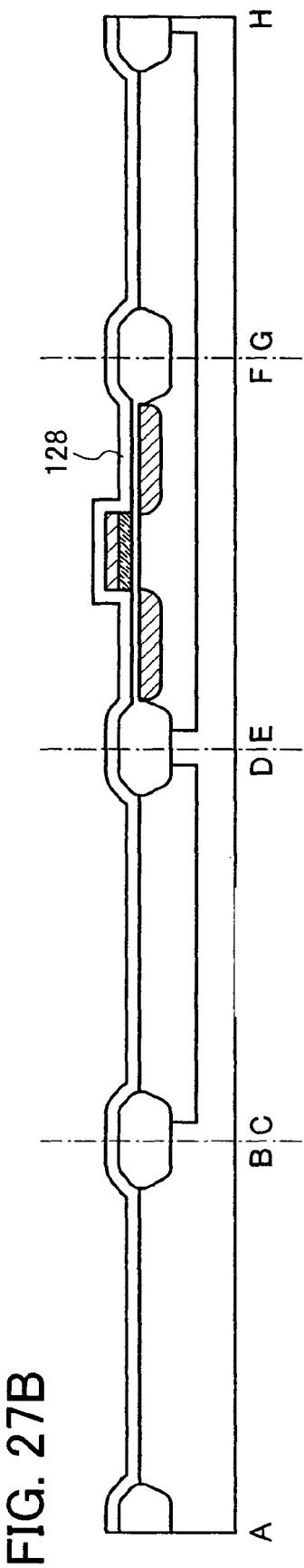

Next, the second insulating layer 128 is formed so as to cover the regions 104, 106, and 110, and the first insulating layer 116 and the stacked structure including the first floating gate electrode layer 121 and the second floating gate electrode layer 125 which are formed over the region 108 (see FIG. 27B).

Figure 27C:
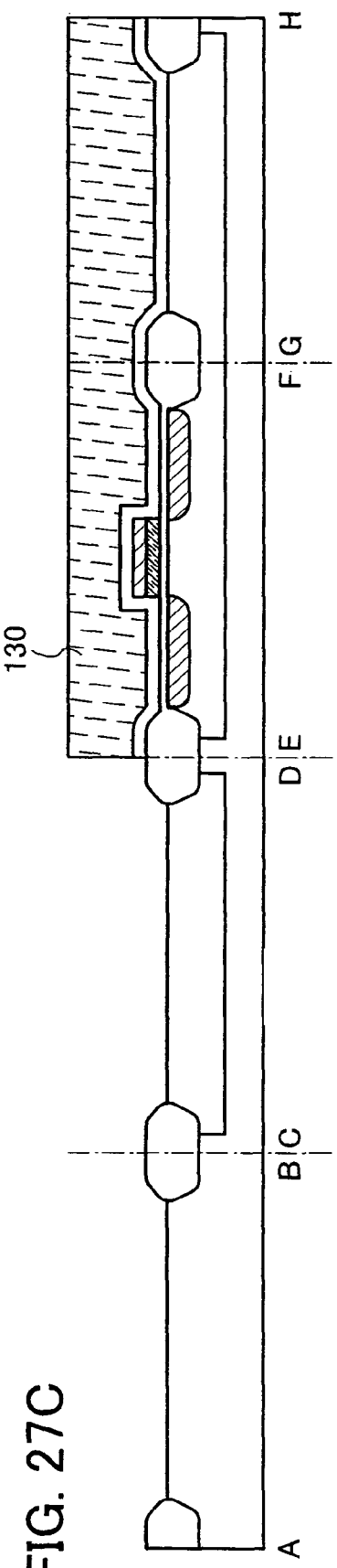

Next, the resist 130 is selectively formed so as to cover the second insulating layer 128 formed over the regions 108 and 110, and the second insulating layer 128 formed over the regions 104 and 106 is selectively removed (see FIG. 27C).

Next, the third insulating layers 132 and 134 are formed so as to cover the regions 104 and 106, respectively (see FIG. 28A).

Next, the conductive film is formed so as to cover the third insulating layers 132 and 134 formed over the regions 104 and 106 and the second insulating layer 128 formed over the regions 108 and 110 (see FIG. 28B). In this embodiment, the conductive film 136 and the conductive film 138 are stacked sequentially as the conductive film. Needless to say, the conductive film may be formed with a single-layer structure or a staked-layer structure including three or more layers.

Next, by selectively etching and removing the conductive films 136 and 138 which are stacked, the conductive films 136 and 138 are partially left over the regions 104, 106, 108, and 110 to form the conductive films 140, 142, 144, and 146 each functioning as a gate electrode (see FIG. 28C).

Note that, in this embodiment, the width of the conductive film 144 formed over the region 108 (width in a roughly parallel direction to a direction of carrier flow in the channel) is larger than the width of the stacked structure including the first floating gate electrode layer 121 and the second floating gate electrode layer 125.

Figure 29A:
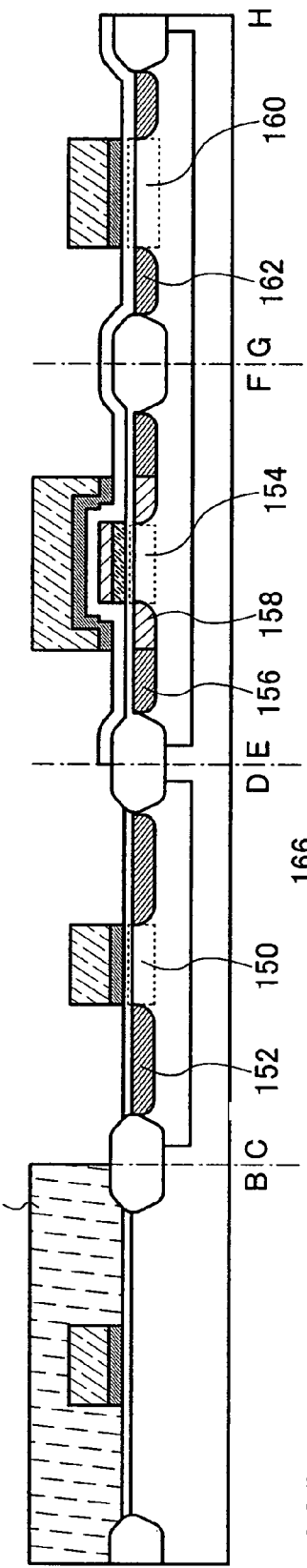
FIGS. 29A to 29C are diagrams showing one example of a manufacturing method of a nonvolatile semiconductor memory device of the present invention.

Next, the resist 148 is selectively formed so as to cover the region 104, and an impurity element is introduced into the regions 106, 108, and 110 by using the resist 148, and the conductive films 142, 144, and 146 as masks, thereby forming impurity regions (see FIG. 29A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, phosphorus (P) is used as the impurity element.

In FIG. 29A, by introducing the impurity element, the high-concentration impurity regions 152 forming source and drain regions and the channel formation region 150 are formed in the region 106. In the region 108, the high-concentration impurity regions 156 forming source and drain regions, the low-concentration impurity regions 158 forming LDD regions, and the channel formation region 154 are formed. In the region 110, the high-concentration impurity regions 162 forming source and drain regions and the channel formation region 160 are formed.

Figure 29B:
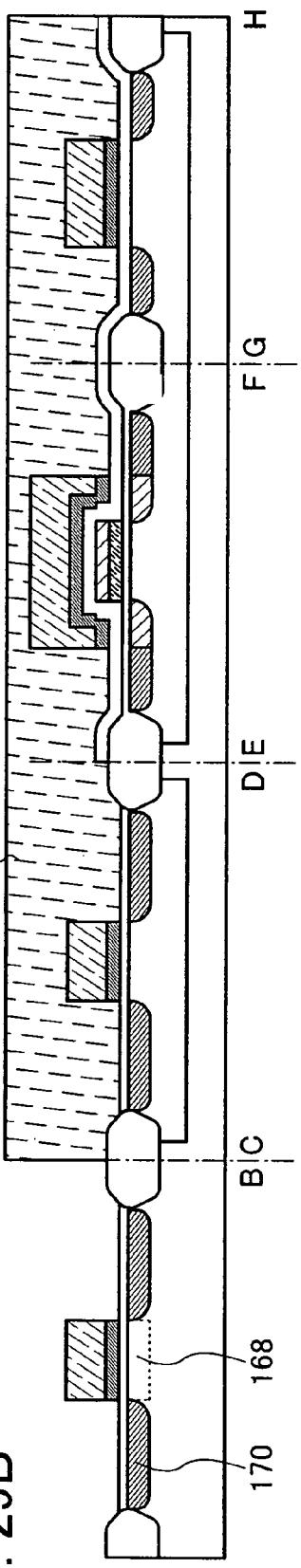

Next, the resist 166 is selectively formed so as to cover the regions 106, 108, and 110, and an impurity element is introduced into the region 104 by using the resist 166 and the conductive film 140 as masks, thereby forming impurity regions (see FIG. 29B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element imparting a conductivity type which is different from that of the impurity element introduced into the regions 106, 108, and 110 in FIG. 29A, (e.g., boron (B)) is introduced. As a result, the high-concentration impurity regions 170 forming source and drain regions and the channel formation region 168 are formed in the region 104.

Figure 29C:
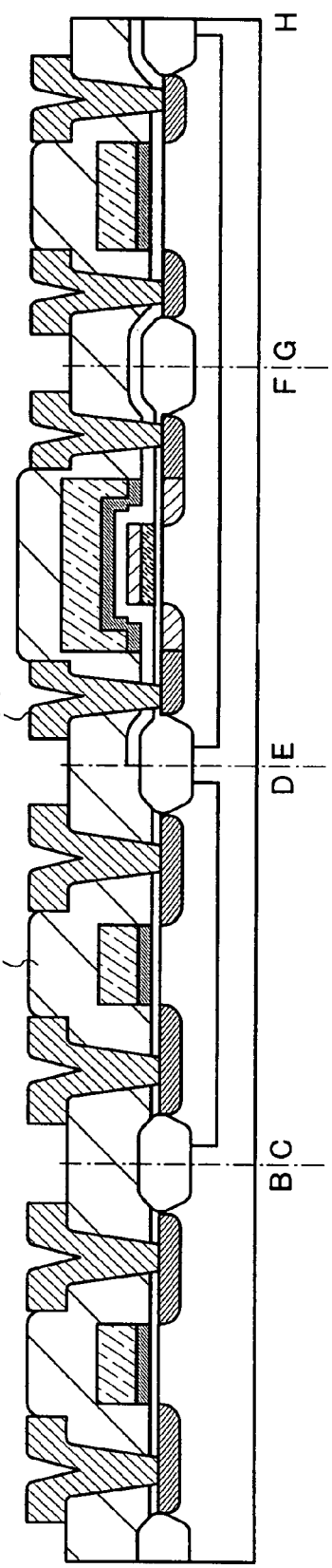

Next, the insulating layer 172 is formed so as to cover the second insulating layer 128, the third insulating layers 132 and 134, and the conductive films 140, 142, 144, and 146; and over the insulating layer 172, the conductive film 174 is formed so as to be electrically connected to the high-concentration impurity regions 170, 152, 156, and 162 formed in the regions 104, 106, 108, and 110, respectively (see FIG. 29C).

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied in writing and erasing operations of a nonvolatile memory element. In the nonvolatile memory element, charge injection from the semiconductor substrate into the floating gate electrode can be facilitated, and charges are prevented from being discharged from the floating gate electrode. That is, in the case of operating as a memory, highly efficient writing at a low voltage can be performed and the charge holding property can be improved. This embodiment enables a nonvolatile semiconductor memory device having such excellent effects to be manufactured by consecutive steps.

This embodiment can be implemented combining with any of the embodiment mode and the other embodiments described in this specification.

Embodiment 4

This embodiment will describe a manufacturing method of a nonvolatile semiconductor memory device, which is different from Embodiments 1 to 3, with reference to drawings. The same elements as those in Embodiments 1 to 3 are denoted by the same reference symbols, and repeated description thereof will be omitted. Note that in FIGS. 24A to 26C, portions between A and B, and between C and D illustrate transistors provided in a logic portion, a portion between E and F illustrates a nonvolatile memory element provided in a memory portion, and a portion between G and H illustrates a transistor provided in the memory portion. In addition, although the case where the transistor provided in the portion between A and B is of a p-channel type, the transistors provided in the portions between C and D and between G and H are of an n-channel type, and carrier movement of the nonvolatile memory element provided in the portion between E and F is performed by electrons will be described in this embodiment, the nonvolatile semiconductor device of the present invention is not limited to this.

First, after the state of FIG. 17C is obtained through similar formation steps to those described in Embodiment 1, a resist is formed so as to cover the regions 104, 106, and 108 and a part of the region 110, and an impurity element is introduced into the other part of the region 110 which is not covered with the resist, thereby forming the impurity regions 126 as shown in FIG. 18A. Then, the resist is removed, and the second insulating layer 128 is formed so as to cover the regions 104, 106, and 110, and the first insulating layer 116 and the stacked structure including the first conductive layer 120 and the second conductive layer 123 which are formed over the region 108 (see FIG. 24A).

Next, the resist 130 is selectively formed so as to cover the second insulating layer 128 formed over the regions 108 and 110, and the second insulating layer 128 formed over the regions 104 and 106 is selectively removed (see FIG. 24B).

Next, the third insulating layers 132 and 134 are formed so as to cover the regions 104 and 106, respectively (see FIG. 24C).

Next, the conductive film is formed so as to cover the third insulating layers 132 and 134 formed over the regions 104 and 106 and the second insulating layer 128 formed over the regions 108 and 110 (see FIG. 25A). In this embodiment, the conductive film 136 and the conductive film 138 are stacked sequentially as the conductive film. Needless to say, the conductive film may also be formed with a single-layer structure or a staked-layer structure including three or more layers.

Next, by selectively etching and removing the conductive films 136 and 138 which are stacked, the conductive films 136 and 138 are partially left over the regions 104, 106, 108, and 110 to form the conductive films 140, 142, 144, and 146 each functioning as a gate electrode (see FIG. 25B). In addition, in this embodiment, parts of surfaces of the regions 104, 106, 108, and 110, which are not overlapped with the conductive films 140, 142, 144, and 146 are exposed.

Specifically, in the region 104, a part of the third insulating layer 132 formed under the conductive film 140, which is not overlapped with the conductive film 140 is selectively removed so that ends of the conductive film 140 and the third insulating layer 132 are roughly aligned with each other. In the region 106, a part of the third insulating layer 134 formed under the conductive film 142, which is not overlapped with the conductive film 142 is selectively removed so that ends of the conductive film 142 and the third insulating layer 134 are roughly aligned with each other. In the region 108, parts of the second insulating layer 128, the stacked structure including the first conductive layer 120 and the second conductive layer 123, and the first insulating layer 116 formed under the conductive film 144, which are not overlapped with the conductive film 144 are selectively removed so that ends of the conductive film 144, the second insulating layer 128, the stacked structure including the first floating gate electrode layer 121 and the second floating gate electrode layer 125, and the first insulating layer 116 are roughly aligned with one another. In the region 110, a part of the second insulating layer 128 formed under the conductive film 146, which is not overlapped with the conductive film 146 is selectively removed so that ends of the conductive film 146 and the second insulating layer 128 are roughly aligned with each other.

In this case, parts of the insulating layers and the like which are not overlapped with the conductive films 140, 142, 144, and 146 may be removed at the same time as the formation of the conductive films 140, 142, 144, and 146; or may be removed after forming the conductive films 140, 142, 144, and 146, by using the remaining resist or the conductive films 140, 142, 144, and 146 as masks.

Next, the resist 148 is selectively formed so as to cover the region 104, and an impurity element is introduced into the regions 106, 108, and 110 by using the resist 148 and the conductive films 142, 144, and 146 as masks, thereby forming impurity regions (see FIG. 25C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, phosphorus (P) is used as the impurity element.

In FIG. 25C, by introducing the impurity element, the high-concentration impurity regions 152 forming source and drain regions and the channel formation region 150 are formed in the region 106. In the region 108, the high-concentration impurity regions 156 forming source and drain regions and the channel formation region 154 are formed. In the region 110, the high-concentration impurity regions 162 forming source and drain regions, the low-concentration impurity regions 164 forming LDD regions, and the channel formation region 160 are formed.

Figure 26A:
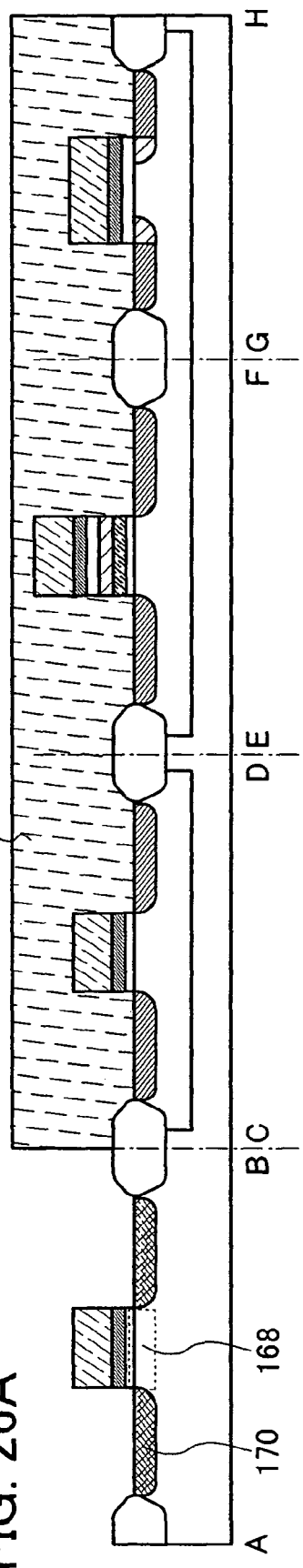
FIGS. 26A to 26C are diagrams showing one example of a manufacturing method of a nonvolatile semiconductor memory device of the present invention.

Next, the resist 166 is selectively formed so as to cover the regions 106, 108, and 110, and an impurity element is introduced into the region 104 by using the resist 166 and the conductive film 140 as masks, thereby forming impurity regions (see FIG. 26A). As the impurity element, an impurity element imparting n-type conductivity or an impurity element imparting p-type conductivity is used. As the impurity element having n-type conductivity, phosphorus (P), arsenic (As), or the like can be used. As the impurity element imparting p-type conductivity, boron (B), aluminum (Al), gallium (Ga), or the like can be used. In this embodiment, an impurity element imparting a conductivity type which is different from that of the impurity element introduced into the regions 106, 108, and 110 in FIG. 25C, (e.g., boron (B)) is introduced. As a result, the high-concentration impurity regions 170 forming source and drain regions and the channel formation region 168 are formed in the region 104.

Note that in this embodiment, the introduction of the impurity element is performed under a condition in which the parts of the regions 104, 106, 108, and 110 which are not overlapped with the conductive films 140, 142, 144, and 146 are exposed, in FIGS. 25C or 26A. Therefore, the channel formation regions 168, 150, 154, 160 respectively formed in the regions 104, 106, 108, and 110 can be formed in a self-aligned manner with the conductive films 140, 142, 144, and 146.

Figure 26B:
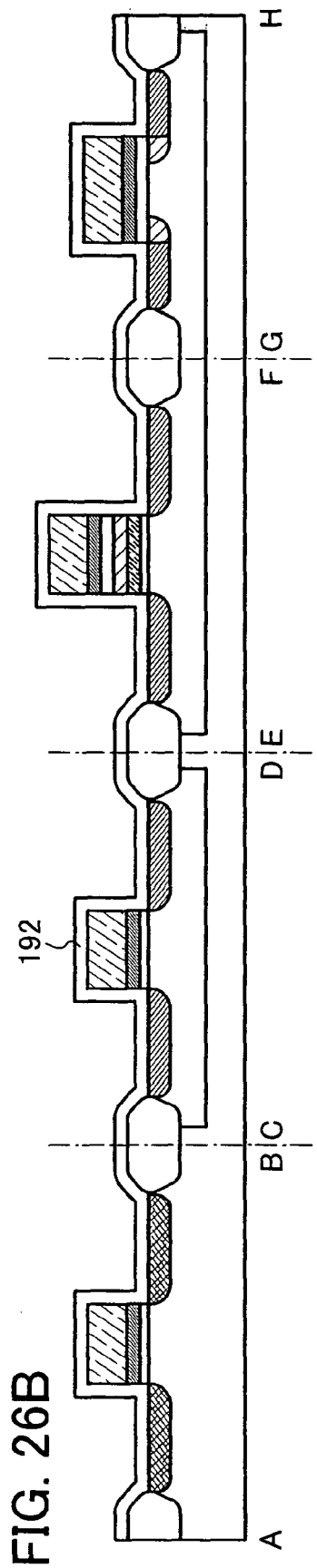

Next, an insulating layer 192 is formed so as to cover the exposed regions 104, 106, 108, and 110, the conductive films 140, 142, 144, and 146 (see FIG. 26B).

The insulating layer 192 can be formed with a single-layer or stacked-layer structure using an insulating layer containing oxygen or nitrogen such as a silicon oxide ($SiO_x$), a silicon nitride ($SiN_x$), a silicon oxynitride ($SiO_xN_y(x>y)$), or a silicon nitride oxide ($SiN_xO_y(x>y)$); DLC (Diamond-Like Carbon); or the like by a CVD method, a sputtering method, or the like.

Figure 26C:
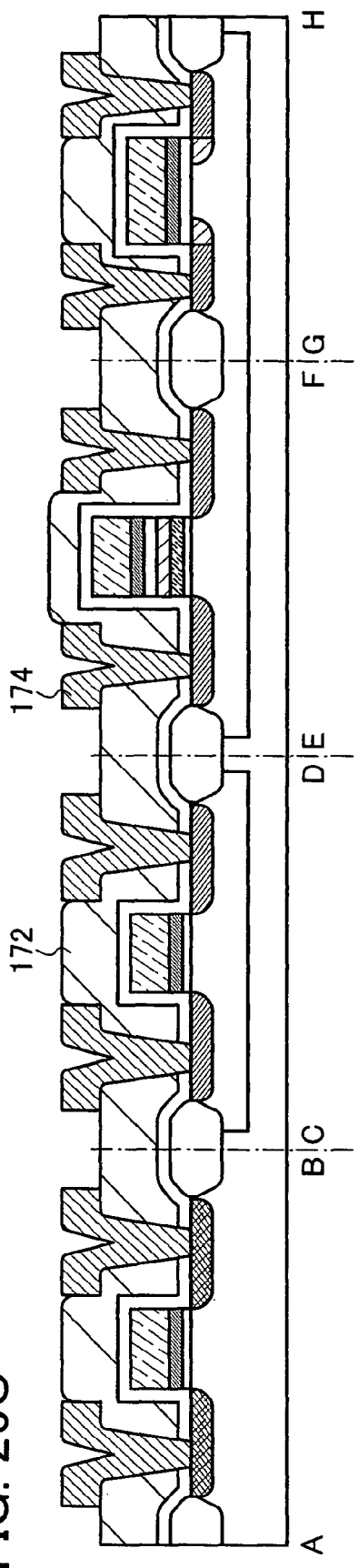

Next, the insulating layer 172 is formed so as to cover the insulating layer 192; and over the insulating layer 172, the conductive film 174 is formed so as to be electrically connected to the high-concentration impurity regions 170, 152, 156, and 162 formed in the regions 104, 106, 108, and 110, respectively (see FIG. 26C).

The insulating layer 172 can be formed using any material described in Embodiment 1. For example, an insulating layer having an inorganic material containing oxygen or nitrogen such as a silicon oxide ($SiO_x$), a silicon nitride ($SiN_x$), a silicon oxynitride ($SiO_xN_y(x>y)$), or a silicon nitride oxide ($SiN_xO_y(x>y)$) can be used as the insulating layer 192, and the insulating layer 172 can be formed of an organic material such as epoxy, polyimide, polyamide, polyvinyl phenol, benzocyclobutene, or acrylic. Needless to say, each of the insulating layer 192 and the insulating layer 172 can be formed of an insulating layer having an inorganic material.

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied in writing and erasing operations of a nonvolatile memory element. In the nonvolatile memory element, charge injection from the semiconductor substrate into the floating gate electrode can be facilitated, and charges are prevented from being discharged from the floating gate electrode. That is, in the case of operating as a memory, highly efficient writing at a low voltage can be performed and the charge holding property can be improved. This embodiment enables a nonvolatile semiconductor memory device having such excellent effects to be manufactured by consecutive steps.

This embodiment can be implemented combining with any of the embodiment mode and the other embodiments described in this specification.

Embodiment 5

Figure 39A:
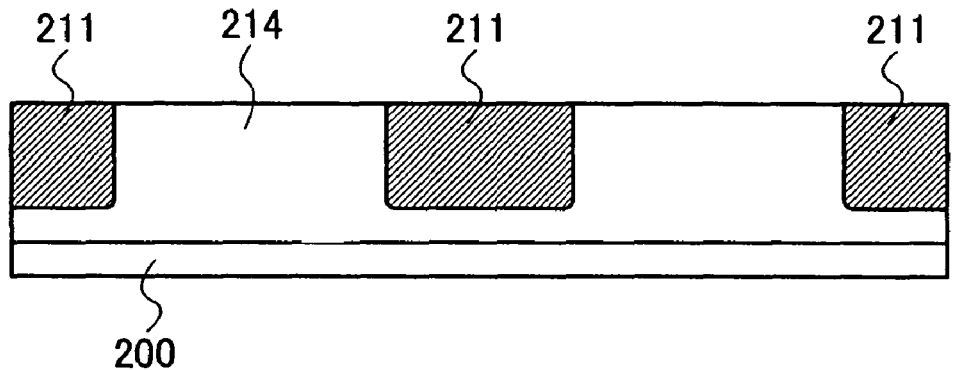
FIGS. 39A to 39C are diagrams each showing one example of a cross-section of a nonvolatile semiconductor memory device of the present invention.
Figure 39B:
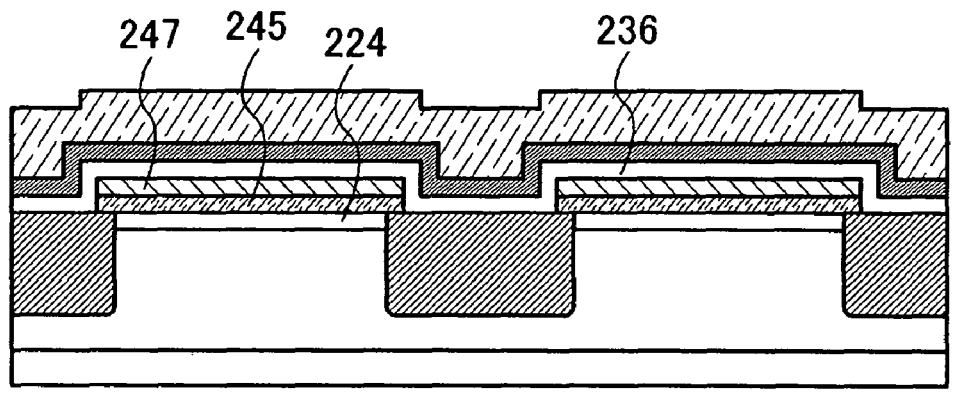
Figure 39C:
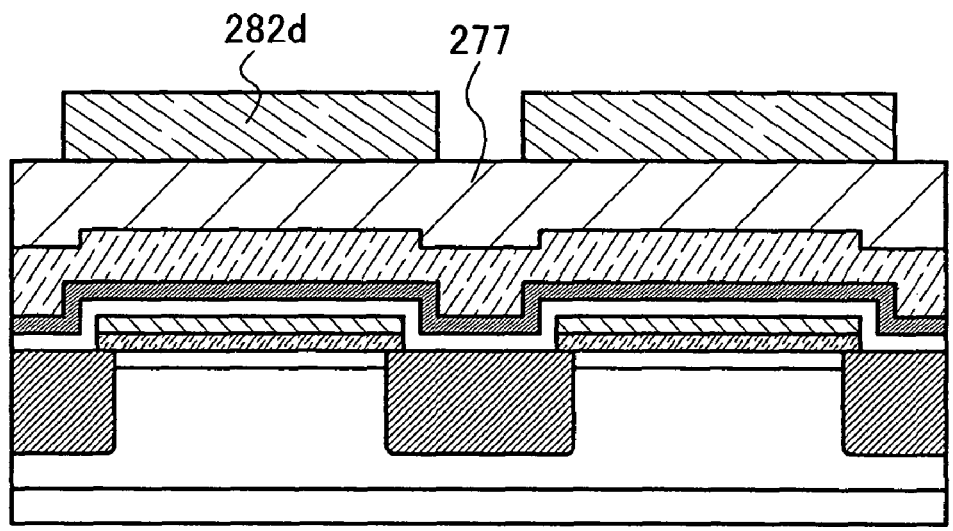

This embodiment will describe a manufacturing method of a nonvolatile semiconductor memory device, which is different from the above embodiments, with reference to drawings. Note that FIGS. 36A to 38B are top-plan views; FIGS. 30A to 35 are cross-sectional diagrams taken along lines A-B and E-F in FIGS. 36A to 38B; and FIGS. 39A to 39C are cross-sectional diagrams taken along a line C-D in FIGS. 36A to 38B. The portion between A and B illustrates a transistor and a nonvolatile memory element provided in a memory portion, the portion between C and D illustrates a nonvolatile memory element provided in the memory portion, and the portion between E and F illustrates a transistor provided in a logic portion. In addition, although the case where the transistor provided in a region 212 between E and F in a substrate 200 is of a p-channel type, the transistor provided in a region 213 is of an n-channel type, the transistor provided in a region 214 between A and B in the substrate 200 is of an n-channel type, and carrier movement of the nonvolatile memory element is performed by electrons will be described in this embodiment, the nonvolatile semiconductor device of the present invention is not limited to this.

First, an insulating layer is formed over the substrate 200. In this embodiment, single crystalline silicon having n-type conductivity is used for the substrate 200, and an insulating layer 202 and an insulating layer 204 are formed over the substrate 200 (see FIG. 30A). For example, a silicon oxide ($SiO_x$) layer is formed as the insulating layer 202 by performing heat treatment on the substrate 200, and a film of a silicon nitride ($SiN_x$) is formed over the insulating layer 202 by a CVD method.

Any semiconductor substrate can be used as the substrate 200. For example, a single crystalline silicon substrate having n-type or p-type conductivity, a compound semiconductor substrate (e.g., GaAs substrate, InP substrate, GaN substrate, SiC substrate, sapphire substrate, or ZnSe substrate), an SOI (Silicon On Insulator) substrate manufactured by a bonding method or a SIMOX (Separation by Implanted Oxygen) method, or the like can be used.

Further, the insulating layer 204 may be provided by nitriding the insulating layer 202 by high-density plasma treatment after the insulating layer 202 is formed. Note that the insulating layer over the substrate 200 may be formed with a single-layer structure or a staked-layer structure including three or more layers.

Figure 30A:
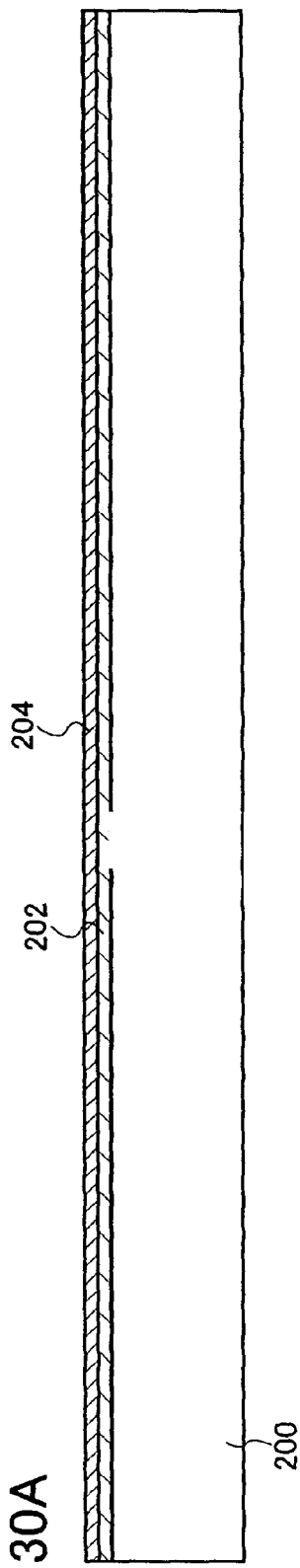
FIGS. 30A to 30C are diagrams showing one example of a manufacturing method of a nonvolatile semiconductor memory device of the present invention.
Figure 30B:
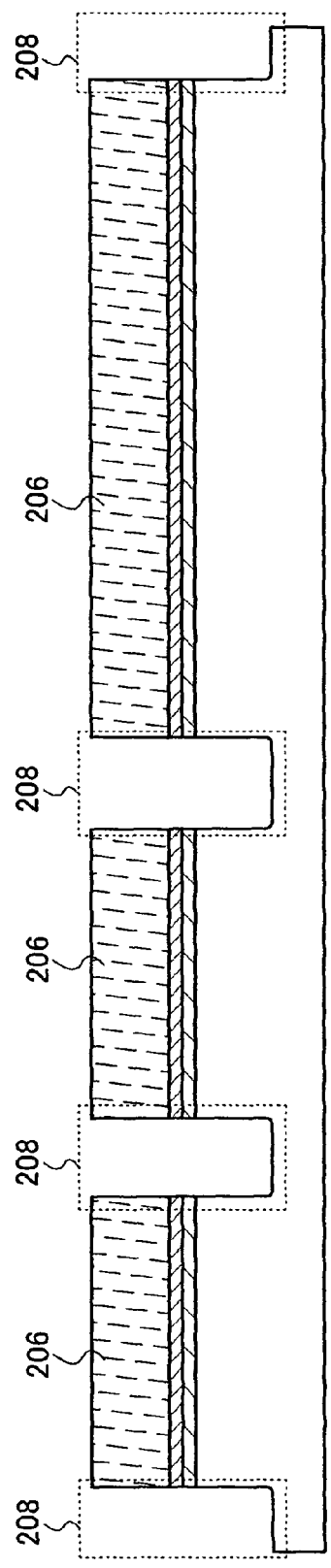

Next, a pattern of a resist 206 is selectively formed over the insulating layer 204, and etching is selectively performed using the resist 206 as a mask, thereby forming depressions 208 selectively in the substrate 200 (see FIG. 30B). The etching of the substrate 200 and the insulating layers 202 and 204 can be performed by dry etching utilizing plasma.

Figure 30C:
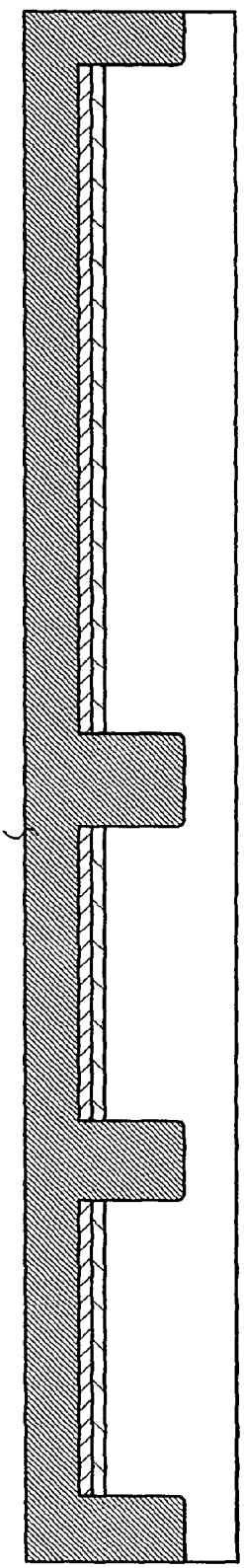

Next, after the pattern of the resist 206 is removed, an insulating layer 210 is formed so as to fill the depressions 208 formed in the substrate 200 (see FIG. 30C).

The insulating layer 210 is formed using an insulating material such as a silicon oxide, a silicon nitride, a silicon oxynitride ($SiO_xN_y(x>y)$), or a silicon nitride oxide ($SiN_xO_y(x>y)$) by a CVD method, a sputtering method, or the like. In this embodiment, a silicon oxide film is formed as the insulating layer 210 by using a TEOS (Tetra-Ethyl-Ortho Silicate) gas by a normal-pressure CVD method or a low-pressure CVD method.

Next, a surface of the substrate 200 is exposed by performing grinding treatment, polishing treatment, or CMP (Chemical Mechanical Polishing) treatment. In this embodiment, when the surface of the substrate 200 is exposed, the regions 212, 213 and 214 are each provided between insulating layers 211 formed in the depressions 208 in the substrate 200. Note that the insulating layers 211 are formed by removing the insulating layer 210 formed on the surface of the substrate 200, by grinding treatment, polishing treatment, or CMP treatment. Then, an impurity element having p-type conductivity is selectively introduced, thereby forming p-wells 215 in the regions 213 and 214 in the substrate 200 (see FIGS. 31A, 38A and 38B, and 39A).

As the impurity element imparting p-type conductivity, boron (B), aluminum (Al), gallium (Ga), or the like can be used. In this embodiment, boron (B) is introduced as the impurity element into the regions 213 and 214.

Note that although an impurity element is not introduced into the region 212 since the semiconductor substrate having n-type conductivity is used as the semiconductor substrate 200 in this embodiment, an n-well may be formed in the region 212 by introducing an impurity element imparting n-type conductivity. As the impurity element having n-type conductivity, phosphorus (P), arsenic (As), or the like can be used.

In the case where a semiconductor substrate having p-type conductivity is used, an impurity element imparting n-type conductivity may be introduced only into the region 212 so as to form an n-well, not into the regions 213 and 214.

Next, first insulating layers 216, 218, and 220 are formed over the regions 212, 213, and 214 respectively formed in the substrate 200. Then, a first conductive layer 222 and a second conductive layer 227 which function as a floating gate electrode in a nonvolatile memory element completed later are stacked so as to cover the first insulating layers 216, 218, and 220 (see FIG. 31B).

Each of the first insulating layers 216, 218, and 220 can be formed of a silicon oxide film by oxidizing each surface of the regions 212, 213, and 214 in the substrate 200 by performing heat treatment. Alternatively, each of the first insulating layers 216, 218, and 220 can be formed with a stacked structure with a silicon film containing oxygen and nitrogen (silicon oxynitride film) by forming the silicon oxide film by a thermal oxidation method and then nitriding the surface of the silicon oxide film by nitridation treatment.

Further alternatively, as described above, the first insulating layers 216, 218, and 220 may be formed using plasma treatment. For example, by performing oxidation treatment or nitridation treatment by high-density plasma treatment on the surfaces of the regions 212, 213, and 214 in the substrate 200, silicon oxide ($SiO_x$) films or silicon nitride ($SiN_x$) films are formed as the first insulating layers 216, 218, and 220. Alternatively, after oxidation treatment is performed on the surfaces of the regions 212, 213, and 214 by high-density plasma treatment, nitridation treatment may be performed by performing high-density plasma treatment again. In this case, silicon oxide films are formed on the surfaces of the regions 212, 213, and 214, and silicon oxynitride films are formed on the silicon oxide films, so that each of the first insulating layers 216, 218, and 220 is formed as a film in which the silicon oxide film and the silicon oxynitride film are stacked. Further alternatively, after silicon oxide films are formed on the surfaces of the regions 212, 213, and 214 by a thermal oxidation method, oxidation treatment or nitridation treatment may be performed by high-density plasma treatment.

In this embodiment, the first insulating layer 220 which is formed over the region 214 provided in the memory portion in the substrate 200 functions as a tunnel insulating film in a nonvolatile memory element completed later. Therefore, as the thickness of the first insulating layer 220 is smaller, a larger amount of tunnel current flows so that a high-speed operation as a memory can be realized. In addition, as the thickness of the first insulating layer 220 is smaller, charge (carrier) accumulation in the stacked structure including the first conductive layer 222 and the second conductive layer 227 functioning as a floating gate electrode can be performed with a lower voltage so that power consumption of a nonvolatile semiconductor memory device can be reduced. Therefore, the first insulating layer 220 is preferably formed with a small thickness.

The first conductive layer 222 is formed of a film containing germanium (Ge) such as a film of germanium or a silicon-germanium alloy. In this embodiment, the first conductive layer 222 is formed using a film containing germanium as its main component with a thickness of 1 nm to 20 nm, preferably 1 nm to 10 nm, by a plasma CVD method in an atmosphere containing a germanium element (for example, $GeH_4$). Specifically, a germanium layer can be formed using a germane ($GeH_4$) gas diluted with hydrogen to 5% to 10%, by the application of a high-frequency power of 13.56 MHz to 60 MHz (for example, 27 MHz) with the substrate 100 heated at a temperature of 200® C. to 350° C.

The second conductive layer 227 is formed of a metal, or an alloy or a metal compound thereof. For example, a tantalum film is formed with a thickness of 1 nm to 20 nm, preferably 1 nm to 10 nm. Alternatively, the second conductive layer 227 can be formed using a refractory metal such as tungsten (W), titanium (Ti), molybdenum (Mo), chromium (Cr), or nickel (Ni). The alloy may be formed using the refractory metal and niobium (Nb), zirconium (Zr), cerium (Ce), thorium (Th), or hafnium (Hf). Alternatively, an oxide or a nitride of the refractory metal may be used. The metal nitride can be a tantalum nitride, a tungsten nitride, a molybdenum nitride, a titanium nitride, or the like. The metal oxide can be a tantalum oxide, a titanium oxide, a molybdenum oxide, or the like. When the second conductive layer 227 to be a second floating gate electrode layer 229 later is thus formed of a metal or the like, a first floating gate electrode layer 226 formed using the first conductive layer 222 can be stabilized.

In a case where the single crystalline silicon substrate is used as the substrate 200 and the film containing germanium which has a smaller energy gap than that of silicon is provided as the first conductive layer 222 forming the floating gate electrode, over a certain region of the silicon substrate with the first insulating layer functioning as the tunnel insulating film interposed therebetween, a second barrier formed by the insulating layer with respect to charges (carriers) in the floating gate electrode is energetically higher than a first barrier formed by the insulating layer with respect to charges (carriers) in a certain region of the silicon substrate. Consequently, charges (carriers) can be injected easily from a certain region of the silicon substrate into the charge accumulation layer and charges (carriers) can be prevented from being discharged from the floating gate electrode. That is, in the case of operating as a memory, highly efficient writing with a low voltage can be performed and the charge holding property can be improved. Note also that the stacked structure including the first conductive layer 222 and the second conductive layer 227 formed over the region 214 provided in the memory portion in the substrate 200 functions as the floating gate electrode in the nonvolatile memory element completed later.

Next, a resist 223 is formed over the stacked structure including the first conductive layer 222 and the second conductive layer 227, and the stacked structure including the first conductive layer 222 and the second conductive layer 227, and the first insulating layers 216, 218, and 220 are selectively removed by using the resist 223 as a mask. In this embodiment, the resist 223 is formed so as to cover a part of the region 214 in the substrate 200, and the other parts of the stacked structure including the first conductive layer 222 and the second conductive layer 227, and the first insulating layers 216, 218, and 220 which are not covered with the resist 223 are removed, so that the first insulating layer 220 and the stacked structure including the first conductive layer 222 and the second conductive layer 227 are partially left to form a first insulating layer 224 and a stacked structure including the first floating gate electrode layer 226 and the second floating gate electrode layer 229 (see FIG. 31C). Specifically, the first insulating layer 220 and the stacked structure including the first conductive layer 222 and the second conductive layer 227 provided in a region for forming the nonvolatile memory element later in the region 214 are left. In addition, surfaces of the regions 212 and 213 and a part of the region 214 in the substrate 200 are exposed.

Figure 32A:
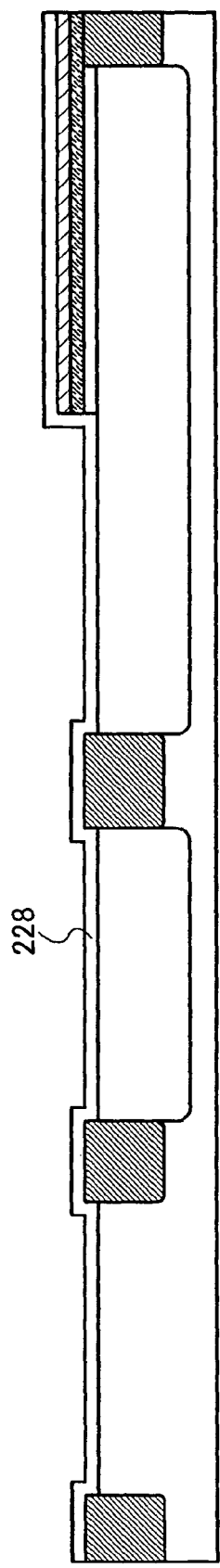
FIGS. 32A to 32C are diagrams showing one example of a manufacturing method of a nonvolatile semiconductor memory device of the present invention.

Next, a second insulating layer 228 is formed so as to cover the regions 212, 213, and 214 in the substrate 200 and the stacked structure including the first floating gate electrode layer 226 and the second floating gate electrode layer 229 (see FIG. 32A).

The second insulating layer 228 is formed of a single layer or a stacked layer using an insulating material such as a silicon oxide, a silicon nitride, a silicon oxynitride ($SiO_xN_y$ (x>y)), or a silicon nitride oxide ($SiN_xO_y$(x>y)) by a CVD method, a sputtering method, or the like. For example, when forming the second insulating layer 228 as a single layer, a silicon oxynitride film or a silicon nitride oxide film is formed with a thickness of 5 nm to 50 nm inclusive by a CVD method. Further, when forming the second insulating layer 228 with a three-layer structure, a silicon oxynitride film is formed as a first-layer insulating layer, a silicon nitride film is formed as a second-layer insulating layer, and a silicon oxynitride film is formed as a third-layer insulating layer.

Note that the second insulating layer 228 formed over the stacked structure including the first floating gate electrode layer 226 and the second floating gate electrode layer 229 in the region 214 in the substrate 200 functions as a control insulating layer in the nonvolatile memory element completed later, and the second insulating layer 228 formed over the exposed part of the region 214 functions as a gate insulating film in a transistor completed later.

Figure 32B:
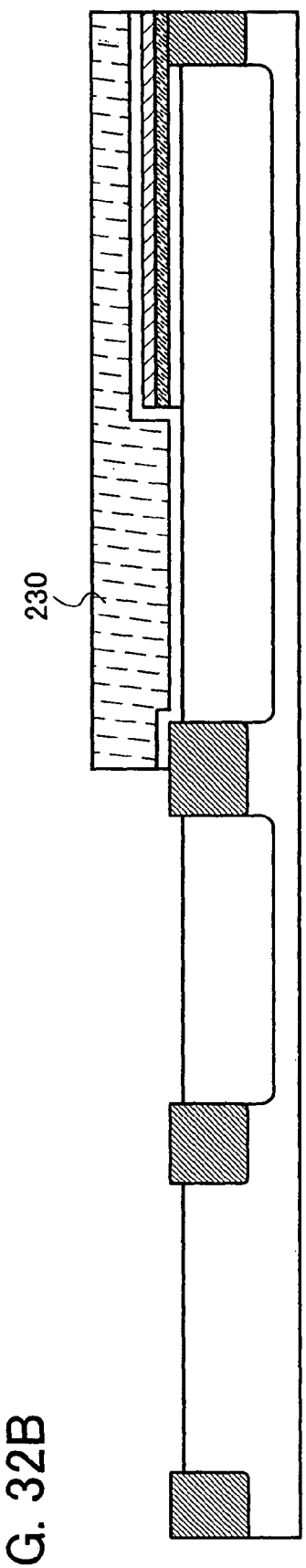

Next, a resist 230 is selectively formed so as to cover the second insulating layer 228 formed over the region 214 in the substrate 200, and the second insulating layer 228 formed over the regions 212 and 213 in the substrate 200 is removed (see FIG. 32B).

Figure 32C:
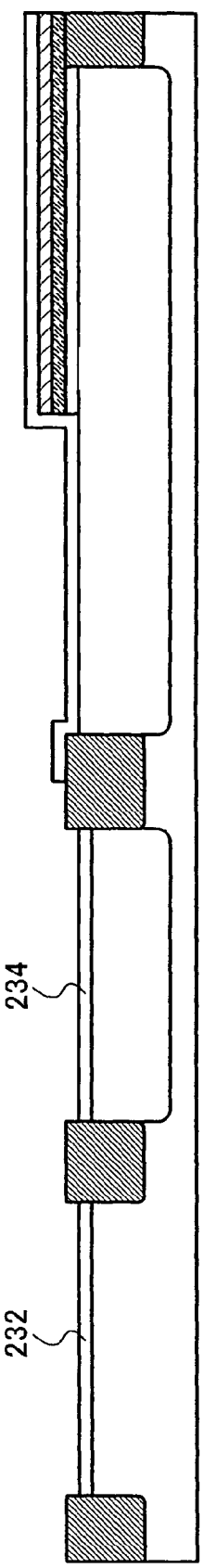
Figure 35:
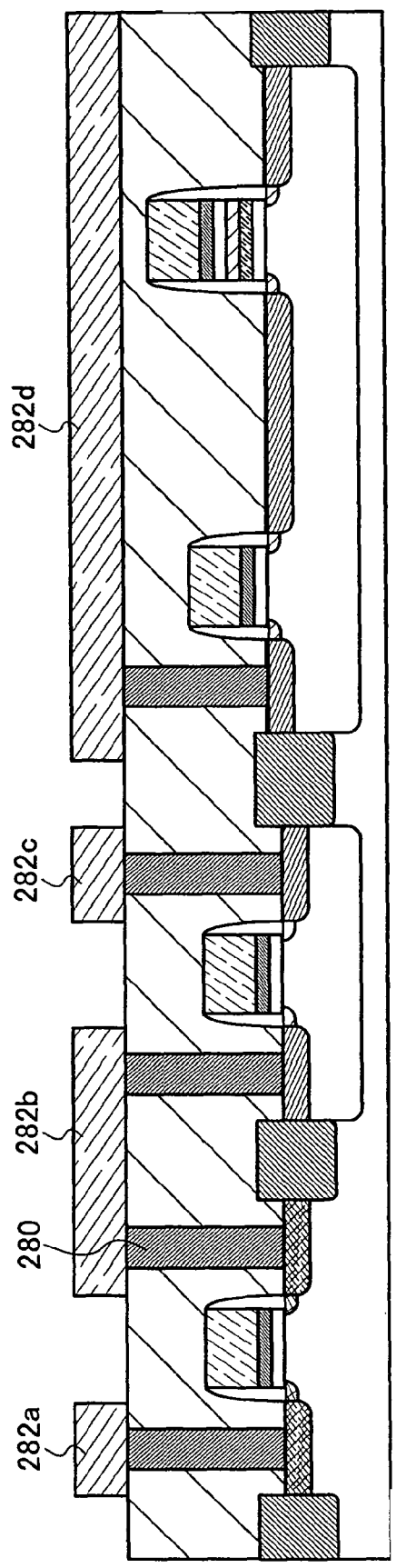
FIG. 35 is a diagram showing one example of a manufacturing method of a nonvolatile semiconductor memory device of the present invention.
Figure 36A:
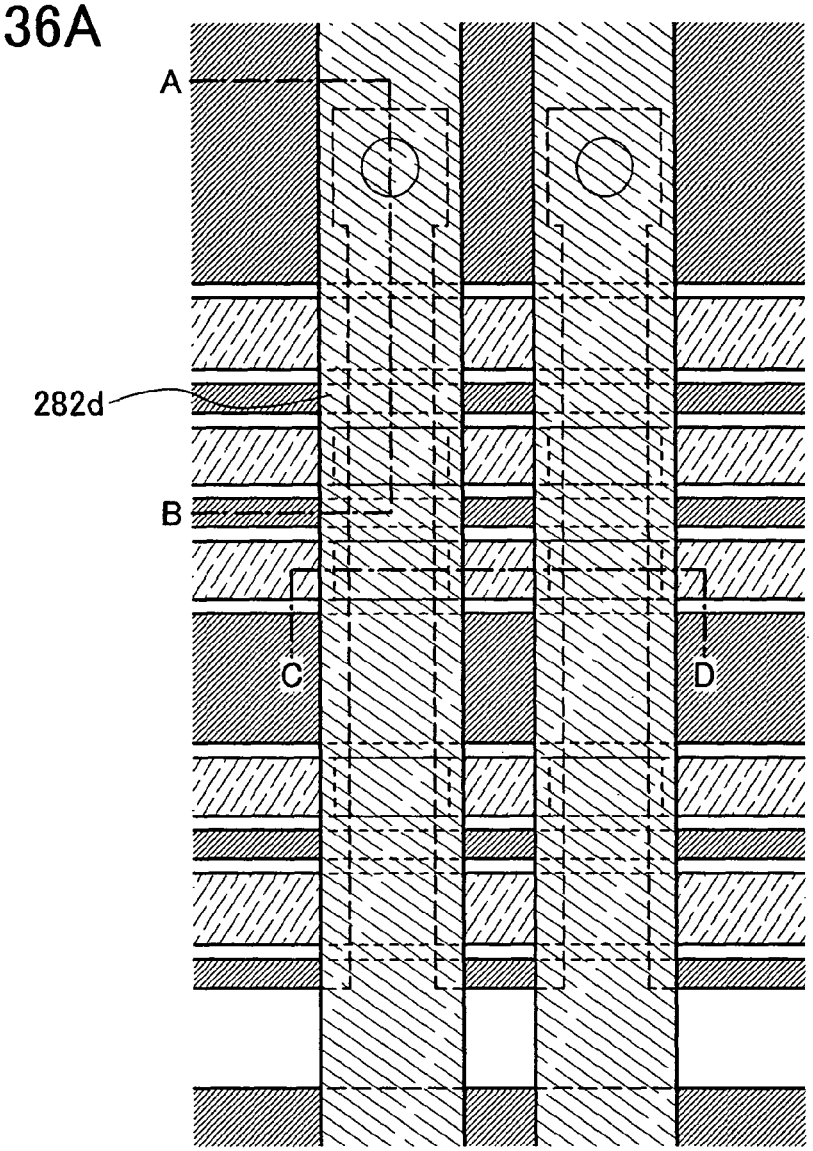
FIGS. 36A and 36B are diagrams each showing one example of a top surface of a nonvolatile semiconductor memory device of the present invention.
Figure 36B:
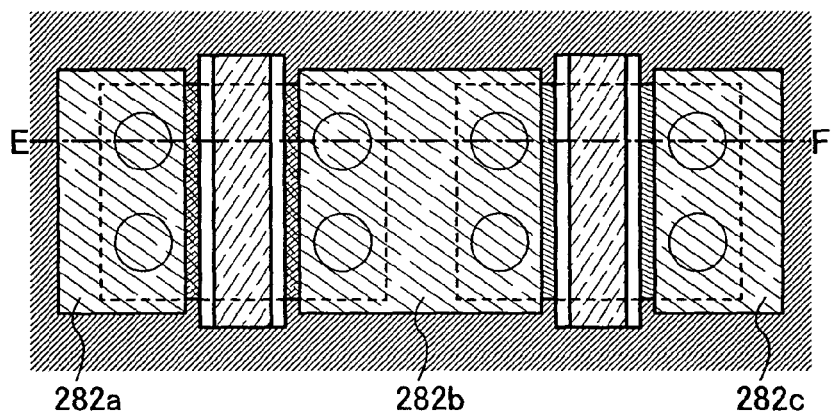

Next, third insulating layers 232 and 234 are formed on the surfaces of the regions 212 and 213 in the substrate 200, respectively (see FIG. 32C).

The third insulating layers 232 and 234 are formed by any method described as the method of forming the above-described first insulating layers 216, 218, and 220. For example, the third insulating layers 232 and 234 can be formed of silicon oxide films by oxidizing surfaces of the regions 212 and 213 in the substrate 200 by performing heat treatment. Alternatively, the third insulating layers 232 and 234 can be formed with a stacked structure with a silicon film containing oxygen and nitrogen (silicon oxynitride film) by forming the silicon oxide films by a thermal oxidation method and then nitriding the surfaces of the silicon oxide films by nitridation treatment.

Further alternatively, as described above, the third insulating layers 232 and 234 may be formed using plasma treatment. For example, by performing oxidation treatment or nitridation treatment by high-density plasma treatment on the surfaces of the regions 212 and 213 in the substrate 200, silicon oxide ($SiO_x$) films or silicon nitride ($SiN_x$) films can be formed as the third insulating layers 232 and 234. Further, after oxidation treatment is performed on the surfaces of the regions 212 and 213 by high-density plasma treatment, nitridation treatment may be performed by performing high-density plasma treatment again. In this case, silicon oxide films are formed on the surfaces of the regions 212 and 213, and silicon oxynitride films are formed on the silicon oxide films, so that each of the third insulating layers 232 and 234 is formed as a film in which the silicon oxide film and the silicon oxynitride film are stacked. Further alternatively, after silicon oxide films are formed on the surfaces of the regions 212 and 213 by a thermal oxidation method, oxidation treatment or nitridation treatment may be performed by high-density plasma treatment.

Note that in forming the third insulating layers 232 and 234 by a thermal oxidation method or high-density plasma treatment, an oxide film or an oxynitride film may be formed on the surface of the second insulating layer 228 formed over the region 214 in the substrate 200. The third insulating layers 232 and 234 formed over the regions 212 and 213 in the substrate 200 function as gate insulating films in the transistors completed later.

Next, a conductive film is formed so as to cover the third insulating layers 232 and 234 formed over the regions 212 and 213 in the substrate 200 and the second insulating layer 228 formed over the region 214 (see FIG. 33A). In the example described in this embodiment, a conductive film 236 and a conductive film 238 are stacked sequentially as the conductive film. Needless to say, the conductive film may also be formed with a single-layer structure or a staked-layer structure including three or more layers.

The conductive films 236 and 238 can be formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing the element as a main component. Alternatively, a metal nitride film obtained by nitriding the element can also be used. Further alternatively, a semiconductor material typified by polycrystalline silicon doped with an impurity element such as phosphorus can be used.

In this embodiment, the conductive film is a stacked structure formed by forming the conductive film 236 using tantalum nitride and forming the conductive film 238 using tungsten thereover. Alternatively, a single-layer or stacked-layer film of a tantalum nitride, a tungsten nitride, a molybdenum nitride, or a titanium nitride can be used as the conductive film 236, and a single-layer or stacked-layer film of tungsten, tantalum, molybdenum, or titanium can be used as the conductive film 238.

Next, by selectively etching and removing the conductive films 236 and 238 which are stacked, the conductive films 236 and 238 are partially left over the regions 212, 213, and 214 in the substrate 200 to form conductive films 240, 242, 244, and 246 each functioning as a gate electrode (see FIGS. 33B and 39B). In addition, in this embodiment, surfaces of parts of the regions 212, 213, and 214 which are not overlapped with the conductive films 240, 242, 244, and 246 are exposed in the substrate 200. Note that the conductive film 244 functions as a control gate electrode in the nonvolatile memory element completed later. In addition, each of the conductive films 240, 242, and 246 functions as a gate electrode in the transistor completed later.

Specifically, in the region 212 in the substrate 200, a part of the third insulating layer 232 formed under the conductive film 240, which is not overlapped with the conductive film 240 is selectively removed so that ends of the conductive film 240 and the third insulating layer 232 are roughly aligned with each other. In the region 213 in the substrate 200, a part of the third insulating layer 234 formed under the conductive film 242, which is not overlapped with the conductive film 242 is selectively removed so that ends of the conductive film 242 and the third insulating layer 234 are roughly aligned with each other. In the region 214 in the substrate 200, a part of the second insulating layer 228 formed under the conductive film 244, which is not overlapped with the conductive film 244 is selectively removed so that ends of the conductive film 244 and the second insulating layer 228 are roughly aligned with each other. Further, also in the region 214 in the substrate 200, parts of the second insulating layer 228, the stacked structure including the first floating gate electrode layer 226 and the second floating gate electrode layer 229, and the first insulating layer 224 formed under the conductive film 246, which are not overlapped with the conductive film 246 are removed so that ends of the conductive film 246, the second insulating layer 228, the stacked structure including the charge accumulation layers 226 and 229, and the first insulating layer 224 are roughly aligned with one another.

In this case, parts of the insulating layers and the like which are not overlapped with the conductive films 240, 242, 244, and 246 may be removed at the same time as the formation of the conductive films 240, 242, 244, and 246; or may be removed after forming the conductive films 240, 242, 244, and 246, by using the remaining resist or the conductive films 240, 242, 244, and 246 as masks.

Next, an impurity element is selectively introduced into the regions 212, 213, and 214 in the substrate 200 (see FIG. 33C). In this embodiment, an impurity element imparting n-type conductivity is selectively introduced into the regions 213 and 214 at a low concentration by using the conductive films 242, 244, and 246 as masks, while an impurity element imparting p-type conductivity is selectively introduced into the region 212 at a low concentration by using the conductive film 240 as a mask. As the impurity element imparting n-type conductivity, phosphorus (P), arsenic (As), or the like can be used. As the impurity element imparting p-type conductivity, boron (B), aluminum (Al), gallium (Ga), or the like can be used.

Next, insulating layers (also called sidewalls) 254 are formed in contact with side surfaces of the conductive films 240, 242, 244, and 246. Specifically, a film containing an inorganic material such as silicon, an oxide of silicon, or a nitride of silicon, or a film containing an organic material such as an organic resin is formed as a single layer or a stacked layer by a plasma CVD method, a sputtering method, or the like. Then, the insulating layer is selectively etched by anisotropic etching mainly in the perpendicular direction, such that the insulating layer is formed in contact with the side surfaces of the conductive films 240, 242, 244, and 246. Note that the insulating layers 254 are used as masks for doping when LDD (Lightly Doped Drain) regions are formed. Further, in this embodiment, the insulating layers 254 are formed in contact with side surfaces of the insulating layers and the floating gate electrode layers formed under the conductive films 240, 242, 244, and 246 as well.

Figure 37A:
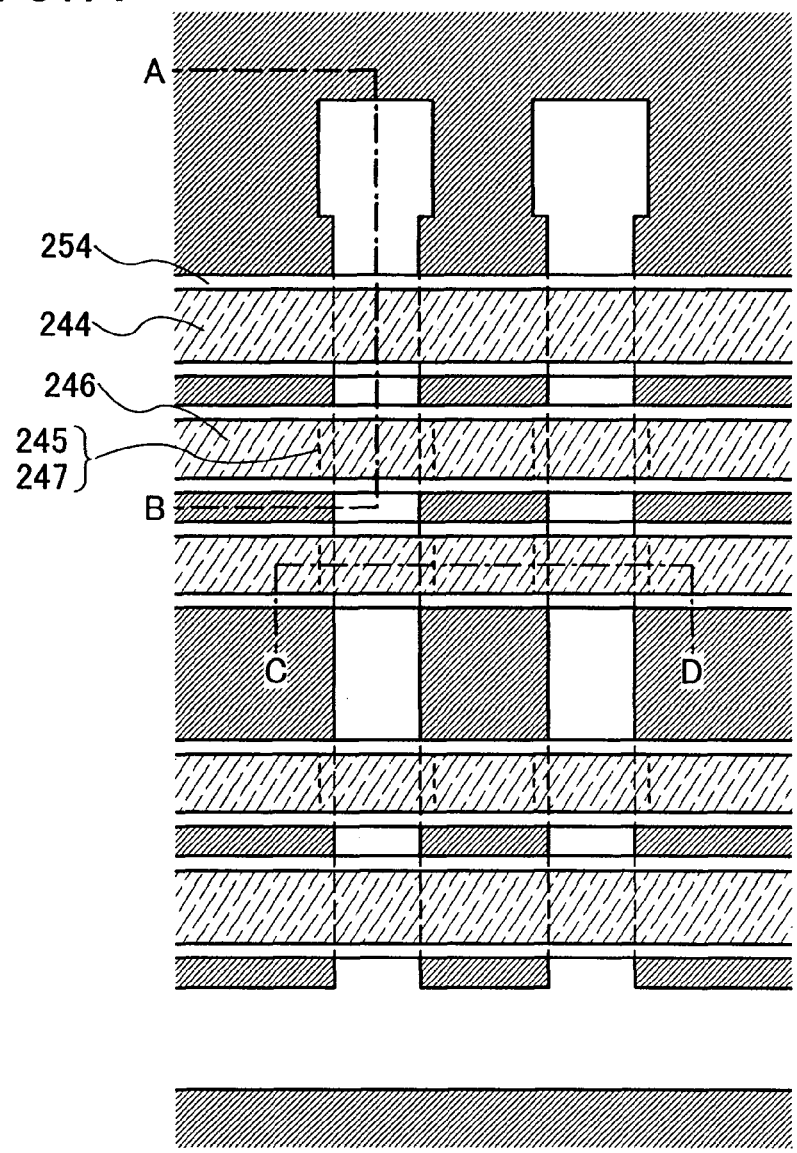
FIGS. 37A and 37B are diagrams each showing one example of a top surface of a nonvolatile semiconductor memory device of the present invention.
Figure 37B:
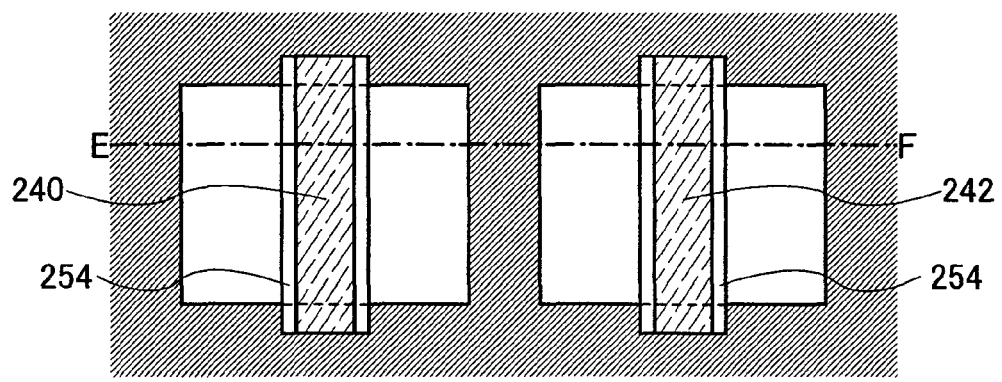
Figure 38A:
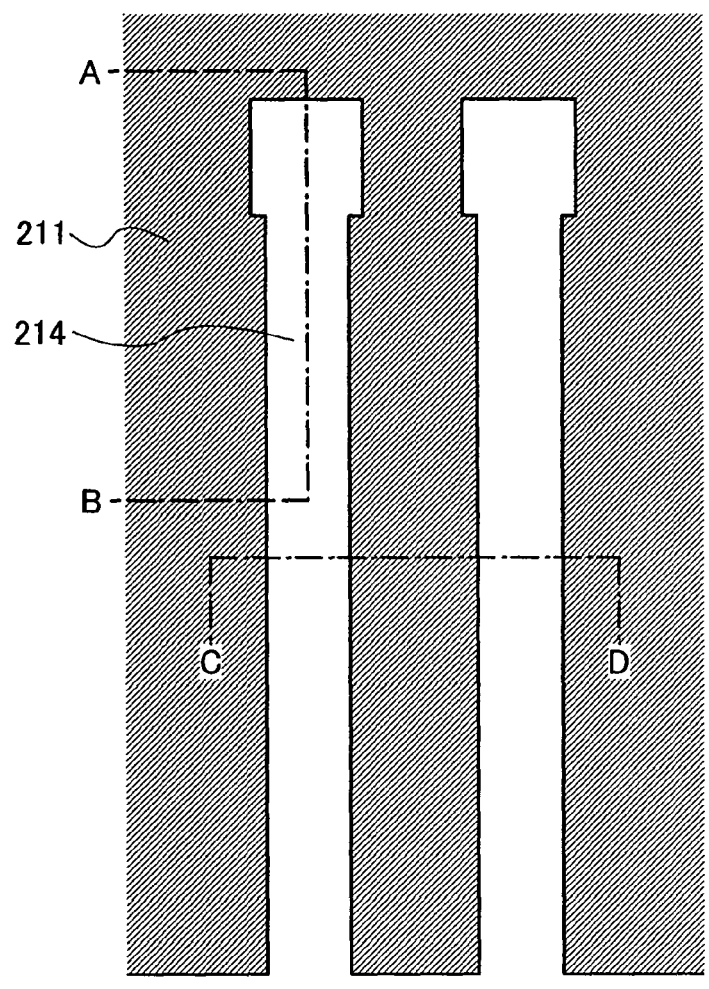
FIGS. 38A and 38B are diagrams each showing one example of a top surface of a nonvolatile semiconductor memory device of the present invention.
Figure 38B:
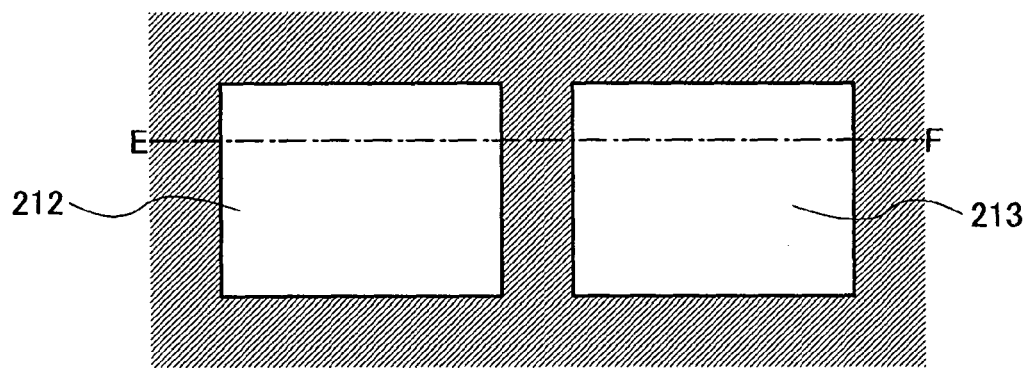

Next, an impurity element is introduced into the regions 212, 213, and 214 in the substrate 200 by using the insulating layers 254 and the conductive films 240, 242, 244, and 246 as masks, thereby forming impurity regions functioning as source regions and drain regions (see FIGS. 34A, 37A and 37B). In this embodiment, an impurity element imparting n-type conductivity is introduced at a high concentration into the regions 213 and 214 in the substrate 200 by using the insulating layers 254 and the conductive films 242, 244, and 246 as masks, while an impurity element imparting p-type conductivity is introduced at a high concentration into the region 212 by using the insulating layers 254 and the conductive film 240 as masks.

As a result, in the region 212 in the substrate 200, impurity regions 258 forming source and drain regions, low-concentration impurity regions 260 forming LDD regions, and a channel formation region 256 are formed. In the region 213 in the substrate 200, impurity regions 264 forming source and drain regions, low-concentration impurity regions 266 forming LDD regions, and a channel formation region 262 are formed. In the region 214 in the substrate 200, impurity regions 270 forming source and drain regions, low-concentration impurity regions 272 and 276 forming LDD regions, and channel formation regions 268 and 274 are formed.

Note that in this embodiment, the introduction of the impurity element is performed under a condition in which the parts of the regions 212, 213, and 214 in the substrate 200 which are not overlapped with the conductive films 240, 242, 244, and 246 are exposed. Therefore, the channel formation regions 256, 262, 268, and 274 formed in the regions 212, 213, and 214 in the substrate 200 can be formed in a self-aligned manner with the conductive films 240, 242, 244, and 246.

Next, an insulating layer 277 is formed so as to cover the insulating layers, the conductive films, or the like provided over the regions 212, 213, and 214 in the substrate 200, and openings 278 are formed in the insulating layer 277 (see FIG. 34B).

The insulating layer 277 can be formed with a single-layer or stacked-layer structure of an insulating layer containing oxygen or nitrogen such as a silicon oxide ($SiO_x$), a silicon nitride ($SiN_x$), a silicon oxynitride ($SiO_xN_y(x>y)$), or a silicon nitride oxide ($SiN_xO_y(x>y)$); a film containing carbon such as DLC (Diamond-Like Carbon); an organic material such as epoxy, polyimide, polyamide, polyvinyl phenol, benzocyclobutene, or acrylic; or a siloxane material such as a siloxane resin, by a CVD method, a sputtering method, or the like. Note that the siloxane material is a material having a Si—O—Si bond. Siloxane has a skeleton structure containing a bond of silicon (Si) and oxygen (O). As a substituent, an organic group containing at least hydrogen (e.g., an alkyl group or aromatic hydrocarbon) can be used. As a substituent, a fluoro group may also be used. Alternatively, as a substituent, an organic group containing at least hydrogen and a fluoro group may be used.

Next, conductive films 280 are formed in the openings 278 by using a CVD method, a sputtering method, or the like, and conductive films 282a to 282d are selectively formed over the insulating layer 277 so as to be electrically connected to the conductive films 280 (see FIGS. 35, 36A and 36B, and 39C).

Each of the conductive films 280, and 282a to 282d is formed as a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as a main component by a CVD method, a sputtering method, or the like. The alloy material containing aluminum as a main component corresponds to: a material containing aluminum as a main component and nickel; or a material containing aluminum as a main component, nickel and one or both of carbon and silicon, for example. Each of the conductive films 280, and 282a to 282d preferably employs, for example, a stacked structure of a barrier film, an aluminum-silicon (Al—Si) film, and a barrier film; or a stacked structure of a barrier film, an aluminum-silicon (Al—Si) film, a titanium nitride (TiN) film, and a barrier film. Note that the barrier film corresponds to a thin film of titanium, a nitride of titanium, molybdenum, or a nitride of molybdenum. Aluminum or aluminum-silicon which is low in resistance value and cost is preferable as the material of the conductive films 280, and 282a to 282d. In addition, by providing barrier layers as an upper layer and a lower layer, hillock generation in aluminum or aluminum-silicon can be prevented. Further, by forming a barrier film of titanium which is a highly-reducible element, a thin natural oxide film which may be formed on a semiconductor substrate can be reduced so that good contact with the semiconductor substrate can be obtained. In this embodiment, each of the conductive films 280, and 282a to 282d can be formed by selective growth of tungsten (W) using a CVD method.

Through the above-described steps, a nonvolatile semiconductor memory device provided with a p-type transistor formed in the region 212, an n-type transistor formed in the region 213, and an n-type transistor and a nonvolatile memory element formed in the region 214 in the substrate 200 can be obtained.

The nonvolatile semiconductor memory device of this embodiment can achieve low power consumption by making the thickness of gate insulating layers in transistors different in accordance with circuit structures. In addition, stabilization of operation of the nonvolatile semiconductor memory device can be achieved. Specifically, by reducing the thickness of a gate insulating layer in a transistor in a logic portion, variations of the threshold voltage can be reduced and a low-voltage operation can be performed. By increasing the thickness of a gate insulating layer in a selecting transistor in a memory portion, stabilization of an operation can be enhanced even when a voltage higher than that in the logic portion is applied in writing and erasing operations of a nonvolatile memory element. In the nonvolatile memory element, charge injection from the semiconductor substrate into the floating gate electrode can be facilitated, and charges are prevented from being discharged from the floating gate electrode. That is, in the case of operating as a memory, highly efficient writing with a low voltage can be performed and the charge holding property can be improved. This embodiment enables a nonvolatile semiconductor memory device having such excellent effects to be manufactured by consecutive steps.

This embodiment can be implemented combining with any of the embodiment mode and the other embodiments described in this specification.

Embodiment 6

In this embodiment, application examples of a semiconductor device provided with the above-described nonvolatile semiconductor memory device of the present invention capable of data input and output without contact will be described below with reference to drawings. A semiconductor device capable of data input and output without contact is referred to as an RFID tag, an ID tag, an IC tag, an IC chip, an RF tag, a wireless tag, an electronic tag, or a wireless chip.

Figure 40A:
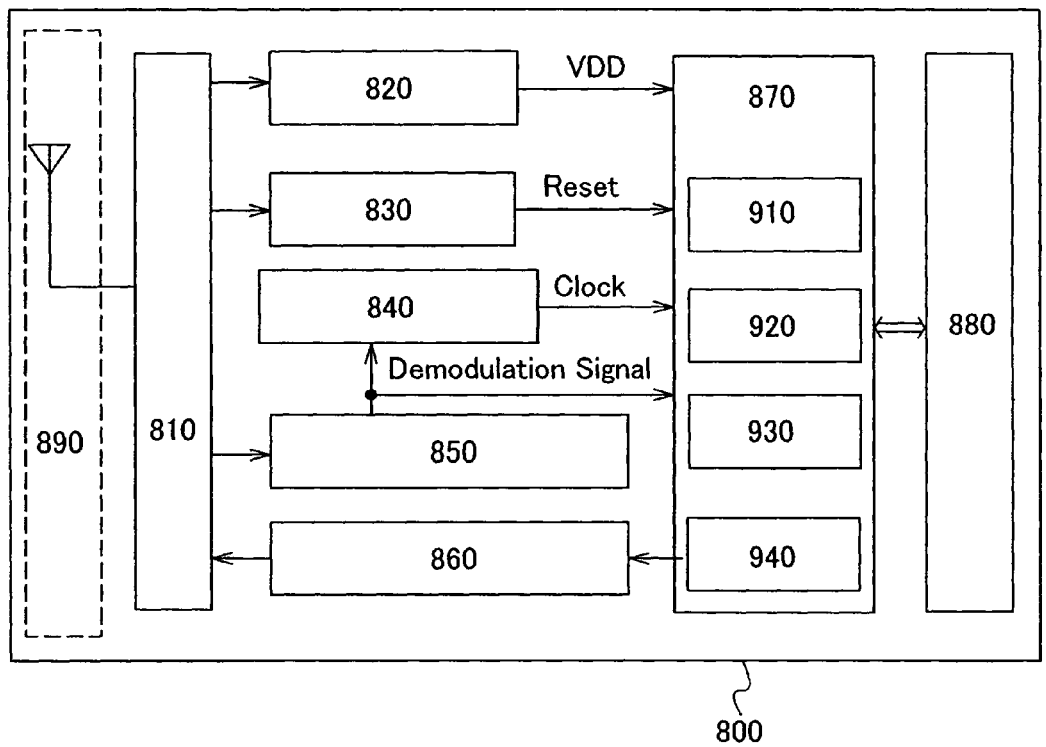
FIGS. 40A to 40C are diagrams for showing examples of a usage mode of a nonvolatile semiconductor memory device of the present invention.

A semiconductor device 800 functions to communicate data without contact, and includes a high frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (FIG. 40A). The high frequency circuit 810 is a circuit which receives a signal from the antenna 890, and outputs a signal received from the data modulation circuit 860 to the antenna 890. The power supply circuit 820 is a circuit which generates a power supply potential from a received signal. The reset circuit 830 is a circuit which generates a reset signal. The clock generation circuit 840 is a circuit which generates various clock signals based on the received signal inputted from the antenna 890. The data demodulation circuit 850 is a circuit which demodulates a received signal and outputs to the control circuit 870. The data modulation circuit 860 is a circuit which modulates a signal received from the control circuit 870. As the control circuit 870, a code extraction circuit 910, a code determination circuit 920, a CRC determination circuit 930, and an output unit circuit 940 are provided, for example. Note that the code extraction circuit 910 is a circuit which separately extracts a plurality of codes included in an instruction transmitted to the control circuit 870, the code determination circuit 920 is a circuit which compares an extracted code with a code corresponding to a reference so as to determine the content of an instruction, and the CRC determination circuit 930 is a circuit which detects the presence or absence of a transmission error or the like based on a determined code.

Next, an example of operation of the above-described semiconductor device will be described. First, a radio signal is received by the antenna 890. The radio signal is transmitted to the power supply circuit 820 via the high frequency circuit 810, and a high power supply potential (hereinafter referred to as VDD) is generated. The VDD is supplied to each circuit included in the semiconductor device 800. In addition, a signal transmitted to the data demodulation circuit 850 via the high frequency circuit 810 is demodulated (hereinafter, a demodulated signal). Further, a signal transmitted through the reset circuit 830 and the clock generation circuit 840 via the high frequency circuit 810 and a demodulated signal are transmitted to the control circuit 870. The signal transmitted to the control circuit 870 is analyzed by the code extraction circuit 910, the code determination circuit 920, the CRC determination circuit 930, and the like. Then, in accordance with the analyzed signal, information of the semiconductor device stored in the memory circuit 880 is outputted. The outputted information of the semiconductor device is encoded through the output unit circuit 940. Furthermore, the encoded information of the semiconductor device 800 is transmitted by the antenna 890 as a radio signal through the data modulation circuit 860. Note that a low power supply potential (hereinafter, VSS) is common in the plurality of circuits included in the semiconductor device 800, and VSS can be set to GND. In addition, the nonvolatile semiconductor memory device of the present invention can be applied to the memory circuit 880. Since the driving voltage can be lowered in the nonvolatile semiconductor memory device of the present invention, data communication without contact can be performed at a longer distance.

Thus, data of the semiconductor device can be read by transmitting a signal from a reader/writer to the semiconductor device 800 and receiving a signal transmitted from the semiconductor device 800 by the reader/writer.

In addition, the semiconductor device 800 may supply a power supply voltage to each circuit by an electromagnetic wave without a power source (battery) mounted, or by an electromagnetic wave and a power source (battery) mounted.

Figure 40B:
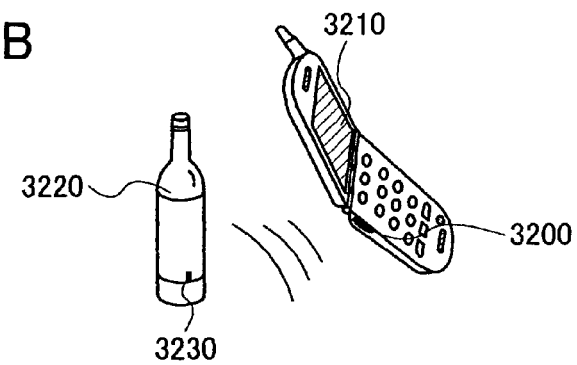
Figure 40C:
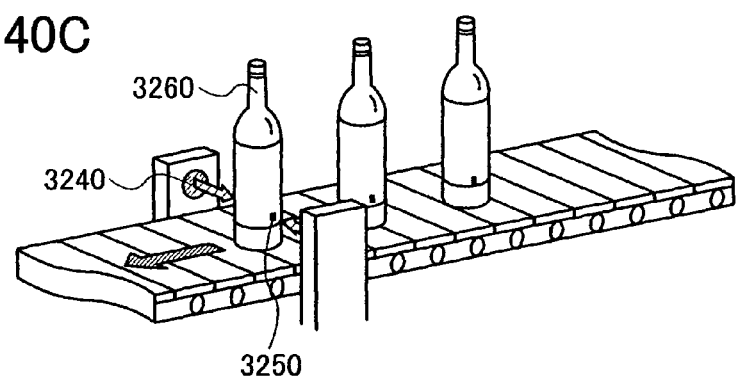

Next, an example of usage of the semiconductor device capable of data input and output without contact will be described. A side surface of a portable terminal including a display portion 3210 is provided with a reader/writer 3200, and a side surface of an article 3220 is provided with a semiconductor device 3230 (FIG. 40B). When the reader/writer 3200 is held over the semiconductor device 3230 included in the article 3220, information on the article such as a raw material, the place of origin, an inspection result in each production process, the history of distribution, or an explanation of the article is displayed on the display portion 3210. Further, when a product 3260 is transported by a conveyor belt, the product 3260 can be inspected using a reader/writer 3240 and a semiconductor device 3250 provided over the product 3260 (FIG. 40C). Thus, by utilizing the semiconductor device for a system, information can be acquired easily, and improvements in functionality and added value of the system can be achieved.

Furthermore, the nonvolatile semiconductor memory device of the present invention can be used in electronic devices with memories in all fields. As electronic devices to which the nonvolatile semiconductor memory device of the present invention is applied, video cameras, digital cameras, goggle type displays (head-mounted displays), navigation systems, sound reproducing devices (such as car audios or audio components), computers, game machines, mobile information terminals (such as mobile computers, mobile phones, mobile game machines, or electronic books), image reproducing devices equipped with a recording medium (specifically, a device for reproducing a recording medium such as DVD (digital versatile disc), which is equipped with a display for displaying the reproduced image), or the like are given, for example. Specific examples of the electronic devices are shown in FIGS. 41A to 41E.

Figure 41A:
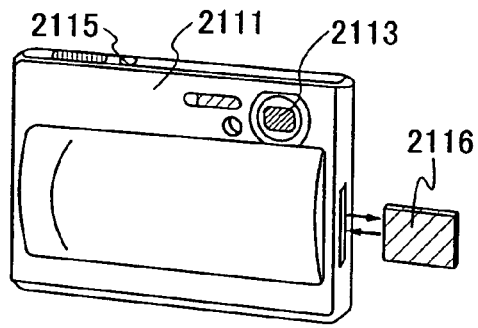
FIGS. 41A to 41E are diagrams each showing one example of a usage mode of a nonvolatile semiconductor memory device of the present invention.
Figure 41B:
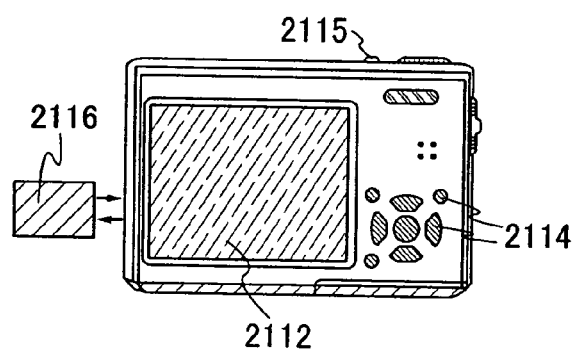

FIGS. 41A and 41B each show a digital camera. FIG. 41B shows the back of the digital camera shown in FIG. 41A. This digital camera includes a chassis 2111, a display portion 2112, a lens 2113, operation keys 2114, a shutter 2115, and the like. In addition, the digital camera includes a removable nonvolatile memory 2116, and the memory 2116 stores data taken by the digital camera. The nonvolatile semiconductor memory device which is formed by using the present invention can be applied to the memory 2116.

Figure 41C:
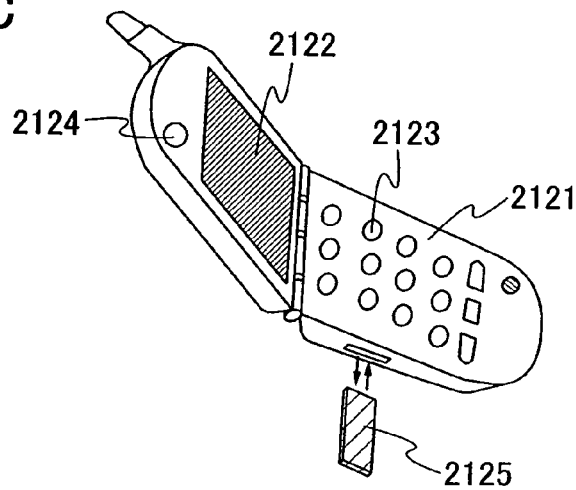

FIG. 41C shows a mobile phone, which is a representative example of a portable terminal. This mobile phone includes a chassis 2121, a display portion 2122, an operation key 2123, speaker 2124, and the like. In addition, the mobile phone includes a removable nonvolatile memory 2125, and data such as telephone numbers, images, music data, and the like can be stored in the memory 2125 and reproduced by the mobile phone. The nonvolatile semiconductor memory device which is formed by using the present invention can be applied to the memory 2125.

Figure 41D:
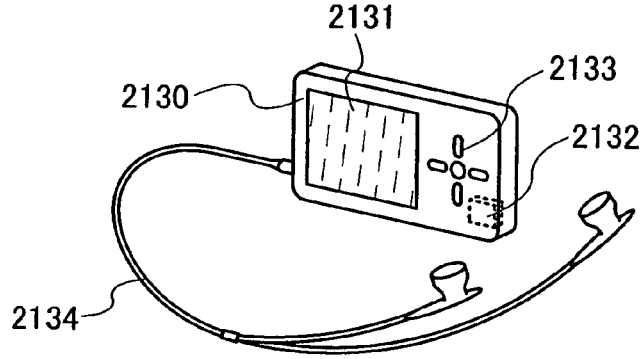

FIG. 41D shows a digital player, which is a representative example of an audio device. The digital player shown in FIG. 41D includes a main body 2130, a display portion 2131, a memory portion 2132, an operating portion 2133, an earphone 2134, and the like. A headphone or a wireless earphone may be used instead of the earphone 2134. For the memory portion 2132, the nonvolatile semiconductor memory device which is formed by using the present invention can be used. For example, by using a NAND nonvolatile memory with a storage capacity of 20 GB to 200 GB and operating the operating portion 2133, images and sound (music) can be recorded and reproduced. It is to be noted that power consumption can be reduced by displaying white characters on a black background in the display portion 2131. This is particularly effective for a mobile audio device. The nonvolatile semiconductor memory device provided in the memory portion 2132 may be removable.

Figure 41E:
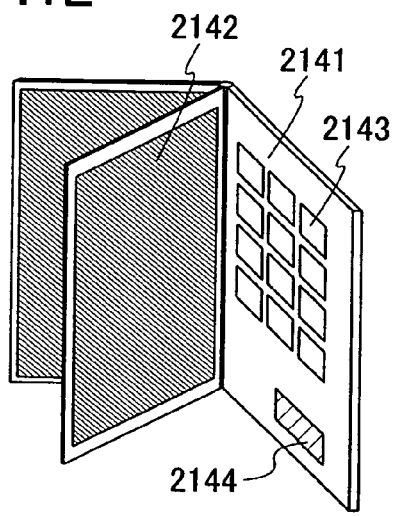

FIG. 41E shows an electronic book (also referred to as electronic paper). This electronic book includes a main body 2141, a display portion 2142, an operation key 2143, and a memory portion 2144. A modem may be incorporated in the main body 2141, or a structure in which information can be transmitted and received wirelessly may be employed. For the memory portion 2144, the nonvolatile semiconductor memory device which is formed by using the present invention can be used. For example, by using a NAND nonvolatile memory with a storage capacity of 20 GB to 200 GB and operating the operating key 2143, images and sound (music) can be recorded and reproduced. The nonvolatile semiconductor memory device provided in the memory portion 2144 may be removable.

As described above, an application range of the nonvolatile semiconductor memory device of the present invention is extremely wide, and it can be used for any electronic device in every field that includes a memory.

This application is based on Japanese Patent Application serial no. 2006-100789 filed in Japan Patent Office on Mar. 31, 2006, the entire contents of which are hereby incorporated by reference.

What is claimed is:

1. A nonvolatile semiconductor memory device comprising:
   a semiconductor substrate, the semiconductor substrate comprising a pair of impurity regions and a channel formation region between the pair of impurity regions;
   a pair of field oxide films embedded in the semiconductor substrate, the pair of impurity regions and the channel formation region being between the pair of field oxide films;
   a floating gate electrode over the channel formation region with a first insulating layer interposed therebetween, and
   a control gate electrode over the floating gate electrode with a second insulating layer interposed therebetween,
   wherein the control gate electrode is across an edge of the floating gate electrode,
   wherein a portion of the control gate electrode outside the edge of the floating gate electrode is overlapped with one of the pair of impurity regions,
   wherein the first insulating layer is interposed between the portion and the one of the pair of impurity regions and extended to overlap with one of the pair of field oxide films,
   wherein the floating gate electrode includes at least a first layer in contact with the first insulating layer, and a second layer over the first layer,
   wherein the first layer is formed of a semiconductor material,
   wherein a band gap of the first layer is smaller than a band gap of the channel formation region, and
   wherein the second layer is formed of a material selected from the group consisting of a metal, a metal alloy, and a metal compound.

2. A nonvolatile semiconductor memory device comprising:
   a semiconductor substrate, the semiconductor substrate comprising a pair of impurity regions and a channel formation region between the pair of impurity regions;
   a pair of field oxide films embedded in the semiconductor substrate, the pair of impurity regions and the channel formation region being between the pair of field oxide films;

a floating gate electrode over the channel formation region with a first insulating layer therebetween, and a control gate electrode over the floating gate electrode with a second insulating layer interposed therebetween, wherein the control gate electrode is across an edge of the floating gate electrode, wherein a portion of the control gate electrode outside the edge of the floating gate electrode is overlapped with one of the pair of impurity regions, wherein the first insulating layer is interposed between the portion and the one of the pair of impurity regions and extended to overlap with one of the pair of field oxide films, wherein the floating gate electrode includes at least a first layer and a second layer, wherein the first layer is in contact with the first insulating layer and is formed using a material having a smaller band gap and lower resistivity than the channel formation region, and wherein the second layer is formed of a material selected from the group consisting of a metal, a metal alloy, and a metal compound.

3. A nonvolatile semiconductor memory device comprising:

a semiconductor substrate, the semiconductor substrate comprising a pair of impurity regions and a channel formation region between the pair of impurity regions;

a pair of field oxide films embedded in the semiconductor substrate, the pair of impurity regions and the channel formation region being between the pair of field oxide films;

a floating gate electrode over the channel formation region with a first insulating layer therebetween, and a control gate electrode over the floating gate electrode with a second insulating layer interposed therebetween, wherein the control gate electrode is across an edge of the floating gate electrode, wherein a portion of the control gate electrode outside the edge of the floating gate electrode is overlapped with one of the pair of impurity regions, wherein the first insulating layer is interposed between the portion and the one of the pair of impurity regions and extended to overlap with one of the pair of field oxide films, wherein the floating gate electrode includes at least a first layer and a second layer, and wherein barrier energy with respect to electrons in the first layer, formed by the first insulating layer, is higher than barrier energy with respect to electrons in the channel formation region, formed by the first insulating layer, and wherein the second layer is formed of a material selected from the group consisting of a metal, a metal alloy, and a metal compound.

4. A nonvolatile semiconductor memory device comprising:

a semiconductor substrate, the semiconductor substrate comprising a pair of impurity regions and a channel formation region between the pair of impurity regions;

a pair of field oxide films embedded in the semiconductor substrate, the pair of impurity regions and the channel formation region being between the pair of field oxide films;

a floating gate electrode over the channel formation region with a first insulating layer therebetween, and a control gate electrode over the floating gate electrode with a second insulating layer interposed therebetween, wherein the control gate electrode is across an edge of the floating gate electrode, wherein a portion of the control gate electrode outside the edge of the floating gate electrode is overlapped with one of the pair of impurity regions, wherein the first insulating layer is interposed between the portion and the one of the pair of impurity regions and extended to overlap with one of the pair of field oxide films, wherein the floating gate electrode includes at least a first layer and a second layer, wherein the first layer which is in contact with the first insulating layer is formed of germanium or a germanium compound, and wherein the second layer is formed of a material selected from the group consisting of a metal, a metal alloy, and a metal compound.

5. The nonvolatile semiconductor memory device according to claim 1, wherein there is a difference of 0.1 eV or more between the band gap of the channel formation region and the band gap of the first layer.

6. The nonvolatile semiconductor memory device according to claim 1, wherein the first insulating layer includes a silicon oxide layer and a silicon oxynitride layer formed over the silicon oxide layer.

7. The nonvolatile semiconductor memory device according to claim 6, wherein the floating gate electrode is in contact with the silicon oxynitride layer.

8. The nonvolatile semiconductor memory device according to claim 6, wherein the silicon oxide layer is formed by oxidizing the semiconductor substrate by plasma treatment, and the silicon oxynitride layer is formed by nitriding the silicon oxide layer by plasma treatment.

9. The nonvolatile semiconductor memory device according to claim 1, wherein the second layer includes at least one of tungsten, tantalum, titanium, molybdenum, chromium, and nickel.

10. The nonvolatile semiconductor memory device according to claim 1, wherein the second layer includes at least one of a tantalum nitride, a tungsten nitride, a molybdenum nitride, a titanium nitride, a tantalum oxide, a titanium oxide, and a molybdenum oxide.

11. The nonvolatile semiconductor memory device according to claim 2, wherein there is a difference of 0.1 eV or more between the band gap of the channel formation region and the band gap of the material of the first layer.

12. The nonvolatile semiconductor memory device according to claim 2, wherein the first insulating layer includes a silicon oxide layer and a silicon oxynitride layer formed over the silicon oxide layer.

13. The nonvolatile semiconductor memory device according to claim 12, wherein the floating gate electrode is in contact with the silicon oxynitride layer.

14. The nonvolatile semiconductor memory device according to claim 12, wherein the silicon oxide layer is formed by oxidizing the semiconductor substrate by plasma treatment, and the silicon oxynitride layer is formed by nitriding the silicon oxide layer by plasma treatment.

15. The nonvolatile semiconductor memory device according to claim 2, wherein the second layer includes at least one of tungsten, tantalum, titanium, molybdenum, chromium, and nickel.

16. The nonvolatile semiconductor memory device according to claim 2, wherein the second layer includes at least one of a tantalum nitride, a tungsten nitride, a molybdenum nitride, a titanium nitride, a tantalum oxide, a titanium oxide, and a molybdenum oxide.

17. The nonvolatile semiconductor memory device according to claim 3, wherein the first insulating layer includes a silicon oxide layer and a silicon oxynitride layer formed over the silicon oxide layer.

18. The nonvolatile semiconductor memory device according to claim 17, wherein the floating gate electrode is in contact with the silicon oxynitride layer.

19. The nonvolatile semiconductor memory device according to claim 17, wherein the silicon oxide layer is formed by oxidizing the semiconductor substrate by plasma treatment, and the silicon oxynitride layer is formed by nitriding the silicon oxide layer by plasma treatment.

20. The nonvolatile semiconductor memory device according to claim 3, wherein the second layer includes at least one of tungsten, tantalum, titanium, molybdenum, chromium, and nickel.

21. The nonvolatile semiconductor memory device according to claim 3, wherein the second layer includes at least one of a tantalum nitride, a tungsten nitride, a molybdenum nitride, a titanium nitride, a tantalum oxide, a titanium oxide, and a molybdenum oxide.

22. The nonvolatile semiconductor memory device according to claim 4, wherein the first insulating layer includes a silicon oxide layer and a silicon oxynitride layer formed over the silicon oxide layer.

23. The nonvolatile semiconductor memory device according to claim 22, wherein the floating gate electrode is in contact with the silicon oxynitride layer.

24. The nonvolatile semiconductor memory device according to claim 22, wherein the silicon oxide layer is formed by oxidizing the semiconductor substrate by plasma treatment, and the silicon oxynitride layer is formed by nitriding the silicon oxide layer by plasma treatment.

25. The nonvolatile semiconductor memory device according to claim 4, wherein the second layer includes at least one of tungsten, tantalum, titanium, molybdenum, chromium, and nickel.

26. The nonvolatile semiconductor memory device according to claim 4, wherein the second layer includes at least one of a tantalum nitride, a tungsten nitride, a molybdenum nitride, a titanium nitride, a tantalum oxide, a titanium oxide, and a molybdenum oxide.

27. The nonvolatile semiconductor memory device according to claim 4, wherein the first layer has a thickness of 1 nm to 20 nm inclusive.

28. The nonvolatile semiconductor memory device according to claim 4, wherein the germanium compound is a germanium oxide or a germanium nitride.

29. The nonvolatile semiconductor memory device according to claim 1, wherein the portion of the control gate electrode outside the edge of the floating gate electrode is overlapped with the one of the pair of impurity regions with the first insulating layer and the second insulating layer interposed therebetween.

30. The nonvolatile semiconductor memory device according to claim 2, wherein the portion of the control gate electrode outside the edge of the floating gate electrode is overlapped with the one of the pair of impurity regions with the first insulating layer and the second insulating layer interposed therebetween.

31. The nonvolatile semiconductor memory device according to claim 3, wherein the portion of the control gate electrode outside the edge of the floating gate electrode is overlapped with the one of the pair of impurity regions with the first insulating layer and the second insulating layer interposed therebetween.

32. The nonvolatile semiconductor memory device according to claim 4, wherein the portion of the control gate electrode outside the edge of the floating gate electrode is overlapped with the one of the pair of impurity regions with the first insulating layer and the second insulating layer interposed therebetween.

* * * * *